US012700713B2

(12) United States Patent
    Li

(10) Patent No.: US 12,700,713 B2
(45) Date of Patent: Aug. 4, 2026

(54) ANODE ADDRESSING DRIVE CIRCUIT, ADDRESSABLE DRIVE CIRCUIT, AND LASER EMISSION CIRCUIT

(71) Applicant: SUTENG INNOVATION TECHNOLOGY CO., LTD., Shenzhen (CN)

(72) Inventor: Lee Li, Shenzhen (CN)

(73) Assignee: SUTENG INNOVATION TECHNOLOGY CO., LTD., Shenzhen (CN)

( * ) Notice: Subject to any disclaimer, the term of this patent is extended or adjusted under 35 U.S.C. 154(b) by 883 days.

(21) Appl. No.: 18/090,414

(22) Filed: Dec. 28, 2022

(65) Prior Publication Data

US 2023/0208099 A1    Jun. 29, 2023

(30) Foreign Application Priority Data

Dec. 29, 2021   (CN) .......................... 202111643093.6
Dec. 29, 2021   (CN) .......................... 202111643893.8
Dec. 29, 2021   (CN) .......................... 202111646715.0

(51) Int. Cl.
    *H01S 3/00*      (2006.01)
    *H01S 5/026*     (2006.01)
              (Continued)
(52) U.S. Cl.
    CPC ............ *H01S 5/0261* (2013.01); *H01S 5/042* (2013.01); *H01S 5/0428* (2013.01); *G01S 7/484* (2013.01);
              (Continued)
(58) Field of Classification Search
    CPC ...... H01S 5/0261; H01S 5/042; H01S 5/0428; H01S 5/4025
    See application file for complete search history.

(56) References Cited

U.S. PATENT DOCUMENTS

2009/0161710 A1*  6/2009  Hoashi .................. G01S 7/4815
                                           372/38.02
2020/0178361 A1    6/2020  Oka
              (Continued)

FOREIGN PATENT DOCUMENTS

CN        110535028 A     12/2019
CN        112805587 A      5/2021
CN        113692540 A     11/2021

OTHER PUBLICATIONS

European Search Report issued in related European Application No. 22216883.3, mailed May 30, 2023, 13 pages.
              (Continued)

*Primary Examiner* — Kinam Park
(74) *Attorney, Agent, or Firm* — BAYES PLLC

(57) ABSTRACT

This application discloses an anode addressing drive circuit, an addressable drive circuit, and a laser emission circuit. The anode addressing drive circuit includes: an anode addressing switch circuit, including an anode addressing switch element, where a first end is connected to an emission power supply, a second end of the anode addressing switch element is connected to an anode energy storage circuit, an anode addressing enabling end of the anode addressing switch element receives an anode addressing signal, and the anode addressing switch element is turned on or off under the control of the anode addressing signal; and an anode energy storage circuit, including an anode energy storage element and a current limiting element, where the anode energy storage element is configured to be charged through an output current of the emission power supply when the anode addressing switch circuit is turned on, and the current limiting element is configured to limit a current for charging the anode energy storage element.

14 Claims, 29 Drawing Sheets

(51) Int. Cl.

| | |
|---|---|
| *H01S 5/042* | (2006.01) |
| *G01S 7/484* | (2006.01) |
| *H01S 5/40* | (2006.01) |
| *H03K 17/687* | (2006.01) |
| *H05B 45/44* | (2020.01) |

(52) U.S. Cl.
CPC ........ *H01S 5/4025* (2013.01); *H03K 17/6871* (2013.01); *H05B 45/44* (2020.01)

(56) References Cited

U.S. PATENT DOCUMENTS

| | | | |
|---|---|---|---|
| 2020/0209355 A1* | 7/2020 | Pacala ..................... | G01S 7/484 |
| 2021/0231806 A1* | 7/2021 | Donovan ................ | G01S 7/484 |
| 2022/0299604 A1* | 9/2022 | Dolganov .............. | G01S 7/484 |

OTHER PUBLICATIONS

First Office Action issued in related Chinese Application No. 202111643093.6, mailed Sep. 1, 2023, 11 pages.
First Office Action issued in related Chinese Application No. 202111643893.8, mailed Aug. 31, 2023, 13 pages.
European Search Report issued in related European Application No. 22216883.3, mailed Jan. 3, 2025, 8 pages.
Analog Devices Inc: "ADG751 CMOS, Low Voltage RF/Video, SPST Switch data sheet Rev. A", 2012, 11 pages.

\* cited by examiner

ANODE ADDRESSING DRIVE CIRCUIT, ADDRESSABLE DRIVE CIRCUIT, AND LASER EMISSION CIRCUIT

CROSS-REFERENCE TO RELATED APPLICATION

The present application claims the benefit of priority to China Patent Application No. CN 202111643093.6, filed on Dec. 29, 2021, China Patent Application No. CN 202111646715.0, filed on Dec. 29, 2021, and China Patent Application No. CN 202111643893.8, filed on Dec. 29, 2021, the contents of which are incorporated herein by reference in their entireties.

TECHNICAL FIELD

Embodiments of the present disclosure relate to the technical field of laser emission, and specifically, to an anode addressing drive circuit, an addressable drive circuit, and a laser emission circuit.

BACKGROUND

As LiDAR technologies evolve towards integration, laser technologies evolve from integration of discrete single transistors into a one-dimensional array, and then from integration of one-dimensional arrays into a two-dimensional array. A design of a narrow pulse driver is crucial to overall application of a laser array, and determines feasibility of the application to a certain extent.

Currently, a switch element is often used for addressing in the driver, and a parasitic capacitor provided in the switch element is prone to cause light leakage of the laser, which causes false light emission of the laser.

SUMMARY

In view of the foregoing, this application provides an anode addressing drive circuit, an addressable drive circuit, and a laser emission circuit, to solve a problem in the related art that, when a switch element includes a parasitic capacitor, light leakage of a laser is caused, and false light emission occurs, thus lowering light emission control accuracy of a laser array.

According to a first aspect, this application provides an anode addressing drive circuit, applied to a laser array, having one end connected to an emission power supply and the other end connected to an anode of a laser connected to a shared anode end in the laser array, and the anode addressing drive circuit further includes:

an anode addressing switch circuit, including an anode addressing switch element, where the anode addressing switch element includes a first end, a second end, and an anode addressing enabling end, the first end is connected to the emission power supply, the second end is connected to an anode energy storage circuit, the anode addressing enabling end receives an anode addressing signal, and the anode addressing switch element is turned on or off under the control of the anode addressing signal, so that the anode energy storage circuit is charged through an output current of the emission power supply when the anode addressing switch element is turned on; and the anode energy storage circuit, including an anode energy storage element, where the anode energy storage element is configured to be charged through the output current of the emission power supply when the anode addressing switch element is turned on.

Further, the anode energy storage circuit further includes a current limiting element, and the current limiting element is configured to limit a current for charging the anode energy storage element.

As a specific embodiment, the anode energy storage element includes an energy storage capacitor, a first end of the current limiting element is connected to the second end of the anode addressing switch element, a second end is connected to a first end of the energy storage capacitor and a corresponding shared anode end, and a second end of the energy storage capacitor is grounded.

As a specific embodiment, the current limiting element includes a current limiting resistor, a first end of the current limiting resistor is connected to the second end of the anode addressing switch element, a second end is connected to a first end of the anode energy storage element and a corresponding shared anode end, and a second end of the anode energy storage element is grounded.

The anode addressing switch circuit further includes an anode unidirectional conducting element, the anode unidirectional conducting element is connected between the anode addressing switch element and the corresponding shared anode end, a first end of the anode unidirectional conducting element is connected to the anode of the laser connected to the corresponding shared anode end, and a second end of the anode unidirectional conducting element is connected to the second end of the anode addressing switch element; and when the anode addressing switch element is in a turn-on state, the anode unidirectional conducting element is in a forward conduction state to allow the current to pass through the anode addressing switch element; or when the anode addressing switch element is in a turn-off state, the anode unidirectional conducting element is in a reverse-biased state to prevent the current from passing through the anode addressing switch element.

Further, the anode addressing switch circuit further includes an anode reverse-biased switch element; the anode reverse-biased switch element includes a first end, a second end, and an anode reverse-biased enabling end, the first end of the anode reverse-biased switch element is connected to the second end of the anode unidirectional conducting element, the second end of the anode reverse-biased switch element receives a first preset level, and the anode reverse-biased enabling end receives an anode reverse-biased control signal;

the anode reverse-biased control signal is used to turn off the anode reverse-biased switch element when the anode addressing switch element is turned on through the anode addressing signal, so that the second end of the anode unidirectional conducting element is grounded through the anode addressing switch element, and the anode unidirectional conducting element is in the forward conduction state; and the anode reverse-biased control signal is also used to turn on the anode reverse-biased switch element when the anode addressing switch element is turned off through the anode addressing signal, so that the second end of the anode unidirectional conducting element receives the first preset level through the anode reverse-biased switch element, and the anode unidirectional conducting element is in the reverse-biased state.

Further, the anode addressing drive circuit further includes an anode energy release switch circuit, where the anode energy release switch circuit includes an energy release switch element, the energy release switch element includes a first end, a second end, and an energy release enabling end, the first end of the energy release switch element is connected to the first end of the anode energy storage element, the second end of the energy release switch element is grounded, the energy release enabling end receives an energy release control signal, and the energy release control signal and the anode addressing signal are in reverse states;

the energy release control signal is used to turn off the energy release switch element when the anode addressing switch element is turned on through the anode addressing signal, so that the first end of the anode energy storage element is connected to a charging circuit, and the anode energy storage element is charged through the charging circuit; and the energy release control signal is also used to turn on the energy release switch element when the anode addressing switch element is turned off through the anode addressing signal, so that the first end of the anode energy storage element is grounded.

Specifically, the energy release enabling end of the anode energy release switch element is connected to the addressing enabling end of the anode addressing switch element through a first phase inverter, an input end of the first phase inverter is connected to the addressing enabling end, and an output end of the first phase inverter is connected to the energy release enabling end; or the input end of the first phase inverter is connected to the energy release enabling end, and the output end of the first phase inverter is connected to the addressing enabling end.

Further, the anode energy release switch circuit further includes a fourth current limiting element, the fourth current limiting element is connected between the first end of the anode energy storage element and the first end of the energy release switch element and configured to limit a current for releasing energy from the anode energy storage element.

According to a second aspect, this application provides an anode addressable drive circuit, applied to a laser array and including the foregoing multiple anode addressing drive circuits, ends of the multiple anode addressing drive circuits are connected to an emission power supply, and the other ends are separately connected to anodes of multiple rows of lasers connected to multiple shared anode ends in the laser array in one-to-one correspondence.

Further, the anode addressable drive circuit further includes at least one energy storage-adjustable charging circuit, an input end of the charging circuit is connected to one emission power supply, an output end of the charging circuit is connected to multiple anode addressing drive circuits and configured to receive an output current of the emission power supply to be charged and store energy, and an energy storage value of the charging circuit is adjustable, so that a current with an adjustable current value is output to the anode addressing drive circuit when the anode addressing drive circuit is connected.

Specifically, the energy storage-adjustable charging circuit includes:

a transitory energy storage element, including a first end connected to the emission power supply and a second end connected to a first end of a charging switch element and an end of the anode addressing drive circuit; and the charging switch element, including a first end, a second end, and a charging enabling end, where the first end of the charging switch element is connected to the second end of the transitory energy storage element, the second end of the charging switch element is grounded, the charging enabling end receives a charging control signal, and the charging switch element is turned on or off under the control of the charging control signal, so that an energy storage value of the transitory energy storage element is adjustable.

According to a third aspect, this application provides an addressable drive circuit, applied to a laser array. the addressable drive circuit including:

a cathode addressable drive circuit, where the cathode addressable drive circuit includes multiple cathode addressing drive circuits, ends of the multiple cathode addressing drive circuits are in one-to-one correspondence with cathodes of multiple columns of lasers connected to multiple shared cathode ends in the laser array, and the other ends of the multiple cathode addressing drive circuits are grounded, where the cathode addressing drive circuit includes a cathode addressing switch circuit, the cathode addressing switch circuit includes a cathode addressing switch element, the cathode addressing switch element includes a first end, a second end, and a cathode addressing enabling end, one of the first end and the second end of the cathode addressing switch element is grounded, the other one of the first end and the second end of the cathode addressing switch element is connected to a corresponding shared cathode end, the cathode addressing enabling end receives a cathode addressing signal, and the cathode addressing switch element is turned on or off under the control of the cathode addressing signal; and the foregoing anode addressable drive circuit.

Further, the cathode addressing switch circuit further includes a cathode unidirectional conducting element, the cathode unidirectional conducting element is connected between the corresponding shared cathode end and the cathode addressing switch element, the first end of the cathode unidirectional conducting element is connected to the corresponding shared cathode end, and the second end of the cathode unidirectional conducting element is connected to the second end of the cathode addressing switch element; and when the cathode addressing switch element is in a turn-on state, the cathode unidirectional conducting element is in a forward conduction state to allow the current to pass through the cathode addressing switch circuit; or when the cathode addressing switch element is in a turn-off state, the cathode unidirectional conducting element is in a reverse-biased state to prevent the current from passing through the cathode addressing switch circuit.

Further, the cathode addressing switch circuit further includes a cathode reverse-biased switch element, the cathode reverse-biased switch element includes a first end, a second end, and a cathode reverse-biased enabling end, the first end of the cathode reverse-biased switch element is connected to the second end of the cathode unidirectional conducting element, the second end of the cathode reverse-biased switch element receives a second preset voltage, and the cathode reverse-biased enabling end receives a reverse-biased control signal;

the cathode reverse-biased control signal is used to turn off the cathode reverse-biased switch element when the cathode addressing switch element is turned on through the cathode addressing signal, so that the second end of the cathode unidirectional conducting element is grounded through the cathode addressing switch element, and the cathode unidirectional conducting element is in the forward conduction state; and the cathode reverse-biased control signal is also used to turn on the cathode reverse-biased switch element when the cathode addressing switch element is turned off through the cathode addressing signal, so that the second end of the cathode unidirectional conducting element receives the second preset voltage, and the cathode unidirectional conducting element is in the reverse-biased state.

Further, the cathode addressing switch circuit further includes a cathode phase inverter, an input end of the cathode phase inverter is connected to the cathode addressing enabling end, and an output end of the cathode phase inverter is connected to the cathode reverse-biased enabling end; or the input end of the cathode phase inverter is connected to the cathode reverse-biased enabling end, and the output end of the cathode phase inverter is connected to the cathode addressing enabling end.

As a specific embodiment, the cathode unidirectional conducting element includes a seventh NMOS transistor, a source of the seventh NMOS transistor is connected to the second end of the cathode addressing switch element, a drain of the seventh NMOS transistor is connected to the corresponding shared cathode end, and a gate of the seventh NMOS transistor is connected to the cathode addressing enabling end of the cathode addressing switch element.

As another specific embodiment, the cathode unidirectional conducting element includes a seventh diode, a cathode of the seventh diode is connected to the second end of the cathode addressing switch element, and an anode of the seventh diode is connected to the corresponding shared cathode end.

An addressable drive circuit, applied to a laser array, including:

an anode addressing drive circuit, including an anode addressing switch circuit and an anode energy storage circuit, where an end of the anode addressing switch circuit is connected to an emission power supply, the other end is connected to the anode energy storage circuit and an anode of a laser connected to a shared anode end, and the anode energy storage circuit is charged through an output current of the emission power supply when the anode addressing switch circuit is turned on; and a cathode addressing drive circuit, including a cathode addressing switch circuit, where the cathode addressing switch circuit includes a cathode addressing switch element and a cathode unidirectional conducting element, the cathode addressing switch element includes a first end, a second end, and a cathode addressing enabling end, the first end is grounded, the second end is connected to the second end of the cathode unidirectional conducting element, the cathode addressing enabling end receives a cathode addressing signal, and the first end of the cathode unidirectional conducting element is connected to a cathode of the laser connected to the shared cathode end, where when the cathode addressing switch element is in a turn-on state, the cathode unidirectional conducting element is in a forward conduction state to allow the current to pass through the cathode addressing switch circuit; or when the cathode addressing switch element is in a turn-off state, the cathode unidirectional conducting element is in a reverse-biased state to prevent the current from passing through the cathode addressing switch circuit.

According to a fourth aspect, this application provides a laser emission circuit, including a laser array and the addressable drive circuit in any one of the foregoing embodiments, where the multiple anode addressing drive circuits are configured to drive anode addressing of multiple rows of lasers connected to the multiple shared anode ends, and multiple cathode addressing drive circuits are configured to drive cathode addressing of multiple columns of lasers connected to the multiple shared cathode ends.

According to a fifth aspect, this application provides a LiDAR, including the forgoing laser emission circuit.

According to a sixth aspect, this application also provides a switch circuit for improving isolation.

Specifically, the switch circuit includes a first end, a second end, and an enabling end, the first end receives a first voltage, the second end receives a second voltage, the second voltage is greater than the first voltage, the switch circuit is configured to form a forward conduction loop between the second end and the first end of the switch circuit under the control of a signal of the enabling end, to allow a current to flow through the switch circuit, and the switch circuit is further configured to form a reverse-biased circuit between the second end and the first end of the switch circuit under the control of the signal of the enabling end, to prevent the current from flowing through the switch circuit.

Further, a unidirectional conducting element is provided at the first end or the second end of the switch circuit, and when the unidirectional conducting element is in a forward conduction state, a forward conduction loop is formed between the second end and the first end of the switch circuit, or when the unidirectional conducting element is in the reverse-biased state, a reverse-biased circuit is formed between the second end and the first end of the switch circuit.

As an optional solution, the unidirectional conducting element is provided at the second end of the switch circuit. Specifically, the switch circuit includes a second switch element, a second unidirectional conducting element, and a second reverse-biased switch element. The second switch element includes a first end, a second end, and an enabling end, a first end of the second unidirectional conducting element serves as the second end of the switch circuit to receive a second voltage, a second end of the second unidirectional conducting element is connected to a second end of the second switch element, the first end of the second switch element serves as the first end of the switch circuit to receive the first voltage, the enabling end of the second switch element receives a second switch control signal, and the second switch element is turned on or off under the control of the switch control signal. The second reverse-biased switch element includes a first end, a second end, and a second reverse-biased enabling end, the first end of the second reverse-biased switch element is connected to the second end of the second unidirectional conducting element, the second end of the second reverse-biased switch element receives a second preset voltage, and the second reverse-biased enabling end receives a second reverse-biased control signal.

The second reverse-biased control signal is used to turn off the second reverse-biased switch element when the switch element is turned on through the second switch control signal, the second switch element enables the first end of the second unidirectional conducting element to receive a first voltage, so that the second unidirectional conducting element is in the forward conduction state. The forward conduction loop is formed between the second end and the first end of the switch circuit, thereby allowing the current to flow through the switch circuit.

The second reverse-biased control signal is also used to turn on the second reverse-biased switch element when the second switch element is turned off through the second switch control signal, the second reverse-biased switch element enables the second end of the second unidirectional conducting element to receive a second preset voltage, and a voltage value of the second preset voltage is greater than or equal to the first voltage, so that the second unidirectional conducting element is in the reverse-biased state and the current is prevented from flowing through the second switch element, thereby improving isolation of the second switch element.

In some embodiments, the second preset voltage is equal to the first voltage.

In an exemplary solution, the second switch element is a fifth NMOS transistor, a drain of the fifth NMOS transistor serves as the first end of the second switch element to receive the first voltage, a source of the fifth NMOS transistor serves as a second end of the second switch element to be connected to the second end of the second unidirectional conducting element, a gate of the fifth NMOS transistor serves as the enabling end of the second switch element to receive the second switch control signal, and the fifth NMOS transistor is turned on or off under the control of the second switch control signal.

In an exemplary solution, the second unidirectional conducting element is a seventh NMOS transistor, the second reverse-biased switch element is a sixth NMOS transistor, a drain of the seventh NMOS transistor serves as the first end of the second unidirectional conducting element to receive the second voltage, a source of the seventh NMOS transistor serves as the second end of the second unidirectional conducting element to be connected to the second end of the second switch element and a first end of a sixth NMOS transistor, and a gate of the seventh NMOS transistor is connected to an enabling end of the second switch element.

Specifically, when the fifth NMOS transistor is turned on under enablement of the second switch control signal, the seventh NMOS transistor is turned on under the enablement of the switch control signal, the source of the seventh NMOS transistor receives the first voltage through the fifth NMOS transistor, and the seventh NMOS transistor is in the forward conduction state. When the fifth NMOS transistor is turned off under the control of the second switch control signal, the seventh NMOS transistor is turned off under the control of the second switch control signal, and the sixth NMOS transistor is turned on under the enablement of the second control signal. A source of the seventh NMOS transistor receives the second preset voltage through the sixth NMOS transistor, a voltage value of the second preset voltage is greater than or equal to the first voltage, and the seventh NMOS transistor is switched to the reverse-biased state.

In another exemplary solution, the second unidirectional conducting element is a seventh diode, the second reverse-biased switch element is the sixth NMOS transistor, an anode of the seventh diode serves as a first end of the second unidirectional conducting element to receive the second voltage, and a cathode of the seventh diode serves as the second end of the second unidirectional conducting element to be connected to the second end of the fifth NMOS transistor and the first end of the sixth NMOS transistor. When the fifth NMOS transistor is turned on under the enablement of the second switch control signal, the cathode of the seventh diode receives the first voltage through the fifth NMOS transistor, and the seventh NMOS transistor is in the forward conduction state. When the fifth NMOS transistor is turned off under the control of the second switch control signal, the sixth NMOS transistor is turned on under the enablement of the second control signal, the cathode of the seventh diode receives the second preset voltage through the sixth NMOS transistor, the voltage value of the second preset voltage is greater than or equal to the first voltage, and the seventh diode is switched to the reverse-biased state.

Specifically, when the fifth NMOS transistor is turned on under enablement of the second switch control signal, the second switch control signal is at a high level higher than the first voltage; or when the fifth NMOS transistor is turned off under the control of the second switch control signal, the second switch control signal is at a low level lower than or equal to the first voltage.

In some exemplary solutions, the switch circuit further includes a second phase inverter, an input end of the second phase inverter is connected to the enabling end of the fifth NMOS transistor, and an output end of the second phase inverter is connected to the second reverse-biased enabling end of the sixth NMOS transistor, so that the sixth NMOS transistor and the fifth NMOS transistor are in reverse states.

When the second switch element is turned off, the second unidirectional conducting element is in the reverse-biased state, and therefore, the switch circuit provided in the optional solution prevents a current from flowing through the second switch element, thereby improving isolation of the switch circuit.

In another optional manner, a unidirectional conducting element is provided at the first end of the switch circuit. Specifically, the switch circuit includes a first switch element, a first unidirectional conducting element, and a first reverse-biased switch element, and the first switch element includes a first end, a second end, and an enabling end. The first end of the first switch element serves as the second end of the switch circuit to receive the second voltage, the second end is connected to the second end of the first unidirectional conducting element, and the first end of the first unidirectional conducting element serves as the first end of the switch circuit to receive the first voltage. The first reverse-biased switch element includes a first end, a second end, and a first reverse-biased enabling end, the first end of the first reverse-biased switch element is connected to the second end of the first unidirectional conducting element, the second end of the first reverse-biased switch element receives a first preset level, the first reverse-biased enabling end receives a first switch control signal, and the first preset level is less than or equal to the first voltage.

The first reverse-biased control signal is used to turn off the first reverse-biased switch element when the first switch element is turned on through the first switch control signal, and the second end of the first unidirectional conducting element receives the second voltage through the first switch element, so that the first unidirectional conducting element is in the forward conduction state.

The first reverse-biased control signal is also used to turn on the first reverse-biased switch element when the first switch element is turned off through the first switch control signal, and the second end of the first unidirectional conducting element receives the first preset level through the first reverse-biased switch element.

In some embodiments, a voltage value of the first preset level is equal to the second voltage.

Specifically, the second end of the first reverse-biased switch element is connected to the first end of the first switch element.

In an exemplary solution, the first switch element is a second NMOS transistor, a drain of the second NMOS transistor serves as the first end of the first switch element to receive the second voltage, a source of the second NMOS transistor serves as a second end of the first switch element to be connected to the second end of the first unidirectional conducting element, a gate of the second NMOS transistor serves as the enabling end of the first switch element to receive the first switch control signal, and the second NMOS transistor is turned on or off under the control of the first switch control signal.

In an exemplary solution, the first unidirectional conducting element is a fourth NMOS transistor, the first reverse-biased switch element is a third NMOS transistor, a source of the fourth NMOS transistor is connected to a source of the second NMOS transistor and a drain of the third NMOS transistor, a drain of the fourth NMOS transistor receives the first voltage, and a gate of the fourth NMOS transistor is connected to a gate of the second NMOS transistor. When the second NMOS transistor is turned on under enablement of the first switch control signal, the fourth NMOS transistor is also turned on under the enablement of the first switch control signal, the third NMOS transistor is turned off under the control of the first reverse-biased control signal, the source of the fourth NMOS transistor receives the second voltage through the second NMOS transistor, and the fourth NMOS transistor is in the forward conduction state. When the second NMOS transistor is turned off under the control of the first switch control signal, the third NMOS transistor is turned on under the enablement of the first reverse-biased control signal, the source of the fourth NMOS transistor receives the first preset level through the third NMOS transistor, and the fourth NMOS transistor is in the reverse-biased state.

Specifically, the source of the third NMOS transistor is connected to the drain of the second NMOS transistor.

Further, when the second NMOS transistor is turned on under enablement of the first switch control signal, the first switch control signal is at a high level higher than the second voltage; or when the second NMOS transistor is turned off through the first switch control signal, the first switch control signal is at a low level lower than or equal to the second voltage.

In an exemplary solution, the first unidirectional conducting element is a fourth diode, the first reverse-biased switch element is a third NMOS transistor, an anode of the fourth diode is connected to a source of the second NMOS transistor and a drain of the third NMOS transistor, and a cathode of the fourth diode receives the first voltage. When the second NMOS transistor is turned on under enablement of the first switch control signal, the third NMOS transistor is turned off under the control of the first reverse-biased control signal, the anode of the fourth diode receives the second voltage through the second NMOS transistor, and the fourth diode is in the forward conduction state. When the second NMOS transistor is turned off under the control of the first switch control signal, the third NMOS transistor is turned on under the enablement of the first reverse-biased control signal, the anode of the fourth diode receives the first preset level through the third NMOS transistor, and the fourth NMOS transistor is in the reverse-biased state.

Further, when the second NMOS transistor is turned on under enablement of the first switch control signal, the first switch control signal is at a high level higher than the second voltage; or when the second NMOS transistor is turned off under the control of the first switch control signal, the first switch control signal is switched to a low level lower than or equal to the second voltage.

In some exemplary solutions, the switch circuit further includes the first phase inverter, an input end of the first phase inverter is connected to the enabling end of the second NMOS transistor, and an output end of the first phase inverter is connected to the first reverse-biased enabling end of the third NMOS transistor, so that the third NMOS transistor and the second NMOS transistor are in reverse states.

When the first switch element is turned off, the first unidirectional conducting element is in the reverse-biased state, and therefore, the switch circuit provided in the optional solution prevents a current from flowing through the first switch element, thereby improving isolation of the switch circuit.

According to a seventh aspect, this application provides a second cathode addressing drive circuit, applied to a laser array, having one end connected to an emission power supply and the other end connected to a cathode of a laser connected to a shared cathode end in the laser array, and the second cathode addressing drive circuit includes:

a cathode energy storage circuit, including a cathode energy storage element, where a first end of the cathode energy storage element is connected to the emission power supply, a second end of the cathode energy storage element is connected to a cathode of a laser connected to a corresponding shared cathode end, and the cathode energy storage element is configured to be charged through an output current of the emission power supply at a voltage application stage, to form a positive potential difference between the first end and the second end of the cathode energy storage element, where the laser remains in the reverse-biased state at the voltage application stage; and a second cathode addressing switch circuit, including a cathode addressing switch element, where the cathode addressing switch element includes a first end, a second end, and a cathode addressing enabling end, one of the first end and the second end of the cathode addressing switch element is connected to the first end of the cathode energy storage element, the other of the first end and the second end of the cathode addressing switch element is grounded, the cathode addressing enabling end receives a cathode addressing signal, and the cathode addressing signal is used to turn on the cathode addressing switch element at a voltage conversion stage, so that the first end of the cathode energy storage element is grounded and a voltage at the second end of the cathode energy storage element is pulled down, thereby switching the laser to the forward conduction state at an energy release stage of the cathode energy storage element.

Further, the cathode energy storage circuit also includes an energy storage unidirectional conducting element, the first end of the energy storage unidirectional conducting element is connected to the second end of the cathode energy storage element, the second end of the energy storage unidirectional conducting element is grounded, and the energy storage unidirectional conducting element is in the forward conduction state at a voltage application stage, so that the second end of the cathode energy storage element is grounded and the energy storage unidirectional conducting element is in the reverse-biased state at a voltage conversion stage, to disconnect the second end of the cathode energy storage element from the ground.

Further, the cathode energy storage circuit further includes an anti-oscillation element, and the anti-oscillation element is connected to the energy storage unidirectional conducting element in parallel.

Further, the cathode energy storage circuit also includes a second current limiting element, the second current limiting element is connected between the emission power supply and the first end of the cathode energy storage element, the first end of the second current limiting element is connected to the emission power supply, and the second end of the second current limiting element is connected to the first end of the cathode energy storage element, to limit a current for charging the cathode energy storage element.

According to an eighth aspect, this application provides a second cathode addressable drive circuit, applied to a laser array, and the second cathode addressable drive circuit includes the foregoing multiple second cathode addressing drive circuits, ends of the multiple second cathode addressing drive circuits are connected to an emission power supply, and the other ends of the multiple second cathode addressing drive circuits are separately connected to cathodes of multiple columns of lasers connected to multiple shared cathode ends in the laser array in one-to-one correspondence.

According to a ninth aspect, this application provides an addressable drive circuit, applied to a laser array, the addressable drive circuit including:

a second anode addressable drive circuit, where the second anode addressable drive circuit includes multiple second anode addressing drive circuits, ends of the multiple second anode addressing drive circuits are grounded, and the other ends of the multiple second anode addressing drive circuits are connected to anodes of multiple rows of lasers connected to multiple shared anode ends in the laser array in one-to-one correspondence;

the second anode addressing drive circuit includes a second anode addressing switch circuit, the second anode addressing switch circuit includes a second anode addressing switch element, the second anode addressing switch element includes a first end, a second end, and an anode addressing enabling end, the first end is grounded, the second end is connected to an anode of a laser connected to a corresponding shared anode end, the anode addressing enabling end receives an anode addressing signal, and the second anode addressing switch element is turned on or off under the control of the anode addressing signal; and the foregoing second cathode addressable drive circuit.

Further, the second anode addressing switch circuit further includes a second anode unidirectional conducting element, the second anode unidirectional conducting element is connected between the second anode addressing switch element and the corresponding shared anode end, a first end of the anode unidirectional conducting element is connected to the anode of the laser connected to the corresponding shared anode end, and a second end of the anode unidirectional conducting element is connected to the second end of the second anode addressing switch element; and when the second anode addressing switch element is in a turn-on state, the second anode unidirectional conducting element is in a forward conduction state to allow the current to pass through the second anode addressing switch element; or when the second anode addressing switch element is in a turn-off state, the second anode unidirectional conducting element is in a reverse-biased state to prevent the current from passing through the second anode addressing switch element.

Further, the second anode addressing switch circuit further includes a second anode reverse-biased switch element; the second anode reverse-biased switch element includes a first end, a second end, and an anode reverse-biased enabling end, the first end is connected to the second end of the second anode unidirectional conducting element, the second end receives a first preset level, and the anode reverse-biased enabling end receives an anode reverse-biased control signal;

the anode reverse-biased control signal is used to turn off the second anode reverse-biased switch element when the second anode addressing switch element is turned on through the anode addressing signal, so that the second end of the second anode unidirectional conducting element is grounded through the second anode addressing switch element, and the second anode unidirectional conducting element is in the forward conduction state; and the anode reverse-biased control signal is also used to turn on the second anode reverse-biased switch element when the second anode addressing switch element is turned off through the anode addressing signal, so that the second end of the second anode unidirectional conducting element receives the first preset level through the second anode reverse-biased switch element, and the second anode unidirectional conducting element is in the reverse-biased state.

Further, the second anode addressing switch circuit further includes a second anode phase inverter, an input end of the second anode phase inverter is connected to the anode addressing enabling end, and an output end of the second anode phase inverter is connected to the anode reverse-biased enabling end; or the input end of the second anode phase inverter is connected to the anode reverse-biased enabling end, and the output end of the second anode phase inverter is connected to the anode addressing enabling end.

As a specific embodiment, the second anode unidirectional conducting element includes a tenth NMOS transistor, a source of the tenth NMOS transistor is connected to the second end of the second anode addressing switch element, a drain of the tenth NMOS transistor is connected to the corresponding shared anode end, and a gate of the tenth NMOS transistor is connected to the anode addressing enabling end of the second anode addressing switch element.

As another specific embodiment, the second anode unidirectional conducting element includes a twelfth diode, an anode of the twelfth diode is connected to the second end of the second anode addressing switch element, and a cathode is connected to the corresponding shared anode end.

According to a tenth aspect, this application provides an addressable drive circuit, applied to a laser array, and the addressable drive circuit includes: a second anode addressing drive circuit and a second cathode addressing drive circuit;

the second cathode addressing drive circuit includes a cathode energy storage circuit and a second cathode addressing switch circuit;

the cathode energy storage circuit includes a cathode energy storage element, a first end of the cathode energy storage element is connected to one emission power supply, a second end of the cathode energy storage element is connected to a cathode of a laser connected to a shared cathode end, and the cathode energy storage circuit is configured to be charged through an output current of the emission power supply at a voltage application stage, to form a positive potential difference between the first end and the second end of the cathode energy storage element;

the second cathode addressing switch circuit includes a second cathode addressing switch element, the second cathode addressing switch element includes a first end, a second end, and a cathode addressing enabling end, one of the first end and the second end is connected to the first end of the cathode energy storage element, the other of the first end and the second end is grounded, the cathode addressing enabling end receives a cathode addressing signal, and the cathode addressing signal is used to turn on the second cathode addressing switch element at a voltage conversion stage, so that the first end of the cathode energy storage element is grounded and a voltage at the second end of the cathode energy storage element is pulled down;

the second anode addressing drive circuit includes a second anode addressing switch circuit;

the second anode addressing switch circuit includes a second anode addressing switch element and a second anode unidirectional conducting element, the second anode addressing switch element includes a first end, a second end, and an anode addressing enabling end, the first end is grounded, the second end is connected to the second end of the second anode unidirectional conducting element, the anode addressing enabling end receives an anode addressing signal, and the first end of the second anode unidirectional conducting element is connected to an anode of the laser connected to the shared anode end; and when the second anode addressing switch element is in a turn-on state, the second anode unidirectional conducting element is in a forward conduction state to allow the current to pass through the second anode addressing switch element; or when the second anode addressing switch element is in a turn-off state, the second anode unidirectional conducting element is in a reverse-biased state to prevent the current from passing through the second anode addressing switch element.

According to an eleventh aspect, this application provides a laser emission circuit, including a laser array and the second addressable drive circuit in any one of the foregoing embodiments, where the multiple second anode drive circuits are configured to drive anode addressing of multiple rows of lasers connected to the multiple shared anode ends, and multiple second cathode addressing drive circuits are configured to drive cathode addressing of multiple columns of lasers connected to the multiple shared cathode ends.

According to an twelfth aspect, this application provides a LiDAR, including the forgoing laser emission circuit.

According to a thirteenth aspect, this application provides a third anode addressable drive circuit, applied to a laser array and connected to multiple shared anode ends corresponding to multiple rows of lasers in the laser array, and the anode addressable drive circuit includes:

at least one energy storage-adjustable charging circuit, where an input end of the charging circuit is connected to one emission power supply, an output end of the charging circuit is connected to multiple anode addressing drive circuits and configured to receive an output current of the emission power supply to be charged and store energy, and an energy storage value of the charging circuit is adjustable, so that a current with an adjustable current value is output to the anode addressing drive circuit when the anode addressing drive circuit is connected; and multiple third anode addressing drive circuits, including ends connected to the charging circuit and the other ends respectively connected to multiple shared anode ends in one-to-one correspondence.

As a specific embodiment, the energy storage-adjustable charging circuit includes:

a transitory energy storage element, including a first end connected to the emission power supply and a second end connected to a first end of a charging switch element and an end of the third anode addressing drive circuit; and the charging switch element, including a first end, a second end, and a charging enabling end, where the first end is connected to the second end of the transitory energy storage element, the second end is grounded, the charging enabling end receives a charging control signal, and the charging switch element is turned on or off under the control of the charging control signal, so that an energy storage value of the transitory energy storage element is adjustable.

In some embodiments, the transitory energy storage element includes an energy storage inductor.

As a specific embodiment, the third anode addressing drive circuit includes:

a third anode addressing switch circuit, including a third anode addressing switch element, where the third anode addressing switch element includes a first end, a second end, and an addressing control end, the first end is connected to an output end of the charging circuit, the second end is connected to a third anode energy storage circuit, the addressing enabling end receives an anode addressing signal, and the third anode addressing switch element is turned on or off under the control of the anode addressing signal, so that the transitory energy storage element charges the third anode energy storage circuit with energy stored in the transitory energy storage element when the third anode addressing switch element is turned on; and the third anode energy storage circuit, including a third anode energy storage element, where a first end of the third anode energy storage element is connected to the second end of the third anode addressing switch element and a corresponding shared anode end, a second end of the third anode energy storage element is grounded, and the third anode energy storage element is configured to be charged through an output current of the transitory energy storage element when the third anode addressing switch element is turned on.

Further, the third anode addressing switch circuit further includes a third anode unidirectional conducting element, the third anode unidirectional conducting element is connected between the third anode addressing switch element and the corresponding shared anode end, a first end is connected to a corresponding shared anode end, and a second end is connected to the second end of the third anode addressing switch element; and when the third anode addressing switch element is in a turn-on state, the third anode unidirectional conducting element is in a forward conduction state, and the transitory energy storage element outputs a current through the third anode addressing switch element and the third anode unidirectional conducting element to charge the third anode energy storage element; or when the third anode addressing switch element is in a turn-off state, the third unidirectional conducting element is in a reverse-biased state to prevent the current from passing through the third anode addressing switch element.

Further, the third anode addressing drive circuit further includes a third anode reverse-biased switch element; the third anode reverse-biased switch element includes a first end, a second end, and a reverse-biased enabling end, the first end is connected to the second end of the third anode unidirectional conducting element, the second end is grounded, the reverse-biased enabling end receives a reverse-biased control signal, and the reverse-biased control signal and the anode addressing signal are in reverse states;

the reverse-biased control signal is used to turn off the third anode reverse-biased switch element when the third anode addressing switch element is turned on through the anode addressing signal, so that the second end of the third anode unidirectional conducting element is connected to the charging circuit through the third anode addressing switch element, and the third anode unidirectional conducting element is in the forward conduction state; and the reverse-biased control signal is also used to turn on the third anode reverse-biased switch element when the third anode addressing switch element is turned off through the anode addressing signal, so that the second end of the third anode reverse-biased switch element is grounded, and the third anode unidirectional conducting element is in the reverse-biased state.

Further, the third anode addressing switch circuit further includes a third anode phase inverter, an input end of the third anode phase inverter is connected to the addressing enabling end, and an output end of the third anode phase inverter is connected to the reverse-biased enabling end; or the input end of the third anode phase inverter is connected to the reverse-biased enabling end, and the output end of the third anode phase inverter is connected to the addressing enabling end.

Further, the third anode addressing drive circuit further includes an anode energy release switch circuit, where the anode energy release switch circuit includes an energy release switch element, the energy release switch element includes a first end, a second end, and an energy release enabling end, the first end is connected to the first end of the third anode energy storage element, the second end is grounded, the energy release enabling end receives an energy release control signal, and the energy release control signal and the anode addressing signal are in reverse states;

the energy release control signal is used to turn off the energy release switch element when the third anode addressing switch element is turned on through the anode addressing signal, so that the first end of the third anode energy storage element is connected to a charging circuit, and the third anode energy storage element is charged through the charging circuit; and the energy release control signal is also used to turn on the energy release switch element when the third anode addressing switch element is turned off through the anode addressing signal, so that the first end of the third anode energy storage element is grounded.

In some embodiments, the energy release enabling end of the anode energy release switch circuit is connected to the addressing enabling end of the third anode addressing switch element through a third anode phase inverter, an input end of the third anode phase inverter is connected to the addressing enabling end, and an output end of the third anode phase inverter is connected to the energy release enabling end; or the input end of the third anode phase inverter is connected to the energy release enabling end, and the output end of the third anode phase inverter is connected to the addressing enabling end.

Further, the anode energy release switch circuit further includes a fourth current limiting element, the fourth current limiting element is connected between the first end of the third anode energy storage element and the first end of the energy release switch element and configured to limit a current for releasing energy from the third anode energy storage element.

Further, the third anode energy storage circuit further includes a third current limiting element, the third current limiting element is connected between the third anode addressing drive circuit and the third anode energy storage element and configured to limit a current for charging the third anode energy storage element.

According to a fourteenth aspect, this application provides an addressable drive circuit, including:

a third cathode addressable drive circuit, where the third cathode addressable drive circuit includes multiple third cathode addressing drive circuits, ends of the multiple third cathode addressing drive circuits are in one-to-one correspondence with multiple shared cathode ends in the laser array, and the other ends of the multiple third cathode addressing drive circuits are grounded; and the third anode addressable drive circuit according to any one of the foregoing embodiments.

According to a fifteenth aspect, this application provides a laser emission circuit, including:

a laser array; and the foregoing addressable drive circuit, where the third anode addressable drive circuit is configured to drive anode addressing of multiple rows of lasers connected to the multiple shared anode ends, and the third cathode addressable drive circuit is configured to drive cathode addressing of multiple columns of lasers connected to the multiple shared cathode ends.

According to a sixteenth aspect, this application provides a LiDAR, including the forgoing laser emission circuit.

When the emission power supply in the anode addressing drive circuit provided in this embodiment of this application outputs the current to charge the anode energy storage element, the current output by the emission power supply is mainly used to charge the anode energy storage element, and a current on a parallel parasitic capacitor is relatively small, so that light leakage of the laser and false light emission, which is caused by the parallel parasitic capacitor in the switch element, can be reduced. Further, the anode addressing drive circuit limits the current for charging the anode energy storage element through the current limiting element, so that the current for charging the anode energy storage element is less than a light emission current threshold of the laser, and light leakage, which is a result of false light emission of the laser caused by the parallel parasitic capacitor at a charging stage of the anode energy storage element, can be avoided, thereby improving light emission control accuracy of the laser array. Further, the anode addressable drive circuit in the embodiments of the present disclosure is charged through the output charging current of the emission power supply, and the current limiting element is used to limit the current for charging the anode energy storage element, so that the current flowing through the laser is less than the light emission current threshold of the laser, thereby avoiding false light emission of the laser caused by the parasitic capacitor at a charging stage of the anode energy storage element and improving the light emission control accuracy of the laser array. Further, in the present disclosure, the unidirectional conducting element is connected in series in the addressing switch element, and a unidirectional conduction feature of the unidirectional conducting element is used, to improve the isolation of the addressing switch element, thereby reducing crosstalk of electrical signals between a laser unselected for light emission and a laser selected for light emission during light emission.

The cathode addressing drive circuit provided in this embodiment of this application includes a cathode addressing switch circuit and a cathode energy storage circuit; the cathode energy storage circuit includes a cathode energy storage element, and when the cathode addressing switch circuit is turned off, the cathode energy storage element is configured to be charged through the output current of the emission power supply, to form a positive potential difference, so that the laser is in a reverse-biased state at a voltage application stage of the cathode energy storage element, thereby solving the problems of light leakage and false light emission of the laser caused by the parallel parasitic capacitor included in the switch element, which improves the light emission control accuracy of the laser array. Further, in the present disclosure, the unidirectional conducting element is connected in series in the addressing switch element, and a unidirectional conduction feature of the unidirectional conducting element is used, to improve the isolation of the addressing switch element, thereby reducing crosstalk of electrical signals between a laser unselected for light emission and a laser selected for light emission during light emission. Based on the anode addressable drive circuit, the addressable drive circuit and the laser emission circuit in this embodiment of this application, the anode addressable drive circuit includes the energy storage-adjustable charging circuit and the multiple anode addressing drive circuits; and the anode addressing drive circuit includes the anode addressing drive circuit and the anode energy storage circuit. The energy storage-adjustable charging circuit is connected to one emission power supply and multiple anode addressing drive circuits; the energy storage-adjustable charging circuit has an adjustable energy storage value, and is configured to output a charging current with an adjustable current value to the anode addressing drive circuit and the anode energy storage circuit via the output current of the emission power supply at a charging stage, and the anode energy storage circuit is connected to the shared anode end of the multiple lasers, so that the laser emission power of the laser can be adjusted.

BRIEF DESCRIPTION OF DRAWINGS

The drawings are only used to illustrate embodiments, and are not considered as a limitation to the present disclosure. In addition, throughout the drawings, the same reference signs are used to represent the same components.

<center>DETAILED DESCRIPTION</center>

The following describes exemplary embodiments of the present disclosure in a more detailed manner with reference to the drawings. Although the drawings show the exemplary embodiments of the present disclosure, it should be understood that the present disclosure can be implemented in various forms and should not be limited to the embodiments described herein.

It should be noted that, when being "connected to" or "electrically connected to" another element, an element can be directly or indirectly connected to the another element.

In addition, the terms such as "first" and "second" are merely intended for a purpose of description, and shall not be understood as an indication or implication of relative importance or implicit indication of a quantity of indicated technical features. Therefore, a feature with a determiner such as "first" or "second" may expressly or implicitly include one or more features.

Before description of the laser emission circuit in this embodiment of the present disclosure, the related art is described first.

Figure 1:
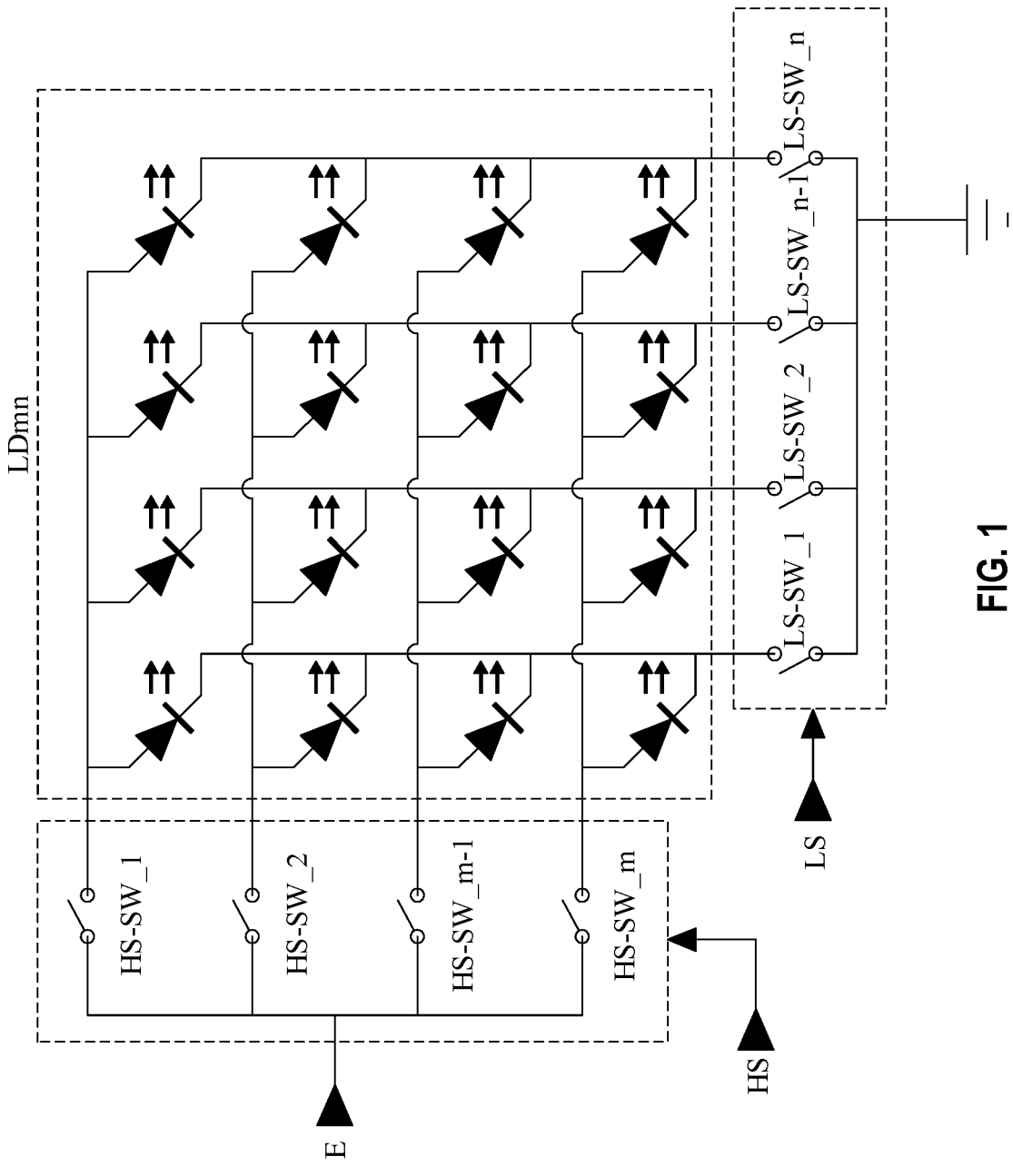
FIG. 1 is a schematic structural diagram of a laser emission circuit in a related art.

First, referring to FIG. 1, the laser emission circuit includes a laser array and an addressable drive circuit of the laser array, the laser array includes multiple lasers, and the multiple lasers are arranged in one or two dimensions. Using a two-dimensional laser array as an example, multiple lasers in the laser array are arranged in two dimensions, that is, the laser array is the two-dimensional laser array. Anodes of lasers in the same row in the laser array are electrically connected and extend to form a shared anode end, and cathodes of the lasers in the same column in the laser array are electrically connected and extend to form a shared cathode end. The addressable drive circuit of the laser array includes an anode addressable drive circuit and a cathode addressable drive circuit. The anode addressable drive circuit is connected to multiple shared anode ends corresponding to the multiple rows of lasers, and an anode addressing signal is externally received, to drive anode addressing for the anodes of the multiple rows of lasers through scanning; and the cathode addressable drive circuit is connected to the multiple shared cathode ends corresponding to the multiple columns of lasers, and then a cathode addressing signal is externally received, to drive cathode addressing for the cathodes of the multiple columns of lasers in the laser array through scanning.

Figure 2:
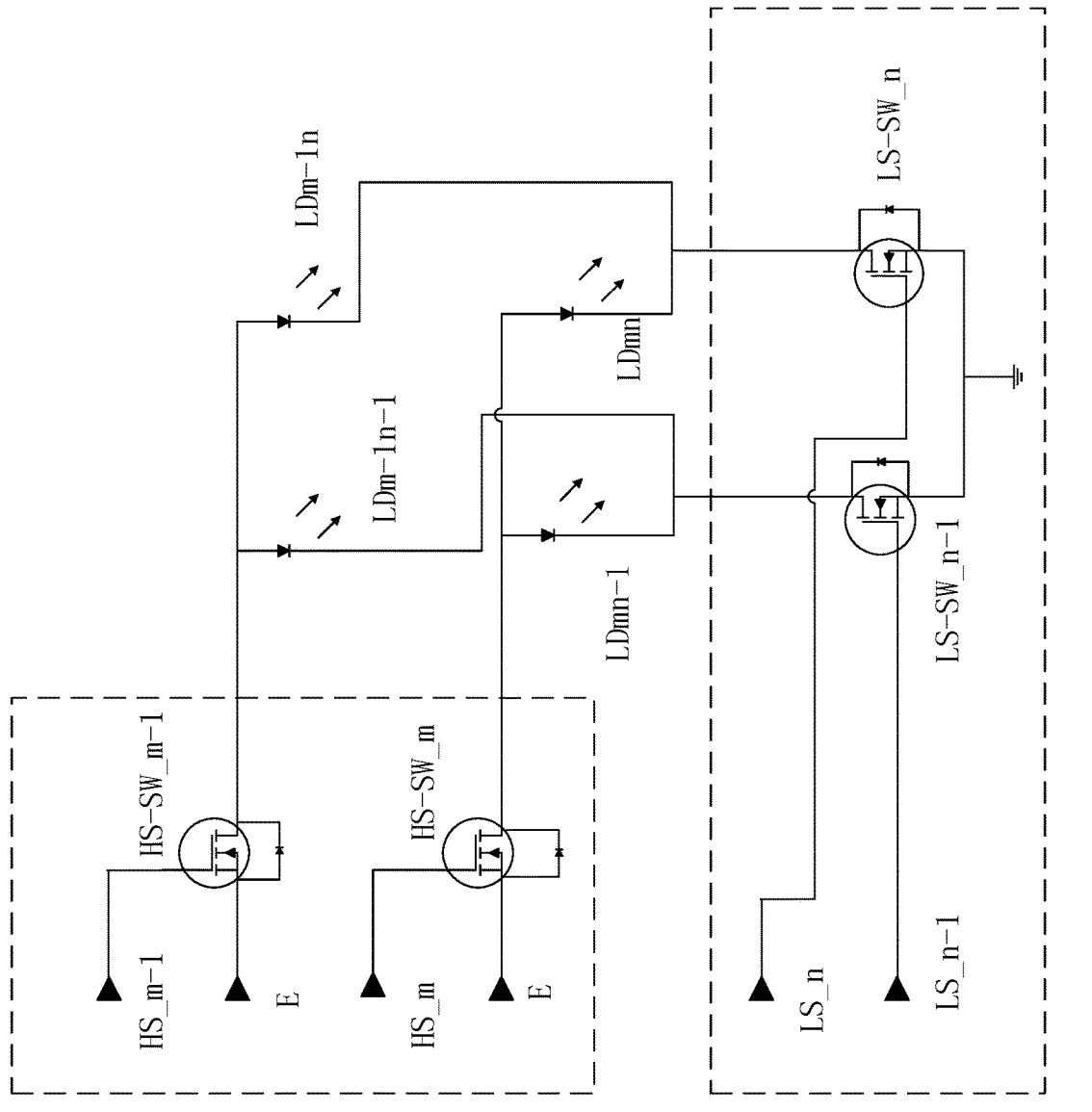
FIG. 2 is a schematic structural diagram of a part of a laser emission circuit in a related art.

In an exemplary solution, as shown in FIG. 1 and FIG. 2, the anode addressable drive circuit includes multiple anode addressing drive circuits, each anode addressing drive circuit is connected to a shared anode end correspondingly, and includes an anode switch element K1, and the anode switch element K1 includes a first end, a second end, and an addressing enabling end. The first end of the anode switch element K1 is connected to an emission power supply E, and the second end is connected to a corresponding shared anode end. The anode addressing signal can be received by addressing enabling ends of multiple anode switch elements K1 in the multiple anode addressing drive circuits, and the multiple anode switch elements K1 can be controlled to be turned on or off through scanning, to drive addressing for anodes of multiple rows of lasers. The cathode addressable drive circuit includes multiple cathode addressing drive circuits, each cathode addressing drive circuit is respectively connected to a shared cathode end correspondingly, and includes a cathode switch element K2, and the cathode switch element K2 includes a first end, a second end, and the addressing enabling end. The first end is connected to the corresponding shared cathode end, the second end is grounded, the cathode addressing signal is received by addressing enabling ends of the multiple cathode switch elements K2 in the multiple cathode addressing drive circuits, to control the multiple cathode switch elements K2 to turn on or off through scanning, thereby driving addressing for the cathodes of the multiple columns of lasers.

Figure 3:
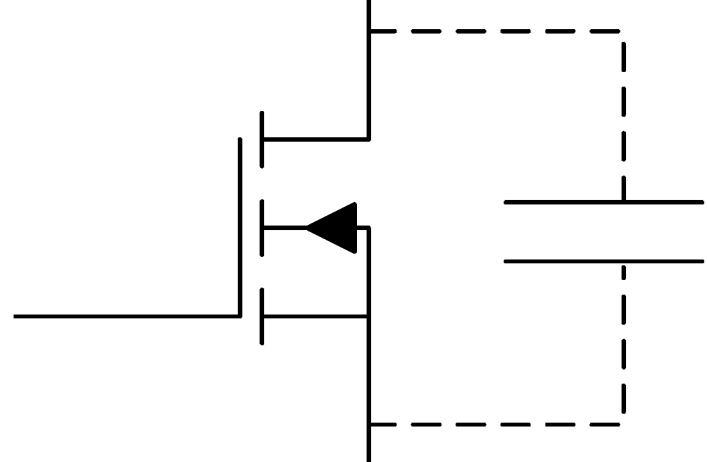
FIG. 3 is a schematic diagram of a switch element and a parallel parasitic capacitor in a related art.

Specifically, when an anode switch element corresponding to an anode and a cathode switch element corresponding to a cathode of any laser are turned on under the drive of the anode addressing signal and the cathode addressing signal, the laser is connected to the emission power supply E, and can emit light under the drive of the emission power supply E. As shown in FIG. 3, the related art has the following technical problems: (1) the switch element includes a parallel parasitic capacitor, and therefore, light leakage and false light emission of the laser occur because of the parasitic capacitor; and (2) the switch element includes the parallel parasitic capacitor, and therefore, isolation of the switch element is reduced, and a laser unselected for light emission emits light because of the crosstalk of electrical signals of a laser selected for light emission.

<center>Embodiment 1</center>

Figure 4:
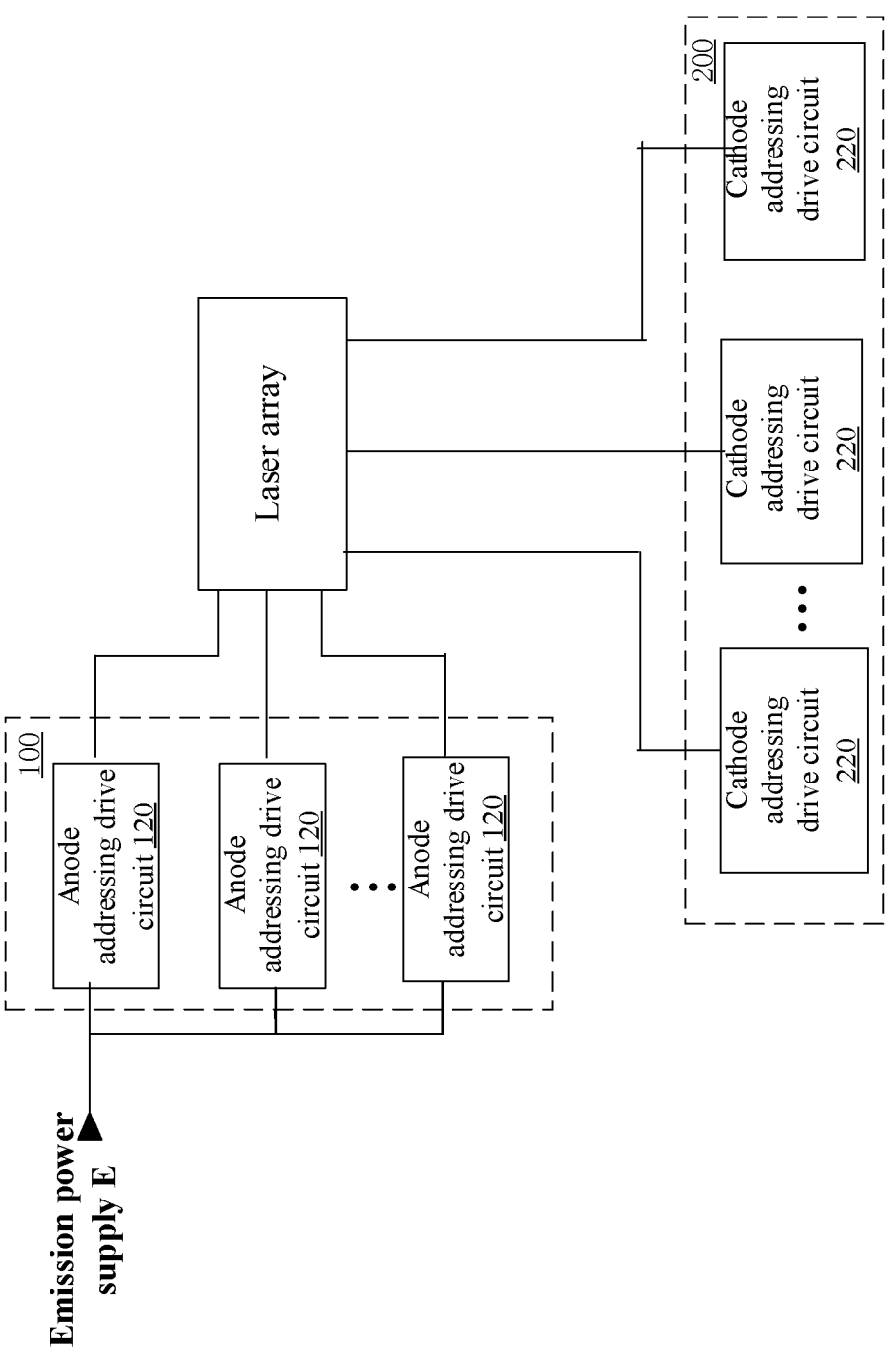
FIG. 4 is a schematic diagram of a framework of a laser emission circuit according to some embodiments of this application.

The first aspect is intended to solve a problem of false light emission of the laser, which is a result of light leakage caused by a parasitic capacitor when a switch element includes the parallel parasitic capacitor. Referring to FIG. 4, this application provides an addressable drive circuit, applied to a laser array and including an anode addressable drive circuit 100 and a cathode addressable drive circuit 200. Anodes of lasers in the same row in the laser array are electrically connected and extend to form a shared anode end, and cathodes of the lasers in the same column in the laser array are electrically connected and extend to form a shared cathode end. The anode addressable drive circuit 100 is connected to multiple shared anode ends corresponding to the multiple rows of lasers, and an anode addressing signal is externally received, to drive anode addressing for the anodes of the multiple rows of lasers through scanning; and the cathode addressable drive circuit 200 is connected to the multiple shared cathode ends corresponding to the multiple columns of lasers, and a cathode addressing drive signal is externally received, to drive cathode addressing for the cathodes of the multiple columns of lasers in the laser array through scanning.

In an exemplary solution, the laser array includes m rows of lasers and n columns of lasers, an anode addressable drive circuit 100 includes m anode addressing drive circuits 120, and a cathode addressable drive circuit 200 includes n cathode addressing drive circuits 220. One end of an $x^{th}$ anode addressing drive circuit 120 is connected to an emission power supply E, and the other end is connected to an $x^{th}$ shared anode end in the laser array, and further connected to an anode of a laser LDxy in the laser array, where x represents a specific row of the laser, x is a positive integer, and x=1, 2, . . . , m, where m is the total number of anode addressing drive circuits, and also the total number of shared anode ends in the laser array. One end of a $y^{th}$ cathode addressing drive circuit 220 is grounded, and the other end is connected to a $y^{th}$ shared cathode end in the laser array, and further connected to a cathode of the laser LDxy in the laser array, where y represents a specific column of the laser, y is a positive integer, and y=1, 2, . . . , n, where n is the total number of cathode addressing drive circuits, and also the total number of shared cathode ends in the laser array.

Figure 5:
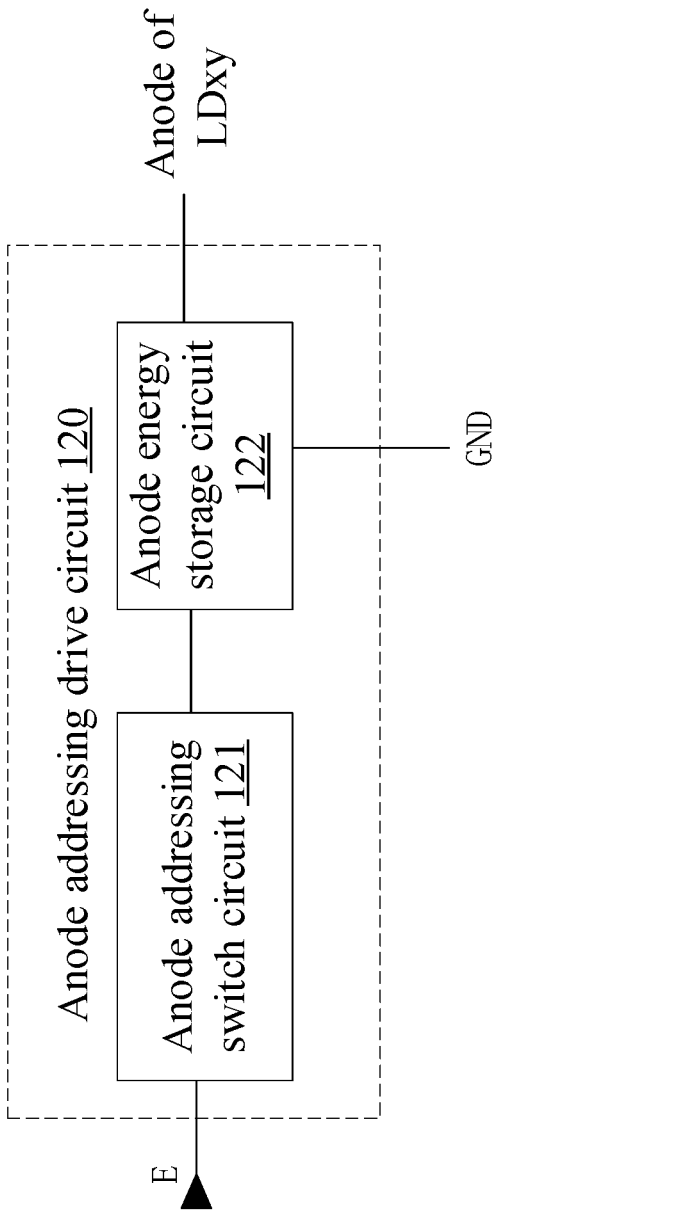
FIG. 5 is a schematic diagram of a framework of an anode addressing drive circuit according to some embodiments of this application.

Referring to FIG. 4 and FIG. 5, the anode addressing drive circuit 120 includes an anode addressing switch circuit 121 and an anode energy storage circuit 122, the anode addressing switch circuit 121 is connected to the emission power supply E and the anode energy storage circuit 122, and the anode energy storage circuit 122 is connected to an anode of the laser LDxy connected to a corresponding shared anode end. The anode addressing switch circuit 121 is turned on or off under the control of an anode addressing signal, so that the anode energy storage circuit 122 is charged through an output current of the emission power supply E when the anode addressing switch circuit 121 is turned on, and the anode energy storage circuit 122 outputs a current to drive the laser LDxy to emit light.

Figure 7:
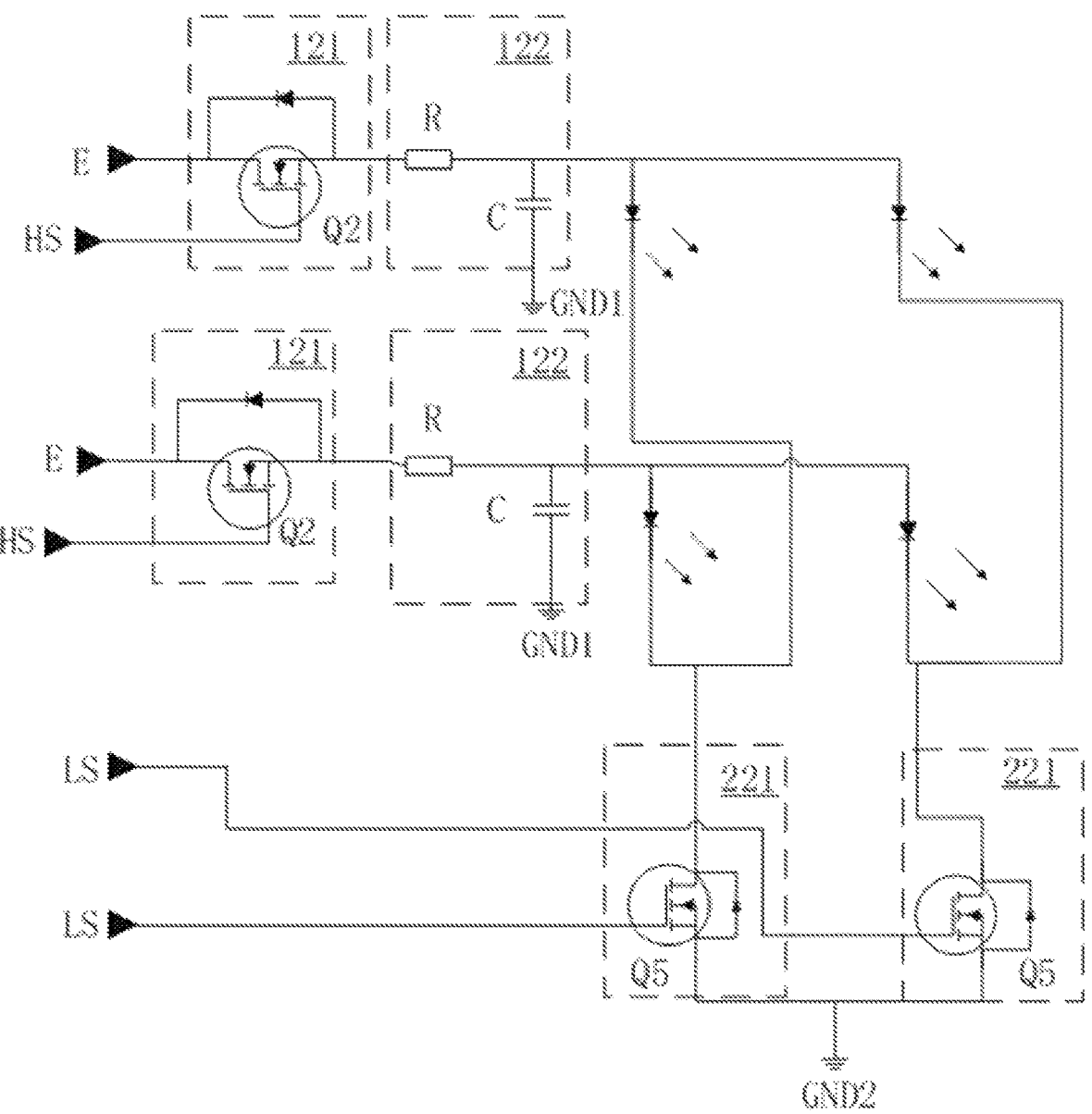
FIG. 7 is a schematic structural diagram of an anode addressing drive circuit according to some embodiments of this application.

Referring to FIG. 7, in an exemplary solution, the anode addressing switch circuit 121 includes an anode addressing switch element Q2, and the anode addressing switch element Q2 includes a first end, a second end, and an anode addressing enabling end. The first end is connected to the emission power supply E, the second end is connected to the anode energy storage circuit 122, the anode addressing enabling end receives an anode addressing signal HS, and the anode addressing signal HS is used to turn on or off the anode addressing switch element Q2. When the anode addressing switch element Q2 is turned on, the anode energy storage circuit 122 is charged through an output current of the emission power supply E, and the anode energy storage circuit 122 outputs the current to drive the laser LDxy to emit light.

In some embodiments, the anode addressing switch element Q2 is a second NMOS transistor, a drain of the second NMOS transistor serves as the first end of the anode addressing switch element Q2 to be connected to the emission power supply E, a source of the second NMOS transistor serves as the second end of the anode addressing switch element Q2 to be connected to the anode energy storage circuit 122, and a gate of the second NMOS transistor is the anode addressing enabling end for receiving the anode addressing signal HS. The second NMOS transistor is turned on or off under the control of the anode addressing signal.

In another exemplary solution, the anode addressing switch element Q2 is a second PMOS transistor, a drain of the second PMOS transistor serves as the first end of the anode addressing switch element Q2 to be connected to the emission power supply E, a source of the second PMOS transistor serves as the second end of the anode addressing switch element Q2 to be connected to the anode energy storage circuit 122, and a gate of the second PMOS transistor serves as the addressing enabling end of the anode addressing switch element Q2 to receive the anode addressing signal. The second PMOS transistor is turned on or off under the control of the anode addressing signal HS.

A voltage condition $V_{GS}$ when the anode addressing signal drives the second PMOS transistor to be turned on is opposite to a voltage condition $V_{GS}$ when the anode addressing signal drives the second NMOS transistor to be turned on, where $V_{GS}=V_G-V_S$, $V_G$ is a gate voltage of the MOS transistor (the second NMOS transistor or the second PMOS transistor), and $V_S$ is a source voltage of the MOS transistor (the second NMOS transistor or the second PMOS transistor). For example, a condition for turning on the second NMOS transistor is that $V_{GS}$ of the second NMOS transistor is greater than or equal to $V_{th}$. In this case, the anode addressing signal is at a high level when the second NMOS transistor is turned on, and the anode addressing signal is at a low level when the second NMOS transistor is turned off. A condition for turning on the second PMOS transistor is that $V_{GS}$ of the second PMOS transistor is less than or equal to $V_{th}$. In this case, the anode addressing signal is at a low level when the second PMOS transistor is turned on, and the anode addressing signal is at a high level when the second PMOS transistor is turned off.

Referring to FIG. 7, in an exemplary solution, the anode energy storage circuit 122 includes an anode energy storage element C and a current limiting element R, a first end of the current limiting element R is connected to a second end of the anode addressing switch element Q2, a second end of the current limiting element R is connected to a first end of the anode energy storage element C and an anode of a laser connected to a corresponding shared anode end, and a second end of the anode energy storage element C is grounded. When the anode addressing switch element Q2 is turned on, the anode energy storage element C is configured to form a second charging loop: emission power supply E—anode addressing switch element Q2—current limiting element R—anode energy storage element C—the ground. The anode energy storage element C stores electric energy through the output current of the emission power supply E, and releases the electric energy stored in the anode energy storage element C to output a current to drive the laser to emit light. The current limiting element is configured to limit a current for charging the anode energy storage element C.

In some embodiments, the anode energy storage element C includes an energy storage capacitor; and the current limiting element R includes a current limiting resistor.

Figure 6:
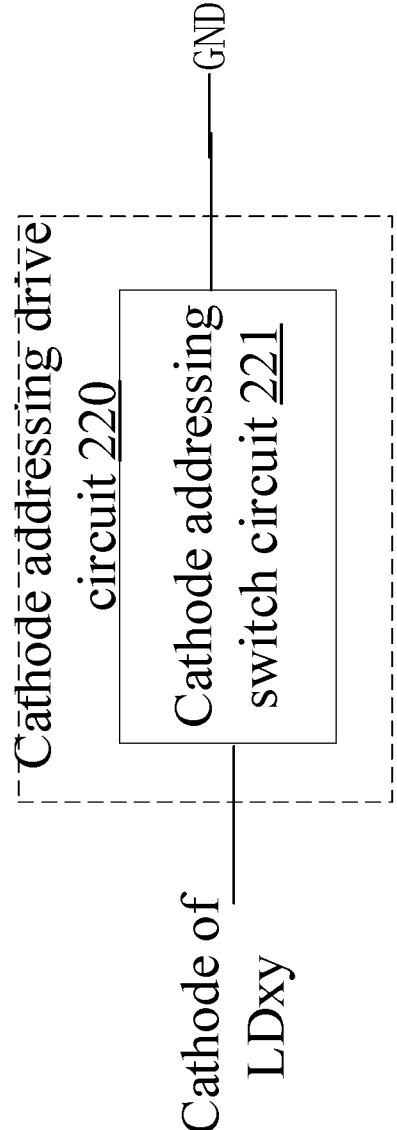
FIG. 6 is a schematic diagram of a framework of a cathode addressing drive circuit according to some embodiments of this application.
Figure 8:
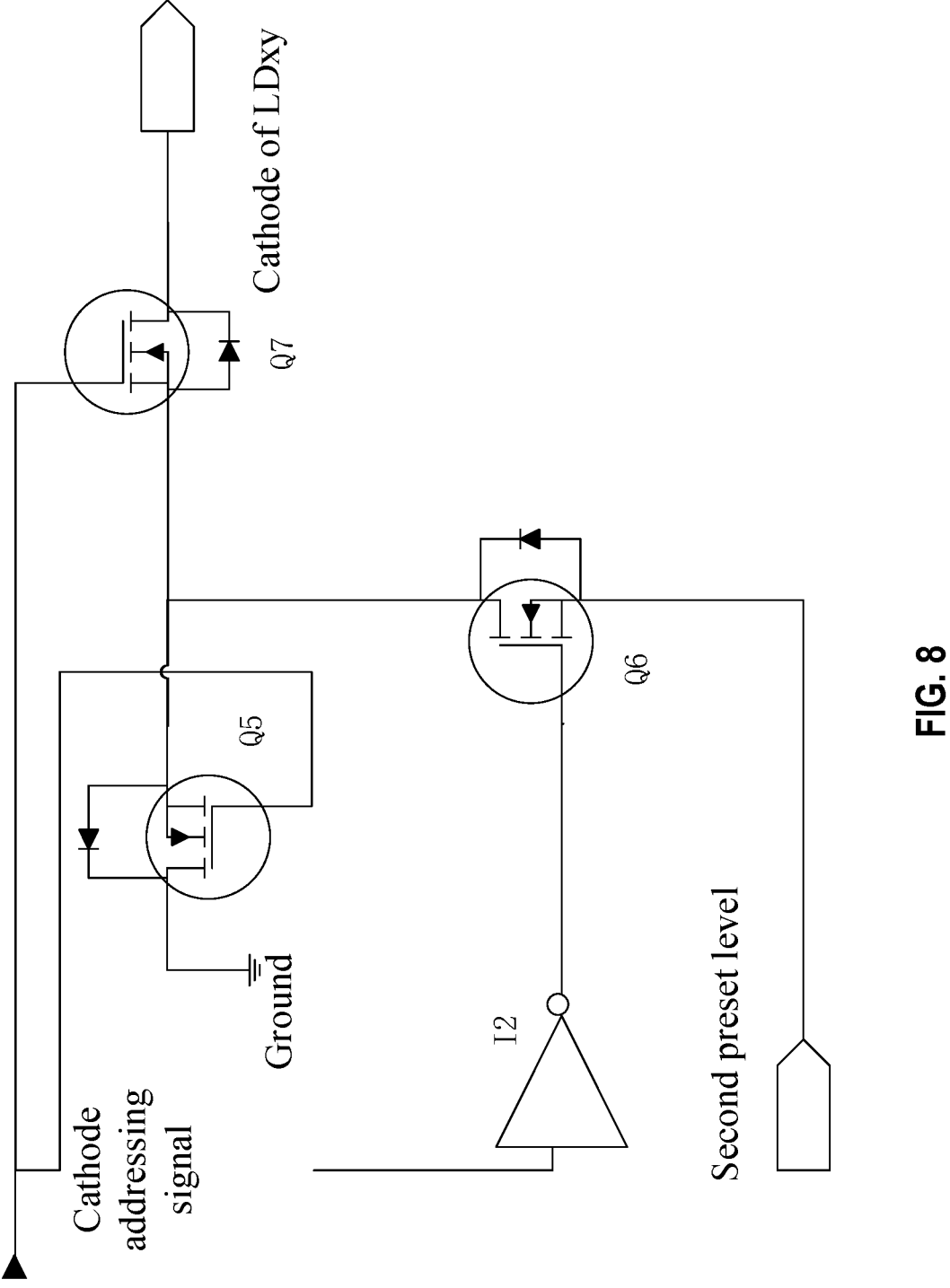
FIG. 8 is a schematic structural diagram of a cathode addressing switch circuit according to some embodiments of this application.

Referring to FIG. 4 and FIG. 6, the cathode addressing drive circuit 220 includes a cathode addressing switch circuit 222, one end of the cathode addressing switch circuit 222 is connected to a cathode of a laser connected to a corresponding shared cathode end, and the other end of the cathode addressing switch circuit 222 is grounded. As shown in FIG. 8, in an exemplary solution, the cathode addressing switch circuit 222 includes a cathode addressing switch element Q5, and the cathode addressing switch element Q5 includes a first end, a second end, and a cathode addressing enabling end, the first end is connected to the cathode of the laser, the second end is grounded, the cathode addressing enabling end receives a cathode addressing signal, and the cathode addressing switch element Q5 is turned on or off under the control of the cathode addressing signal.

In some embodiments, the cathode addressing switch element Q5 is a fifth NMOS transistor, a drain of the fifth NMOS transistor serves as the first end of the cathode addressing switch element Q5 to be connected to the cathode of the laser, a source of the fifth NMOS transistor serves as the second end of the cathode addressing switch element Q5 to be grounded, and a gate of the fifth NMOS transistor serves as the cathode addressing enabling end to receive a cathode addressing signal LS. The cathode addressing switch element Q5 is turned on or off under the control of the cathode addressing signal LS.

In a related art, because an anode addressing switch K1 and a cathode addressing switch K2 include a parasitic capacitor, and the parasitic capacitor is usually connected to the anode addressing switch K1 and the cathode addressing switch K2 in parallel, when the emission power supply outputs a current, even if the anode addressing switch K1 and the cathode addressing switch K2 are selected to be turned on, because of the parallel parasitic capacitor, the emission power supply E, the parallel parasitic capacitor of the anode addressing switch K1, the anode of the laser, the parallel parasitic capacitor of the cathode addressing switch K2 and the ground form a loop. The emission power supply E directly outputs a relatively large current, and once the current output by the emission power supply E to the loop reaches a light emission current threshold of the laser, the false light emission occurs in the laser.

When the anode addressing drive circuit 120 provided in this embodiment of this application charges an energy storage capacitor in the anode energy storage circuit 122 through the emission power supply E, there are two loops: a loop 1: the emission power supply E, the anode addressing switch element Q2, the anode energy storage element C, and the ground jointly form a charging loop; and a loop 2: the emission power supply E, the anode addressing switch element Q2, the laser LDxy, the parallel parasitic capacitor of the cathode switch element Q5, and the ground jointly form a charging loop. Because a capacitance value of the energy storage capacitor is much greater than a capacitance value of the parallel parasitic capacitor, a current output by the emission power supply E is mainly used to charge the energy storage capacitor, and a current on the parallel parasitic capacitor is small, which can reduce light leakage and false light emission of the laser caused by the parallel parasitic capacitor.

To further reduce light leakage and false light emission of the laser caused by the parallel parasitic capacitor, in the anode addressing drive circuit 120 provided in this embodiment of this application, a current limiting element R is provided in the anode energy storage circuit 122 to limit a current for charging the anode energy storage element C by the emission power supply E when the anode addressing drive circuit 121 is turned on, and further reduce a current value of the parallel parasitic capacitor in the loop 2 when the anode energy storage element C is charged, so that a current on the parallel parasitic capacitor when the anode energy storage element C is charged is less than the light emission current threshold of the laser, so that the false light emission does not occur in the laser at the charging stage of the anode energy storage element C.

It can be understood that the greater the resistance of the current limiting element R, the stronger the current limiting capability of the current limiting element R, and the greater the voltage drop across two ends of the current limiting element R. In this application, specific resistance of the current limiting element R is not limited, and can be properly set based on an actual need.

In an embodiment of the present disclosure, the laser may be a laser diode, and a specific process of selecting a laser (denoted as LDxy) in an $x^{th}$ row and a $y^{th}$ column in the two-dimensional laser array to emit light is as follows.

At the first stage, the anode addressing switch element Q2 in the $x^{th}$ row is turned on under the control of the anode addressing signal, the cathode addressing switch element Q5 in the $y^{th}$ column is turned off under the control of the cathode addressing signal, and the anode energy storage element C enters the charging stage.

Theoretically, only the loop 1 is formed at this stage: emission power supply—anode addressing switch element Q2—current limiting element R—anode energy storage element C—anode ground; however, because the cathode addressing switch element Q5 includes the parasitic capacitor, and the parasitic capacitor and the cathode addressing switch element Q5 are connected in parallel, in fact, at this stage, in addition to the loop 1, a loop 2 is also formed: emission power supply E—anode addressing switch element Q2—current limiting element—laser LDxy—parasitic capacitor of the cathode addressing switch element Q5—cathode ground.

In this embodiment, because the current limiting element R limits a current for charging the anode energy storage element C by the emission power supply E, when the anode energy storage element C is charged, a current flowing through the laser LDxy via the parasitic capacitor of the cathode addressing switch element Q5 is less than the light emission current threshold of the laser LDxy, and false light emission caused by the parallel parasitic capacitor does not occur in the laser LDxy at the charging stage of the anode energy storage element C.

At the second stage, the cathode addressing switch element Q5 in the $y^{th}$ column is turned on under the control of the cathode addressing signal, and the anode energy storage element C enters an energy release stage. The anode energy storage element C, the laser LDxy, the cathode addressing switch element Q5, and the cathode ground form a loop (5), and the anode energy storage element C is discharged through the loop (5) to drive LDxy to emit light.

At this stage, the parasitic capacitor of the cathode addressing switch element Q5 is discharged through the cathode ground.

The second aspect is intended to solve problems that isolation of the cathode addressing switch circuit 121 is reduced and a laser unselected for light emission emits light because of the crosstalk of electrical signals of a laser selected for light emission, because the cathode addressing switch element Q5 includes the parasitic capacitor.

Figure 9:
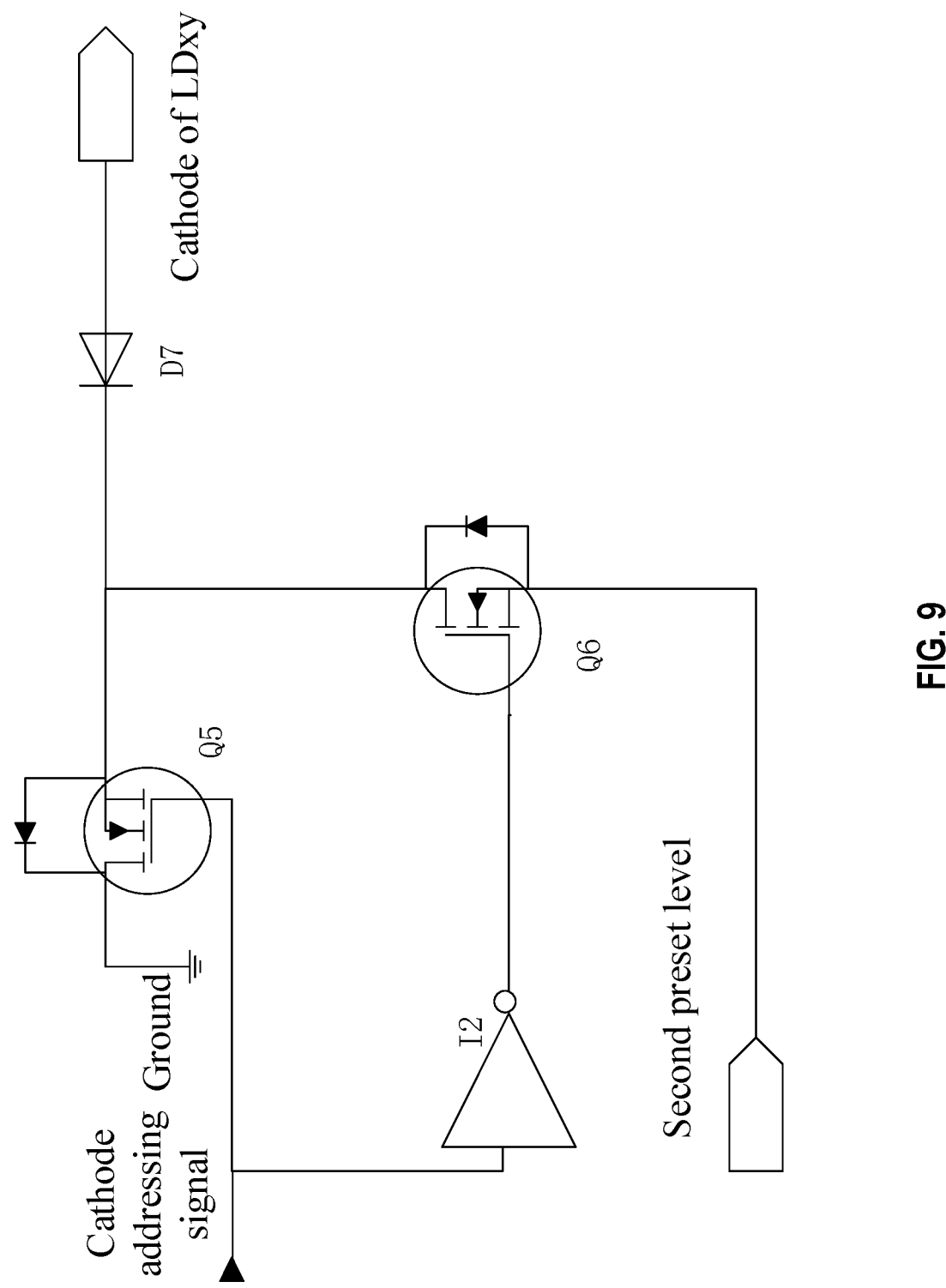
FIG. 9 is a schematic structural diagram of another cathode addressing switch circuit according to some embodiments of this application.

Referring to FIG. 8 and FIG. 9, in another exemplary solution, a cathode addressing switch circuit 221 provided in this embodiment of this application further includes a cathode unidirectional conducting element and a cathode reverse-biased switch element Q6, the cathode unidirectional conducting element is connected between a cathode of a laser and a cathode addressing switch element Q5, a first end of the cathode unidirectional conducting element is connected to the cathode of the laser, a second end of the cathode unidirectional conducting element is connected to a second end of the cathode addressing switch element Q5, and a first end of the cathode addressing switch element Q5 is connected to the cathode ground. The cathode reverse-biased switch element Q6 includes a first end, a second end, and a cathode reverse-biased enabling end. The first end is connected to the second end of the cathode unidirectional conducting element, and the second end receives a second preset voltage, and the cathode reverse-biased enabling end receives a cathode reverse-biased control signal. The cathode reverse-biased control signal is used to turn off the cathode reverse-biased switch element Q6 when the cathode addressing switch element Q5 is turned on through the cathode addressing signal, and the second end of the cathode unidirectional conducting element is connected to the cathode ground through the cathode addressing switch element Q5, so that the cathode unidirectional conducting element is in the forward conduction state. The cathode reverse-biased control signal is also used to turn on the cathode reverse-biased switch element Q6 when the cathode addressing switch element Q5 is turned off through the cathode addressing signal, the second end of the cathode unidirectional conducting element receives the second preset voltage through the cathode reverse-biased switch element Q6, and a voltage value of the second preset voltage is greater than or equal to a voltage value of the cathode ground, so that the cathode unidirectional conducting element is in a reverse-biased state and the current is prevented from flowing through the cathode addressing switch element Q5, thereby improving the isolation of the cathode addressing switch circuit 221.

The cathode reverse-biased control signal and the cathode addressing signal are in reverse states. Specifically, when the cathode addressing signal is at a high level, the cathode reverse-biased control signal is at a low level; or when the cathode addressing signal is at a low level, the cathode reverse-biased control signal is at a high level.

In some embodiments, the second preset voltage received by the second end of the cathode unidirectional conducting element is equal to an anode drive level. Specifically, the second end of the cathode unidirectional conducting element is connected to the first end of the anode addressing switch element Q2, and the anode drive level is a voltage output by the emission power supply E to the anode addressing switch element Q2, that is, the voltage of the emission power supply E.

In this embodiment, when the laser LDxy is selected for light emission, at an energy release stage of the anode energy storage element C, the cathode addressing switch element Q5 is turned on under the enablement of the cathode addressing signal, and the cathode unidirectional conducting element is in the forward conduction state. The anode energy storage element C, the laser LDxy, the cathode unidirectional conducting element, the cathode addressing switch element Q5, and the cathode ground form an energy release loop, and the anode energy storage element C outputs a current to the laser LDxy through energy stored in the anode energy storage element C, to drive the laser LDxy to emit light. When the laser LDxy is stopped from emitting light, the cathode addressing switch element Q5 is turned off under the control of the cathode addressing signal, and the cathode reverse-biased switch element Q6 is turned on under the enablement of the cathode reverse-biased control signal, so that the cathode unidirectional conducting element is in the reverse-biased state, to prevent the current from flowing through the cathode addressing switch element Q2, and ensure that the laser LDxy stopped from emitting light does not experience crosstalk caused by an electrical signal of another laser selected for light emission, thereby improving isolation of the cathode addressing switch circuit 221.

In some embodiments, referring to FIG. 8, the cathode unidirectional conducting element is a seventh NMOS transistor Q7, the cathode reverse-biased switch element Q6 is the sixth NMOS transistor, a drain of the seventh NMOS transistor Q7 serves as a first end of the cathode unidirectional conducting element to be connected to a cathode of a laser, and a source of the seventh NMOS transistor Q7 serves as a second end of the cathode unidirectional conducting element to be connected to a second end of the cathode addressing switch element Q5 and a first end of the sixth NMOS transistor. A gate of the seventh NMOS transistor Q7 is connected to a cathode addressing enabling end of the cathode addressing switch element Q5. When the laser LDxy is selected for light emission, at an energy release stage of the anode energy storage element C, the cathode addressing switch element Q5 and the seventh NMOS transistor Q7 are turned on under the enablement of the cathode addressing signal, the source of the seventh NMOS transistor Q7 is connected to the cathode ground through the cathode addressing switch element Q5, and the seventh NMOS transistor Q7 is in the forward conduction state. Because voltage drops of the cathode addressing switch element Q5 and the seventh NMOS transistor Q7 in the turn-on state are small, a drain voltage of the seventh NMOS transistor Q7 is close to a voltage value of the cathode ground. When the laser LDxy is stopped from emitting light, the cathode addressing switch element Q5 and the seventh NMOS transistor Q7 are turned off under the control of the cathode addressing signal, the sixth NMOS transistor is turned on under the enablement of the cathode reverse-biased control signal, the source of the seventh NMOS transistor Q7 receives the second preset voltage through the sixth NMOS transistor, the voltage value of the second preset voltage is greater than or equal to the voltage value of the cathode ground, and the seventh NMOS transistor Q7 is switched to the reverse-biased state.

Specifically, when the fifth NMOS transistor Q5 and the seventh NMOS transistor Q7 are turned on under the enablement of the cathode addressing signal, the cathode addressing signal is at a high level greater than the voltage value of the cathode ground; or when the fifth NMOS transistor Q5 and the seventh NMOS transistor Q7 are turned off under the control of the cathode addressing signal, the cathode addressing signal is at a low level lower than or equal to the voltage value of the cathode ground.

Figure 10:
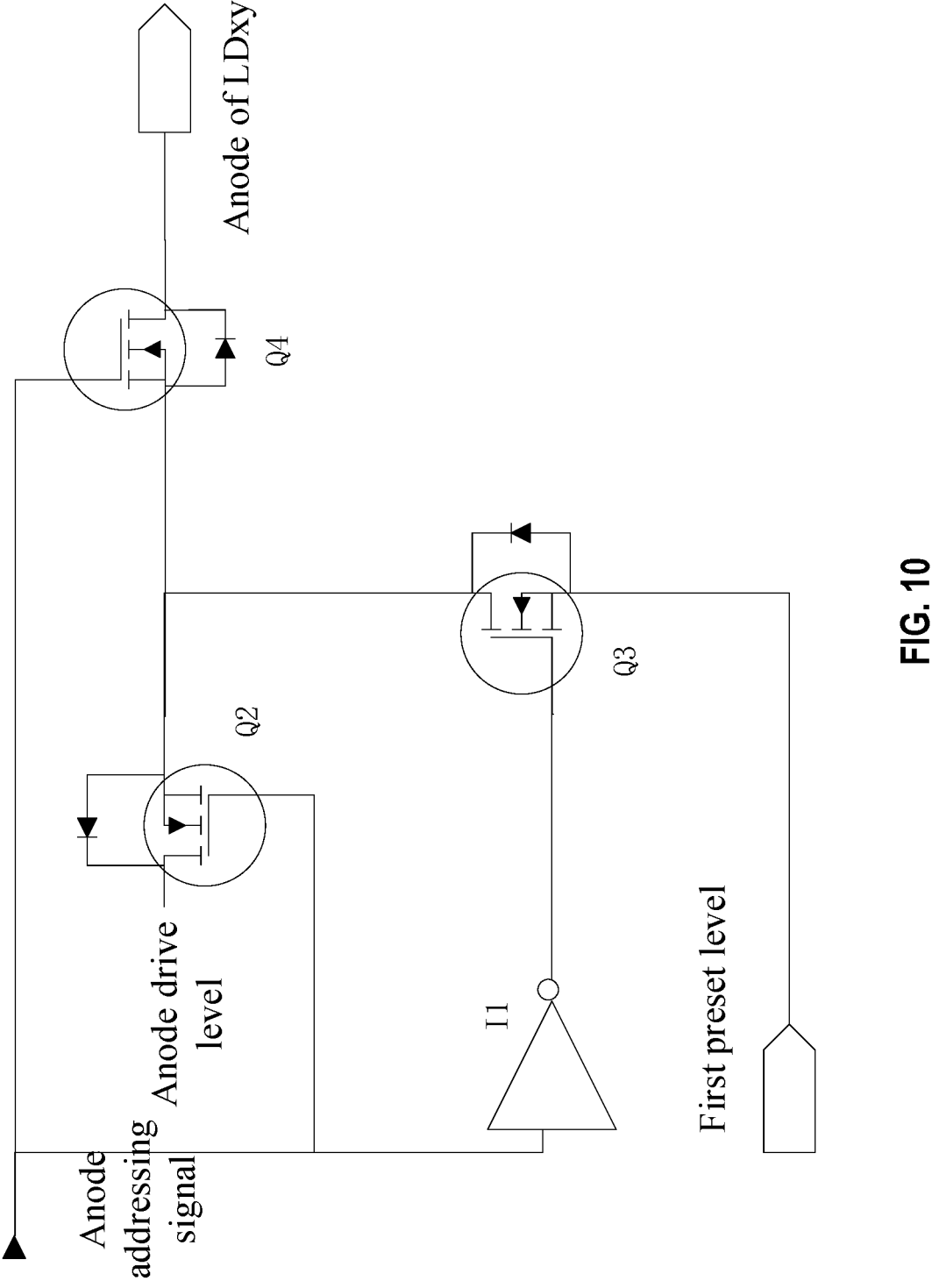
FIG. 10 is a schematic structural diagram of an anode addressing switch circuit according to some embodiments of this application.

Referring to FIG. 10, in another exemplary solution, the cathode unidirectional conducting element is a seventh diode D7, the cathode reverse-biased switch element Q6 is the sixth NMOS transistor, an anode of the seventh diode D7 is connected to a cathode of a laser, and a cathode of the seventh diode D7 is connected to the second end of the cathode addressing switch element Q5 and the first end of the sixth NMOS transistor. When the laser LDxy is selected for light emission, at an energy release stage of the anode energy storage element C, the cathode addressing switch element Q5 is turned on under the enablement of the cathode addressing signal, the cathode of the seventh diode D7 is connected to the cathode ground through the cathode addressing switch element Q5, and the seventh diode D7 is in the forward conduction state. Because voltage drops of the cathode addressing switch element Q5 and the seventh diode D7 in the turn-on state are small, an anode voltage of the seventh diode D7 is close to a voltage value of the cathode ground. When the laser LDxy is stopped from emitting light, the cathode addressing switch element Q5 is turned off under the control of the cathode addressing signal, the cathode reverse-biased switch element Q6 is turned on under the enablement of the cathode reverse-biased control signal, the cathode of the seventh diode D7 receives the second preset voltage through the cathode reverse-biased switch element Q6, and in this case, the cathode voltage of the seventh diode D7 is greater than or equal to the anode voltage, and the seventh diode D7 is switched to the reverse-biased state.

Specifically, when the cathode addressing switch element Q5 is turned on under the enablement of the cathode addressing signal, the cathode addressing signal is at a high level greater than the voltage value of the cathode ground; or when the cathode addressing switch element Q5 is turned off under the control of the cathode addressing signal, the cathode addressing signal is at a low level lower than or equal to the voltage value of the cathode ground.

In some embodiments, the cathode addressing switch circuit 221 further includes a cathode phase inverter I2, an input end of the cathode phase inverter I2 is connected to the cathode addressing enabling end of the cathode addressing switch element Q5, and an output end of the cathode phase inverter I2 is connected to the cathode reverse-biased enabling end of the cathode reverse-biased switch element Q7, so that the cathode reverse-biased switch element Q7 and the cathode addressing switch element Q5 are in reverse states.

In some other embodiments, an input end of the cathode phase inverter I2 is connected to the cathode reverse-biased enabling end of the cathode reverse-biased switch element Q7, and the output end of the cathode phase inverter I2 is connected to the cathode addressing enabling end of the cathode addressing switch element Q5. In this case, the cathode reverse-biased switch element Q7 and the cathode addressing switch element Q5 can be in reverse states.

The addressable drive circuit provided in this embodiment of this application includes multiple anode addressing drive circuits 120 that are in one-to-one correspondence with multiple shared anode ends in the two-dimensional laser array, each anode addressing drive circuit is configured to drive anode addressing of a laser connected to the shared anode end, the multiple cathode addressing drive circuits 220 are in one-to-one correspondence with multiple shared cathode ends in the two-dimensional laser array, and each cathode addressing drive circuit is configured to drive cathode addressing of a laser connected to the shared cathode end. The anode addressing drive circuit 120 includes an anode addressing switch circuit 121 and an anode energy storage circuit 122; the anode energy storage circuit 122 includes an anode energy storage element C and a current limiting element, the anode energy storage element C is configured to be charged through an output current of the emission power supply E when the anode addressing switch circuit 121 is turned on, and the current limiting element is configured to limit a current for charging the anode energy storage element C, so that a current flowing through the laser is less than a light emission current threshold of the laser when the anode energy storage element C is in the charging stage, thereby avoiding false light emission of the laser, which is a result of light leakage caused by the parallel parasitic capacitor included in the cathode addressing switch element Q5 at a charging stage of the anode energy storage element C, and improving light emission control accuracy of the two-dimensional laser array.

An embodiment of this application further provides a laser emission circuit, including a laser array and the foregoing addressable drive circuit. The laser array includes multiple lasers. Multiple lasers are arranged in two dimensions, that is, the laser array is the two-dimensional laser array. Anodes of lasers in the same row in the laser array are electrically connected and extend to form a shared anode end, and cathodes of the lasers in the same column in the laser array are electrically connected and extend to form a shared cathode end. The addressable drive circuit includes an anode addressable drive circuit and a cathode addressable drive circuit. The anode addressable drive circuit is connected to multiple shared anode ends corresponding to the multiple rows of lasers, and an anode addressing signal is externally received, to drive anode addressing for the anodes of the multiple rows of lasers through scanning; and the cathode addressable drive circuit is connected to the multiple shared cathode ends corresponding to the multiple columns of lasers, and then a cathode addressing signal is externally received, to drive cathode addressing for the cathodes of the multiple columns of lasers in the laser array through scanning.

In this embodiment, the laser emission circuit concentrates the anode addressable drive circuit and the cathode addressable drive circuit on one side of the two-dimensional laser array, to increase reliability of the two-dimensional laser array LDm*n, for example, voltage tolerance, current flowing performance, and electrostatic protection performance.

In addition, the anode addressable drive circuit is connected to the anode of the laser in the same row through the shared anode end and connected to the cathode of the laser in the same column through the shared cathode end, so that the number of channels of the two-dimensional laser array can be reduced and a manufacturing cost of the laser emission circuit is further reduced.

In this embodiment, a process of driving addressing of the laser array by the addressable drive circuit is as follows.

In the first stage, the anode addressing switch element Q2 in a row to which the laser selected for light emission belongs is turned on under the control of the anode addressing signal, and the anode energy storage element C is charged through the output current of the emission power supply E. The cathode addressing switch element Q5 in a column to which the laser selected for light emission belongs is turned off under the control of the cathode addressing signal, more specifically, the cathode unidirectional conducting element is in the reverse-biased state, and the cathode addressing switch circuit 221 is in a reverse-biased state.

In the third stage, the cathode addressing switch element Q5 in the column to which the laser selected for light emission belongs is turned on under the control of the cathode addressing signal. More specifically, the cathode unidirectional conducting element is in the forward conduction state, the cathode addressing switch circuit 221 is in the forward conduction state, and the anode energy storage element C outputs a current to the laser selected for light emission through energy stored in the anode energy storage element C, to drive the laser to emit light.

When the current laser selected for light emission finishes emitting light, the cathode addressing switch element Q5 in the column to which the laser selected for light emission belongs is turned off under the control of the cathode addressing signal; and if the next laser selected for light emission is in the same row as the current laser selected for light emission, the anode addressing switch element Q2 in a column to which the current laser selected for light emission belongs is still turned on under the control of the anode addressing signal, and only the cathode addressing switch element Q5 in the column to which the next laser selected for light emission belongs needs to be turned on under the enablement of the cathode addressing signal.

Further, when the multiple rows of anode addressing drive circuits corresponding to the multiple lasers are turned on under the enablement of the anode addressing signal and the multiple columns of cathode addressing drive circuits corresponding to the multiple lasers are turned on under the enablement of the cathode addressing signal, the multiple lasers can emit light simultaneously.

Further, the anode addressing signal can also simultaneously drive anode switch elements corresponding to two or more shared anode ends to be turned on, the cathode addressing signal can also simultaneously drive cathode switch elements corresponding to two or more shared cathode ends to be turned on, so that two or more lasers can emit light simultaneously. The specific number of lasers that emit light simultaneously can be set by scanning the anode addressing signal and the cathode addressing signal based on an actual need.

The addressable drive circuit in a laser emission circuit provided in this embodiment of this application includes multiple anode addressing drive circuits 120 that are in one-to-one correspondence with multiple shared anode ends in the two-dimensional laser array, each anode addressing drive circuit is configured to drive anode addressing of a laser connected to the shared anode end, the multiple cathode addressing drive circuits 220 are in one-to-one correspondence with multiple shared cathode ends in the two-dimensional laser array, and each cathode addressing drive circuit is configured to drive cathode addressing of a laser connected to the shared cathode end. The anode addressing drive circuit 120 includes an anode addressing switch circuit 121 and an anode energy storage circuit 122; the anode energy storage circuit 122 includes an anode energy storage element C and a current limiting element, and the anode energy storage element C is configured to be charged through an output current of the emission power supply E when the anode addressing switch circuit 121 is turned on, and the current limiting element is configured to limit a current for charging the anode energy storage element C, so that when the anode energy storage element C is in the charging stage, a current flowing through the laser is less than a light emission current threshold of the laser, thereby avoiding false light emission of the laser, which is a result of light leakage caused by the parallel parasitic capacitor included in the cathode addressing switch element Q5 at a charging stage of the anode energy storage element C, and improving laser emission control accuracy.

An embodiment of this application also provides a LiDAR, the LiDAR includes the foregoing laser emission circuit, and the LiDAR generates a laser beam through the foregoing laser emission circuit, emits the laser beam toward a detection region, and then cooperates with a laser receiving device in the LiDAR. An echo beam reflected from a target is received by the laser receiving device, and then data is properly processed by a signal processing system, to obtain information such as distance, speed, azimuth, attitude and even shape of the target, which can be applied to navigation avoidance, obstacle recognition, ranging, speed measurement, autonomous driving and other scenarios of an automobile, a robot, a logistics vehicle, a patrol vehicle and other products.

The LiDAR provided in this embodiment of this application uses the foregoing laser emission circuit. The addressable drive circuit in a laser emission circuit includes multiple anode addressing drive circuits 120 that are in one-to-one correspondence with multiple shared anode ends in the two-dimensional laser array, each anode addressing drive circuit is configured to drive anode addressing of a laser connected to the shared anode end, the multiple cathode addressing drive circuits 220 are in one-to-one correspondence with multiple shared cathode ends in the two-dimensional laser array, and each cathode addressing drive circuit is configured to drive cathode addressing of a laser connected to the shared cathode end. The anode addressing drive circuit 120 includes an anode addressing switch circuit 121 and an anode energy storage circuit 122; the anode energy storage circuit 122 includes an anode energy storage element C and a current limiting element, and the anode energy storage element C is configured to be charged through an output current of the emission power supply E when the anode addressing switch circuit 121 is turned on, and the current limiting element R is configured to limit a current for charging the anode energy storage element C, so that when the anode energy storage element C is in the charging stage, a current flowing through the laser is less than a light emission current threshold of the laser, thereby avoiding false light emission of the laser caused by the parasitic capacitor in the cathode addressing drive circuit at a charging stage of the anode energy storage element, and improving performance of the LiDAR.

Embodiment 2

Figure 11:
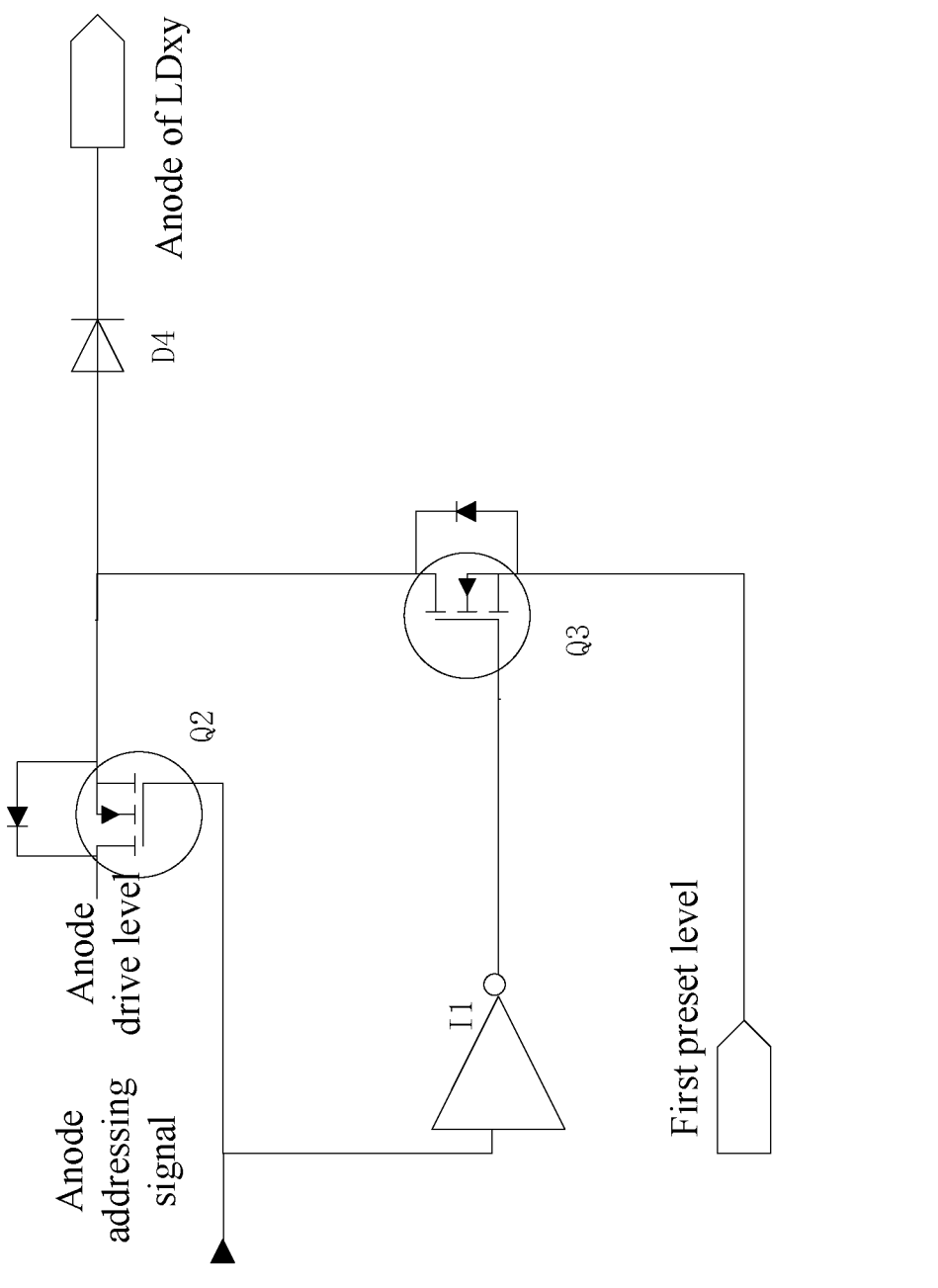
FIG. 11 is a schematic structural diagram of another anode addressing switch circuit according to some embodiments of this application.

Referring to FIG. 10 and FIG. 11, to solve problems that isolation of an anode addressing switch circuit 121 is reduced and a laser unselected for light emission emits light because of the crosstalk of electrical signals of a laser selected for light emission, because the anode addressing switch circuit 121 includes a parasitic capacitor, a difference between this embodiment and Embodiment 1 is that the anode addressing switch circuit 121 further includes an anode unidirectional conducting element and an anode reverse-biased switch element Q3, the anode unidirectional conducting element is connected between a second end of an anode addressing switch element Q2 and a current limiting element, a second end of the anode unidirectional conducting element is connected to the second end of the anode addressing switch element Q2, and a first end is connected to a first end of the current limiting element. The anode reverse-biased switch element Q3 includes a first end, a second end, and an anode reverse-biased enabling end. The first end of the anode reverse-biased switch element Q3 is connected to the second end of the unidirectional conducting element, the second end of the anode reverse-biased switch element receives a first preset level, and the anode reverse-biased enabling end receives an anode reverse-biased control signal. The anode reverse-biased control signal is used to turn off the anode reverse-biased switch element Q3 when the anode addressing switch element Q2 is turned on through the anode addressing signal, and the second end of the anode unidirectional conducting element is connected to the emission power supply E through the second cathode addressing switch element Q2, so that the anode unidirectional conducting element is in the forward conduction state. The emission power supply E, the anode addressing switch element Q2, the anode unidirectional conducting element, the anode energy storage element C, and the ground form a second charging loop. The anode energy storage element C is charged by the emission power supply E through the second charging loop. The anode reverse-biased control signal is also used to turn on the anode reverse-biased switch element Q3 when the anode addressing switch element Q2 is turned off through the anode addressing signal, and the second end of the anode unidirectional conducting element receives the first preset level through the anode reverse-biased switch element Q3, so that the anode unidirectional conducting element is in a reverse-biased state and the current is prevented from flowing through the anode addressing switch element Q2, thereby improving the isolation of the anode addressing switch circuit 121. In some embodiments, a voltage value of the first preset level is equal to that of the anode drive level; and the second end of the anode reverse-biased switch element Q3 is connected to the first end of the anode addressing switch element Q2.

In another exemplary solution, the voltage value of the first preset level is less than that of the anode drive level.

In some embodiments, the anode addressing switch element Q2 is a second NMOS transistor, and the anode reverse-biased switch element Q3 is a third NMOS transistor. The anode reverse-biased control signal and the anode addressing signal are in reverse states. When the second NMOS transistor is turned on under the control of the anode addressing signal, the third NMOS transistor is turned off under the control of the anode reverse-biased control signal, and the anode addressing switch element Q2 connects the second end of the anode unidirectional conducting element to the emission power supply E, so that the anode unidirectional conducting element is in the forward conduction state. When the second NMOS transistor is turned off under the control of the anode addressing signal, the third NMOS transistor is turned on under the control of the anode reverse-biased control signal, and the anode reverse-biased switch element Q3 enables the second end of the anode unidirectional conducting element to receive the first preset level, so that the anode unidirectional conducting element is in the forward reverse-biased state.

Specifically, the anode addressing switch circuit 121 further includes the anode phase inverter I1, an input end of the anode phase inverter I1 is connected to the anode addressing enabling end of the second NMOS transistor, and the output end of the anode phase inverter I1 is connected to the anode reverse-biased enabling end of the third NMOS transistor, so that the third NMOS transistor and the second NMOS transistor are in reverse states.

In some other embodiments, an input end of the anode phase inverter I1 is connected to the anode reverse-biased enabling end of the third NMOS transistor, an output end of the anode phase inverter I1 is connected to the anode addressing enabling end of the second NMOS transistor, and in this case, the third NMOS transistor and the second NMOS transistor can be in reverse states.

Specifically, when the anode addressing signal is at a high level, the anode reverse-biased control signal is at a low level, the second NMOS transistor is turned on, and the third NMOS transistor is turned off; or when the anode addressing signal is at a low level, the anode reverse-biased control signal is at a high level, the second NMOS transistor is turned off, and the third NMOS transistor is turned on. In this embodiment, when the laser LDxy is selected for light emission, at a charging stage of the anode energy storage element C, the anode addressing switch element Q2 is turned on under the enablement of the anode addressing signal, and the anode unidirectional conducting element is in the forward conduction state. The emission power supply E, the anode addressing switch element Q2, the anode unidirectional conducting element, the anode energy storage element C, and the ground form a second charging loop, the anode energy storage element C is charged through an output current of the emission power supply E, and the anode energy storage element C outputs a current through energy stored in the anode energy storage element C, to drive the laser LDxy to emit light. When the laser LDxy is stopped from emitting light, the anode addressing switch element Q2 is turned off under the control of the anode addressing signal, and the anode reverse-biased switch element Q3 is turned on under the enablement of the anode reverse-biased control signal, so that the anode unidirectional conducting element is in the reverse-biased state, to prevent the current from flowing through the anode addressing switch element Q2, and ensure that the laser LDxy stopped from emitting light does not experience crosstalk caused by an electrical signal of another laser selected for light emission.

Referring to FIG. 10, in an exemplary solution in this embodiment, the anode unidirectional conducting element is a fourth NMOS transistor, the reverse-biased switch element Q3 is a third NMOS transistor, a source of the fourth NMOS transistor is connected to a source of the second NMOS transistor and a drain of the third NMOS transistor, a drain of the fourth NMOS transistor is connected to a first end of the current limiting element, a gate of the fourth NMOS transistor is connected to a gate (namely, the anode addressing enabling end) of the second NMOS transistor, a source of the third NMOS transistor receives a first preset level, and a gate (namely, the anode reverse-biased enabling end) of the third NMOS transistor is connected to the gate (namely, the anode addressing enabling end) of the second NMOS transistor through the anode phase inverter I1. When the laser LDxy is selected for light emission, at a charging stage of the anode energy storage element C, the anode addressing switch element Q2 and the fourth NMOS transistor are turned on under the enablement of the anode addressing signal, the source of the fourth NMOS transistor is connected to the emission power supply E through the second NMOS transistor, and the fourth NMOS transistor is in the forward conduction state. When the laser LDxy is stopped from emitting light, the second NMOS transistor and the fourth NMOS transistor are turned off under the control of the anode addressing signal, the third NMOS transistor is turned on under the enablement of the anode reverse-biased control signal, the source of the fourth NMOS transistor receives the first preset level through the third NMOS transistor, and the fourth NMOS transistor is in the reverse-biased state.

Further, when the second NMOS transistor and the fourth NMOS transistor are turned on under the enablement of the anode addressing signal, the anode addressing signal is at a high level greater than an anode drive level; or when the second NMOS transistor and the fourth NMOS transistor are turned off through the anode addressing signal, the anode addressing signal is at a low level lower than or equal to the anode drive level.

Referring to FIG. 11, in another exemplary solution in this embodiment, the anode unidirectional conducting element is a fourth diode D4, the anode reverse-biased switch element Q3 is a third NMOS transistor, an anode of the fourth diode D4 is connected to a source of the second NMOS transistor and a drain of the third NMOS transistor, a cathode is connected to the first end of the current limiting element R, a source of the third NMOS transistor receives a first preset level, a gate (namely, the anode reverse-biased enabling end) of the third NMOS transistor is connected to the gate (namely, the anode addressing enabling end) of the second NMOS transistor through the anode phase inverter I1. When the laser LDxy is selected for light emission, at a charging stage of the anode energy storage element C, the second NMOS transistor is turned on under the enablement of the anode addressing signal, the anode of the fourth diode D4 is connected to the emission power supply E through the second NMOS transistor, and the fourth diode D4 is in the forward conduction state. When the laser LDxy is stopped from emitting light, the second NMOS transistor is turned off under the control of the anode addressing signal, the third NMOS transistor is turned on under the enablement of the anode reverse-biased control signal, the anode of the fourth diode D4 receives the first preset level through the third NMOS transistor, and the fourth diode D4 is in the reverse-biased state.

In the anode addressing switch circuit 121 provided in this embodiment of this application, when the anode addressing switch element Q2 is turned off, the anode unidirectional conducting element is in a reverse-biased state, a current is prevented from flowing through the anode addressing switch element Q2, thereby improving isolation of the anode addressing switch circuit 121 and reducing crosstalk of electrical signals from a laser selected for light emission onto a laser LDxy stopped from emitting light.

Embodiment 3

A difference between this embodiment and Embodiment 2 is that the anode addressing switch element Q2 is a second PMOS transistor, a drain of the second PMOS transistor serves as the first end of the anode addressing switch element Q2 to be connected to the emission power supply E, a source of the second PMOS transistor serves as the second end of the anode addressing switch element Q2 to be connected to the anode energy storage circuit 122, and a gate of the second PMOS transistor serves as the addressing enabling end of the anode addressing switch element Q2 to receive the anode addressing signal. The second PMOS transistor is turned on or off under the control of the anode addressing signal.

A voltage condition $V_{GS}$ when the anode addressing signal drives the second PMOS transistor to be turned on is opposite to a voltage condition $V_{GS}$ when the anode addressing signal drives the second NMOS transistor to be turned on, where $V_{GS}=V_G-V_S$, $V_G$ is a gate voltage of the MOS transistor (the second NMOS transistor or the second PMOS transistor), and $V_S$ is a source voltage of the MOS transistor (the second NMOS transistor or the second PMOS transistor). For example, a condition for turning on the second NMOS transistor is that $V_{GS}$ of the second NMOS transistor is greater than or equal to $V_{th}$. In this case, the anode addressing signal is at a high level when the second NMOS transistor is turned on, and the anode addressing signal is at a low level when the second NMOS transistor is turned off. A condition for turning on the second PMOS transistor is that $V_{GS}$ of the second PMOS transistor is less than or equal to $V_{th}$. In this case, the anode addressing signal is at a low level when the second PMOS transistor is turned on, and the anode addressing signal is at a high level when the second PMOS transistor is turned off.

In an exemplary solution, the anode reverse-biased switch element Q3 is a third NMOS transistor, the anode unidirectional conducting element is a fourth NMOS transistor, a drain of the second PMOS transistor serves as the first end of the anode addressing switch element Q2 to be connected to the emission power supply, a source of the second PMOS transistor serves as the second end of the anode addressing switch element Q2 to be connected to the source of the fourth NMOS transistor and a drain of the third NMOS transistor, a gate of the second PMOS transistor is connected to a gate of the fourth NMOS transistor through the second anode phase inverter, a source of the third NMOS transistor receives a first preset level, and a gate of the third NMOS transistor is connected to a gate of the second PMOS transistor. When the laser LDxy is selected for light emission, at a charging stage of the anode energy storage element C, the second PMOS transistor is turned on under the enablement of the anode addressing signal, the fourth NMOS transistor is turned on under the control of the phase-inverted anode addressing signal, the third NMOS transistor is turned off under the control of the anode reverse-biased control signal, the source of the fourth NMOS transistor is connected to the emission power supply E through the second PMOS transistor, and the fourth NMOS transistor is in the forward conduction state. When the laser LDxy is stopped from emitting light, the second PMOS transistor is turned off under the control of the anode addressing signal, the third NMOS transistor is turned on under the enablement of the anode reverse-biased control signal, the source of the fourth NMOS transistor receives the first preset level through the third NMOS transistor, and the fourth NMOS transistor is in the reverse-biased state.

In an exemplary solution, when the second PMOS transistor is turned on under the enablement of the anode addressing signal, the anode addressing signal is at a low level lower than an anode drive level; or when the second PMOS transistor is turned off under the control of the anode addressing signal, the anode addressing signal is at a high level higher than the anode drive level.

In this embodiment, a gate of the third NMOS transistor is connected to a gate of the second PMOS transistor, so that the third NMOS transistor and the second PMOS transistor are in reverse states.

In this embodiment, the anode addressing switch circuit 121 further includes a second anode phase inverter, an input end of the second anode phase inverter is connected to a gate of the second PMOS transistor, and an output end of the second anode phase inverter is connected to the gate of the fourth NMOS transistor, so that the fourth NMOS transistor and the second PMOS transistor are in the same state.

In some other embodiments, the input end of the second anode phase inverter is connected to a gate of the fourth NMOS transistor, the output end of the second anode phase inverter is connected to the gate of the second PMOS transistor, and therefore, the fourth NMOS transistor and the second PMOS transistor are in the same state.

When the anode addressing signal and the anode reverse-biased control signal are both at the low level, the second PMOS transistor is turned on under the control of the anode addressing signal, the fourth NMOS transistor is turned on under the control of a phase-inverted anode addressing signal (high level), the third NMOS transistor is turned off under the control of the anode reverse-biased control signal, and the source of the fourth NMOS transistor is connected to the emission power supply E through the second PMOS transistor, so that the fourth NMOS transistor is in the forward conduction state. When the anode addressing signal and the anode reverse-biased control signal are both at the high level, the second PMOS transistor is turned off under the control of the anode addressing signal, the third NMOS transistor is turned on under the control of the anode reverse-biased control signal, and the third NMOS transistor enables the source of the fourth NMOS transistor to receive the first preset level, so that the fourth NMOS transistor is in the reverse-biased state.

In another exemplary solution in this embodiment, the anode addressing switch element Q2 is a second PMOS transistor, the anode reverse-biased switch element Q3 is a third NMOS transistor, the anode unidirectional conducting element is a fourth diode D4, a drain of the second PMOS transistor serves as the first end of the anode addressing switch element Q2 to be connected to the emission power supply, a source of the second PMOS transistor serves as the second end of the anode addressing switch element Q2 to be connected to the anode of the fourth diode D4 and a drain of the third NMOS transistor, and a gate of the second PMOS transistor receives the anode addressing signal, a source of the third NMOS transistor receives a first preset level, a gate of the third NMOS transistor is connected to a gate of the second PMOS transistor. When the laser LDxy is selected for light emission, at a charging stage of the anode energy storage element C, the second PMOS transistor is turned on under the enablement of the anode addressing signal, the third NMOS transistor is turned off under the control of the anode reverse-biased control signal, the anode of the fourth diode D4 is connected to the emission power supply E through the second PMOS transistor, and the fourth diode D4 is in the forward conduction state. When the laser LDxy is stopped from emitting light, the second PMOS transistor is turned off under the control of the anode addressing signal, the third NMOS transistor is turned on under the enablement of the anode reverse-biased control signal, the anode of the fourth diode D4 receives the first preset level through the third NMOS transistor, and the fourth diode D4 is in the reverse-biased state.

In an exemplary solution, when the second PMOS transistor is turned on under the enablement of the anode addressing signal, the anode addressing signal is at a low level lower than an anode drive level; or when the second PMOS transistor is turned off under the control of the anode addressing signal, the anode addressing signal is at a high level higher than the anode drive level.

When the anode addressing signal and the anode reverse-biased control signal are both at the low level, the second PMOS transistor is turned on under the control of the anode addressing signal, the third NMOS transistor is turned off under the control of the anode reverse-biased control signal, and an anode of the fourth diode D4 is connected to the emission power supply E through the second PMOS transistor, so that the fourth diode D4 is in the forward conduction state. When the anode addressing signal and the anode reverse-biased control signal are both at the high level, the second PMOS transistor is turned off under the control of the anode addressing signal, the third NMOS transistor is turned on under the control of the anode reverse-biased control signal, and the third NMOS transistor enables the anode of the fourth diode D4 to receive the first preset level, so that the fourth diode D4 is in the reverse-biased state.

In the anode addressing switch circuit 121 provided in this embodiment of this application, when the anode addressing switch element Q2 is turned off, the anode unidirectional conducting element is in a reverse-biased state, a current is prevented from flowing through the anode addressing switch element Q2, thereby improving isolation of the anode addressing switch circuit 121 and avoiding crosstalk of electrical signals from a laser selected for light emission onto a laser LDxy stopped from emitting light.

Embodiment 4

Figure 12:
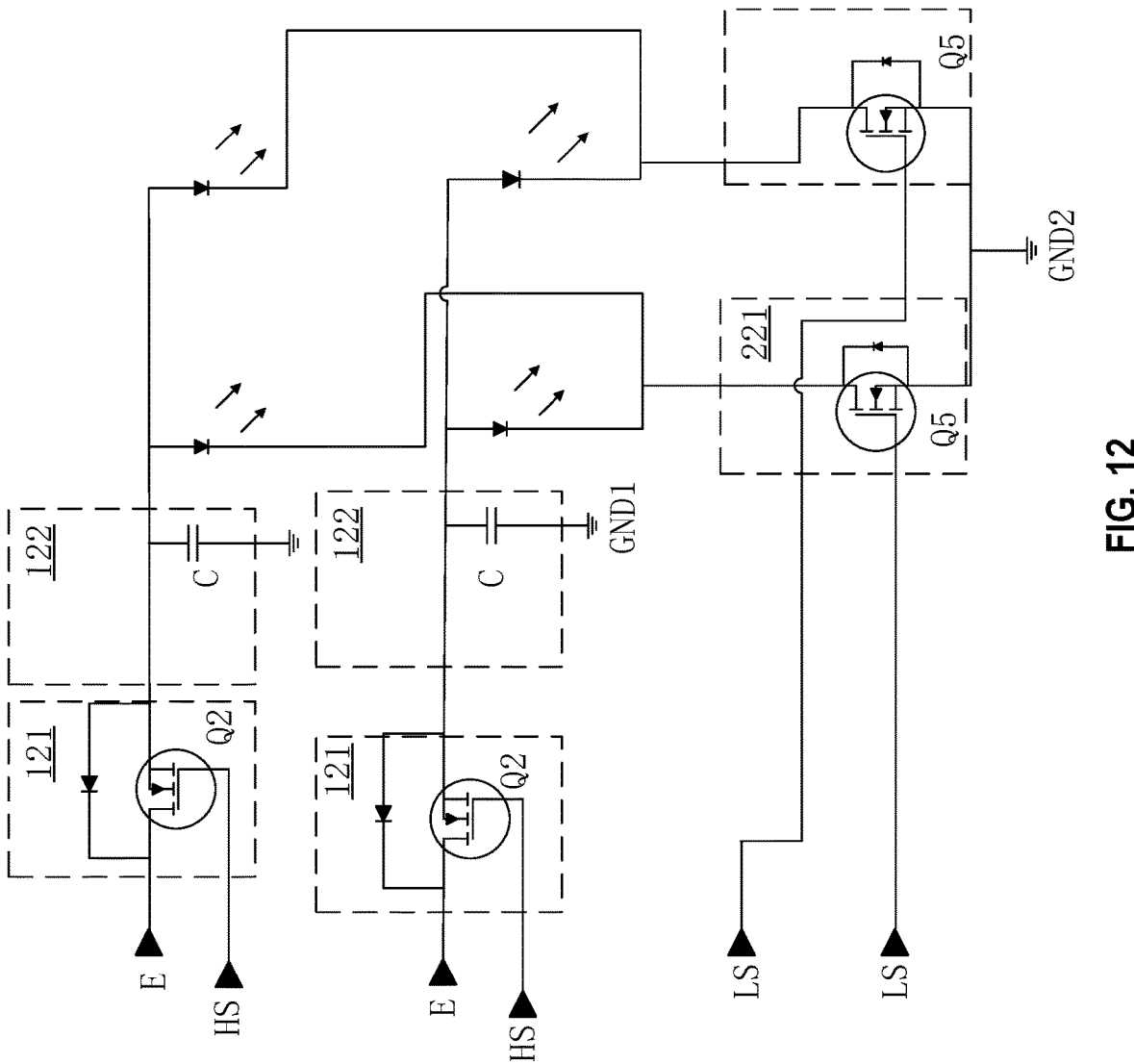
FIG. 12 is a schematic structural diagram of an anode addressing drive circuit according to some embodiments of this application.

As shown in FIG. 12, a difference between this embodiment and Embodiment 1 or Embodiment 2 is as follows. The anode energy storage circuit 122 does not include a current limiting element R, and when the emission power supply E charges the anode energy storage element, a current passing through the parallel parasitic capacitor in the cathode switch element is less than the light emission current threshold of the laser.

In this embodiment, there is also the following technical problem in the related art. The current output by the emission power supply E to the laser selected for light emission remains unchanged, and as a result, light emission power of the laser selected for light emission remains unchanged, that is, the light emission power of the laser cannot be adjusted. To solve the problem that the light emission power of the laser cannot be adjusted, referring to FIG. 13, the anode addressable drive circuit 100 provided in this embodiment of this application includes an energy storage-adjustable charging circuit 110. An energy storage-adjustable charging circuit 110 is connected to an emission power supply E and multiple anode addressing drive circuits 120, electric energy is stored through the output current of the emission power supply E, and a charging current with an adjustable value is output to the anode addressing drive circuit 120 in the turn-on state.

In this embodiment, in the anode addressable drive circuit 100, a charging current with an adjustable value is output to the anode addressing drive circuit 120 in the turn-on state through the energy storage-adjustable charging circuit 110, so that a value of the current output by the anode addressing drive circuit 120 to the laser can be adjusted, and the light emission power of the laser can be adjusted.

Figure 13:
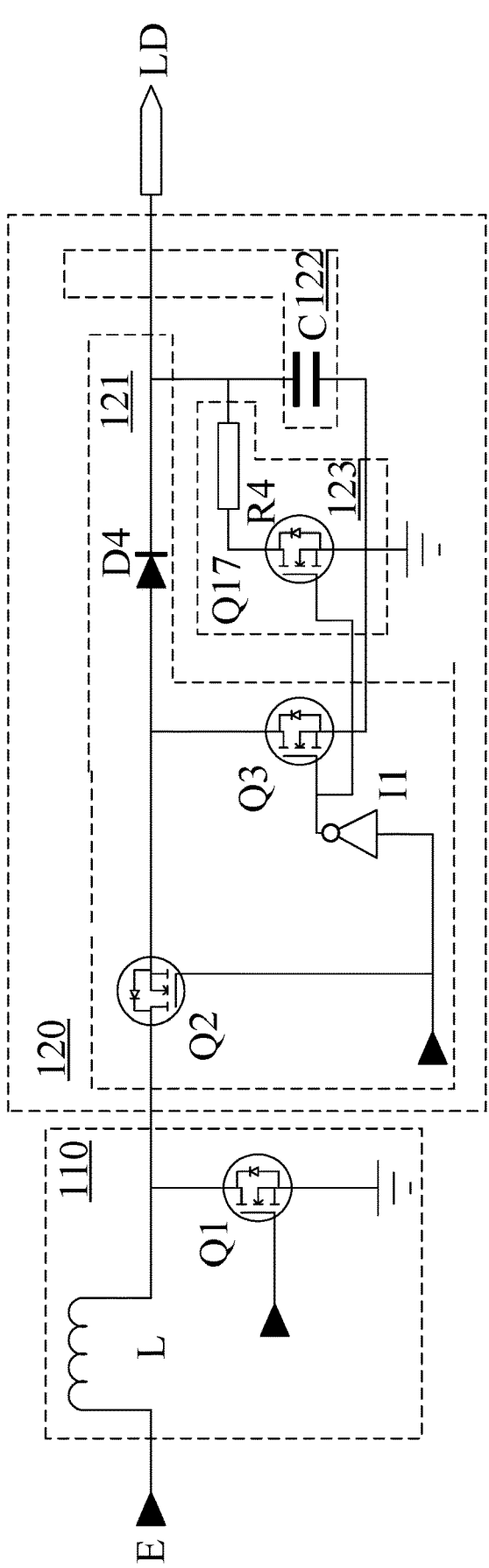
FIG. 13 is a schematic structural diagram of another anode addressable drive circuit according to some embodiments of this application.
Figure 14:
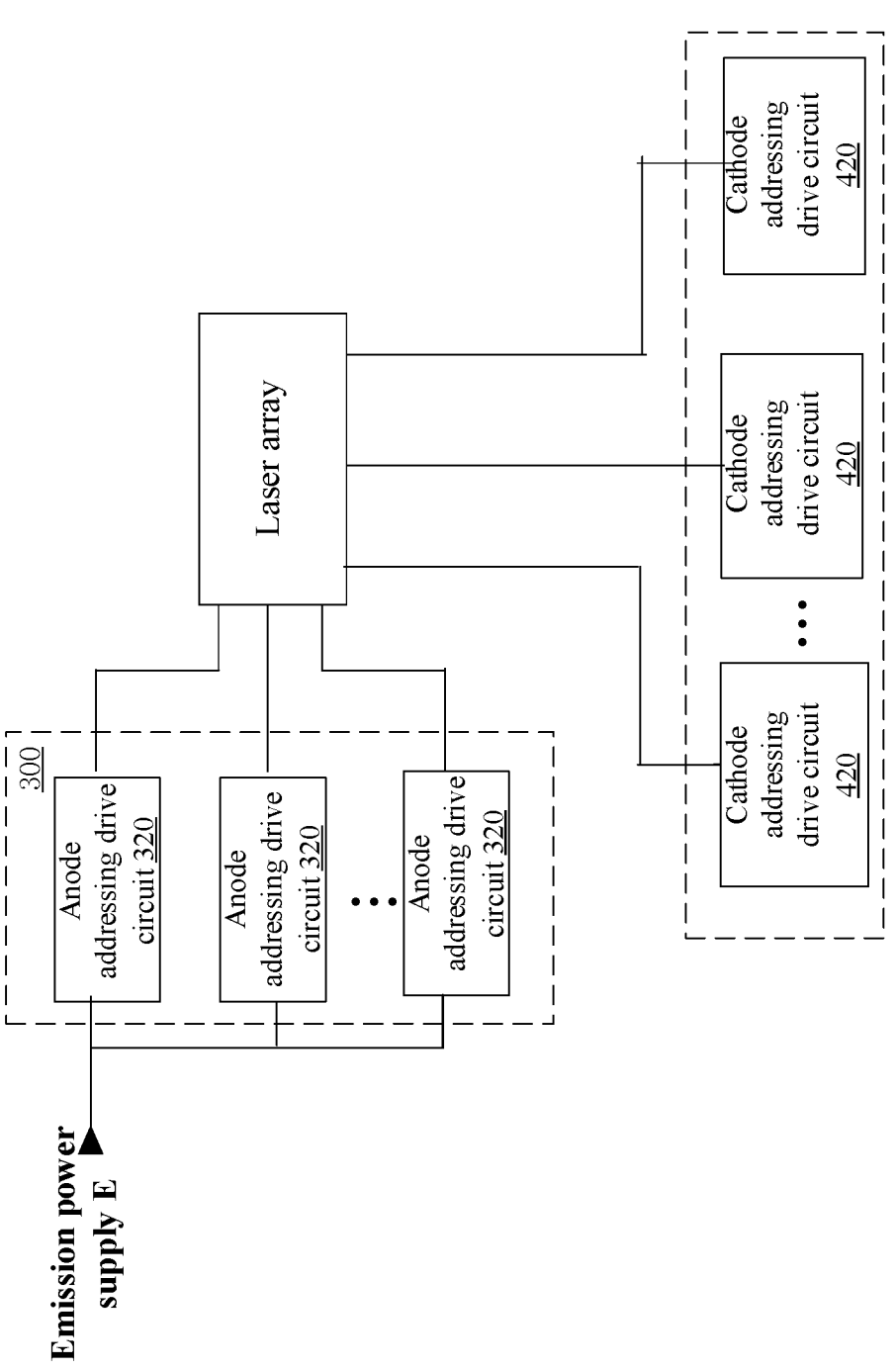
FIG. 14 is a schematic diagram of a framework of a laser emission circuit according to some embodiments of this application.

As shown in FIG. 13, in an exemplary solution, the energy storage-adjustable charging circuit 110 includes a transitory energy storage element L and a charging switch element Q1, and the charging switch element Q1 includes a first end, a second end, and a charging enabling end. A first end is connected to the emission power supply E, a second end is connected to a first end of the charging switch element Q1, and a second end of the charging switch element Q1 is grounded. The charging enabling end of the charging switch element Q1 receives a charging control signal, and the charging control signal is used to turn on or off the charging switch element Q1. When the charging switch element Q1 is turned on, the emission power supply E, the transitory energy storage element L, the charging switch element Q1, and the ground form a first charging loop, the transitory energy storage element L stores electric energy through the output current of the emission power supply E, and when the charging switch element Q1 is turned off, the transitory energy storage element L stops storing electric energy.

Further, the second end of the transitory energy storage element L is also connected to the anode addressing drive circuit 120, to transmit the stored energy to the anode addressing drive circuit 120, and the anode addressing drive circuit 120 outputs a current to drive the laser LDxy to emit light.

In some embodiments, the output current of the emission power supply E is a fixed value, and turn-on time of the charging switch element Q1 controlled by the charging control signal is adjustable, so that an amount of energy stored in the transitory energy storage element L is adjustable. When the turn-on time of the charging switch element Q1 is prolonged, the energy stored in the transitory energy storage element L is increased; or when the turn-on time of the charging switch element Q1 is shortened, the energy stored in the transitory energy storage element L is decreased.

In another exemplary solution, the value of the output current of the emission power supply E is adjustable, and turn-on time of the charging switch element Q1 controlled by the charging control signal remains unchanged, so that the amount of energy stored in the transitory energy storage element L is adjustable. When the output current of the emission power supply E increases, the amount of energy stored in the transitory energy storage element L increases; or when the output current of the emission power supply E decreases, the amount of energy stored in the transitory energy storage element L decreases.

In this embodiment, the amount of energy stored in the transitory energy storage element L is adjustable, to output a charging current with an adjustable value to the anode addressing drive circuit 120 in the turn-on state, so that a value of the current output by the anode addressing drive circuit 120 to the laser is adjustable, and the light emission power of the laser is adjustable.

Specifically, the transitory energy storage element L is configured to store energy, and also configured to release the stored energy.

In some embodiments, the transitory energy storage element L includes an energy storage inductor, and the energy storage inductor can convert electrical energy into magnetic energy for storage.

In some other exemplary solutions, the transitory energy storage element L includes an energy storage capacitor, and the energy storage capacitor is formed by sandwiching a layer of insulating dielectric between two metal electrodes. When a voltage is applied between the two metal electrodes, the electrodes store electric charge to store energy.

Although the energy storage inductor and the energy storage capacitor store and release energy in different methods, both the energy storage inductor and the energy storage capacitor can be used as elements for storing and releasing energy. In this application, a structure and type of the transitory energy storage element L are not specifically limited.

In some embodiments, the charging switch element Q1 is a first NMOS transistor, a drain of the first NMOS transistor serves as the first end of the charging switch element Q1 to be connected to a second end of the transitory energy storage element L, a source of the first NMOS transistor serves as a second end of the charging switch element Q1 to be grounded, a gate of the first NMOS transistor is the charging enabling end for receiving the charging control signal, and the first NMOS transistor is turned on or off under the control of the charging control signal.

In this embodiment, the emission power supply E is connected to the energy storage-adjustable charging circuit 110, to charge the energy storage-adjustable charging circuit 110. A value of the output current of the energy storage-adjustable charging circuit 110 is positively correlated with the energy stored in the transitory energy storage element L in the energy storage-adjustable charging circuit 110. When the light emission power of the laser needs to be increased, the turn-on time of the charging switch element Q1 can be controlled by using the charging control signal, to increase the energy stored in the transitory energy storage element L and further increase a charging current output by the transitory energy storage element L to the anode energy storage element, thereby adjusting the light emission power of the laser LD by using the anode energy storage element C.

It should be noted that the light emission power of the laser depends on the energy stored in the energy storage-adjustable charging circuit 110, that is, the energy stored in the energy storage-adjustable charging circuit 110 can be adjusted based on the target light emission power of the laser. It should be noted that because the anode energy storage element C is connected to the anode of the laser, instead of connecting the energy storage-adjustable charging circuit 110 directly to the anode of the laser LD, energy is transmitted between the energy storage-adjustable charging circuit 110 and the anode energy storage element C, and correspondingly, there is an energy loss. To be specific, the energy stored in the anode energy storage element C is determined based on the target light emission power of the laser, and based on an energy transmission loss between the energy storage-adjustable charging circuit 110 and the anode energy storage element C, the energy stored in the energy storage-adjustable charging circuit 110 is further determined.

Referring to FIG. 13, the anode addressing switch circuit 121 is connected to a second end of a transitory energy storage element L and the anode energy storage circuit 122, the anode addressing switch circuit 121 is turned on or off under the control of an anode addressing signal, and therefore, the second end of the transitory energy storage element L and the anode energy storage circuit 122 are turned on or off, and when the anode addressing switch circuit 121 is turned on, the anode energy storage circuit 122 is charged through energy stored in the transitory energy storage element L, and the anode energy storage circuit 122 outputs a current to drive the laser LDxy to emit light.

Referring to FIG. 13, in an exemplary solution, the anode addressing switch circuit 121 includes an anode addressing switch element Q2, and the anode addressing switch element Q2 includes a first end, a second end, and an addressing enabling end. The first end is connected to a second end of a transitory energy storage element L, the second end is connected to the anode energy storage circuit 122, the addressing enabling end of the anode addressing switch element Q2 receives an anode addressing signal, and the anode addressing signal is used to control the anode addressing switch element Q2 to be turned on or off. When the anode addressing switch element Q2 is turned on, the anode energy storage circuit 122 is charged through an output current of the transitory energy storage element L, and the anode energy storage circuit 122 outputs the current to drive the laser LDxy to emit light.

In some embodiments, the anode addressing switch element Q2 is a second NMOS transistor, a drain of the second NMOS transistor serves as the first end of the anode addressing switch element Q2 to be connected to the transitory energy storage element L, a source of the second NMOS transistor serves as the second end of the anode addressing switch element Q2 to be connected to the anode energy storage circuit 122, and a gate of the second NMOS transistor serves as the anode addressing enabling end to receive the anode addressing signal HS. The second NMOS transistor is turned on or off under the control of the anode addressing signal.

As shown in FIG. 13, this embodiment is intended to solve the problem that subsequent energy storage of the anode energy storage element C is affected because another element is damaged by residual energy existing in the anode energy storage element C in the anode addressing drive circuit 120.

The anode addressing drive circuit 120 provided in this embodiment of this application further includes an anode energy release switch circuit 123, the anode energy release switch circuit 123 includes an energy release switch element Q17, the energy release switch element Q17 includes a first end, a second end, and an energy release enabling end. The first end is connected to a first end of the anode energy storage element C, the second end is grounded, and the energy release enabling end receives an energy release control signal. The energy release control signal and the anode addressing signal are in reverse states. Specifically, when the anode addressing signal is at a high level, the energy release control signal is at a low level; or when the anode addressing signal is at a low level, the energy release control signal is at a high level. The energy release control signal is used to turn off the energy release switch element Q17 when the anode addressing switch element Q2 is turned on through the anode addressing signal, and the anode addressing switch element Q2 connects a second end of the anode unidirectional conducting element to a second end of a transitory energy storage element L, so that the anode unidirectional conducting element is in the forward conduction state. The transitory energy storage element L, the anode addressing switch element Q2, the anode unidirectional conducting element, the anode energy storage element C, and the ground form a second charging loop. The energy release control signal is also used to turn on the energy release switch element Q17 when the anode addressing switch element Q2 is turned off through the anode addressing signal, and the second end of the anode energy storage element C is grounded through the energy release switch element Q17, the anode energy storage element C, the energy release switch element Q17, and the ground form an energy release loop, to release residual energy from the anode energy storage element C.

In some embodiments, the energy release switch element Q17 is a seventeenth NMOS transistor, a drain of the seventeenth NMOS transistor serves as the first end of the energy release switch element Q17 to be connected to a first end of the anode energy storage element C, a source of the seventeenth NMOS transistor serves as a second end of the energy release switch element Q17 to be grounded, and a gate serves as the energy release enabling end of the energy release switch element Q17 to receive an energy release control signal. When the laser LDxy is selected for light emission, at a charging stage of the anode energy storage element C, the anode addressing switch element Q2 is turned on under the enablement of the anode addressing signal, and an output current of the transitory energy storage element L flows through the anode unidirectional conducting element to the third energy storage element C. When the laser Ldxy is unselected for light emission, the anode addressing switch element Q2 is turned off under the control of the anode addressing signal, the energy release switch element Q17 is turned on under the enablement of the energy release control signal, and the first end of the anode energy storage element C is grounded through the energy release switch element Q17, to release residual energy from the anode energy storage element C.

Further, when the residual energy in the anode energy storage element C is released through the energy release circuit, a large release current may affect the energy release switch element Q17, that is, the large release current may damage the energy release switch element Q17. To solve the problem, the anode energy release circuit provided in this embodiment of this application also includes a fourth current limiting element R4 to limit a current for releasing energy from the anode energy storage element, thereby reducing a possibility of damage to the energy release switch element Q17 when the energy is released from the anode energy storage element C.

Specifically, the first end of the fourth current limiting element R4 is connected to the first end of the energy release switch element Q17, and the second end of the fourth current limiting element R4 is connected to the first end of the anode energy storage element C. When the energy release switch element Q17 is turned on under the enablement of the energy release control signal, the anode energy storage element C, the fourth current limiting element R4, the energy release switch element Q17, and the ground form an energy release loop.

It can be understood that the greater the resistance of the fourth current limiting element R4, the stronger the current limiting capability of the fourth current limiting element R4 during current release of the anode energy storage element C, and the greater the voltage drop across two ends of the fourth current limiting element R4. In this application, specific resistance of the fourth current limiting element R4 is not limited, and can be properly set based on an actual need.

Further, in this embodiment of this application, to easily control the anode addressing switch element Q2, the anode reverse-biased switch element Q3, and the energy release switch element Q17, the first end of the anode phase inverter I1 is connected to the addressing enabling end, and the second end of the anode phase inverter I1 is connected to the reverse-biased enabling end and the energy release enabling end. Specifically, an input end of the anode phase inverter I1 is connected to the addressing enabling end of the anode addressing switch element Q2, and an output end of the anode phase inverter I1 is connected to the reverse-biased enabling end of the anode reverse-biased switch element Q3 and the energy release enabling end of the energy release switch element Q17, and therefore, the anode reverse-biased switch element Q3 is in a turn-on state that is the same as that of the energy release switch element Q17 and different from that of the anode addressing switch element Q2.

In some other embodiments, the anode addressing drive circuit 120 includes a reverse-biased phase inverter and an energy release phase inverter, an input end of the reverse-biased phase inverter is connected to the addressing enabling end of the anode addressing switch element Q2, an output end of the reverse-biased phase inverter is connected to the reverse-biased enabling end of the anode reverse-biased switch element Q3, an input end of the energy release phase inverter is connected to the addressing enabling end of the anode addressing switch element Q2, an output end of the energy release phase inverter is connected to the energy release enabling end of the energy release switch element Q17, and therefore, the anode reverse-biased switch element Q3 is in a turn-on state that is the same as that of the energy release switch element Q17 and different from that of the anode addressing switch element Q2.

In some other embodiments, an input end of the anode phase inverter I1 is connected to the reverse-biased enabling end of the anode reverse-biased switch element Q3 and the energy release enabling end of the energy release switch element Q17, and an output end of the anode phase inverter I1 is connected to the addressing enabling end of the anode addressing switch element Q2, and in this case, the anode reverse-biased switch element Q3 may be in a turn-on state that is the same as that of the energy release switch element Q17 and different from that of the anode addressing switch element.

Embodiment 5

This embodiment provides a switch circuit for improving isolation, to solve the problem that the isolation of the switch element is reduced because the switch element includes the parasitic capacitor.

Specifically, the switch circuit includes a first end, a second end, and an enabling end, the first end of the switch circuit receives a first voltage, the second end receives a second voltage, the second voltage is greater than the first voltage, the switch circuit is configured to form a forward conduction loop between the second end and the first end of the switch circuit under the control of an enabling signal of the enabling end, to allow a current to flow through the switch circuit, and the switch circuit is further configured to form a reverse-biased circuit between the second end and the first end of the switch circuit under the control of the enabling signal of the enabling end, to prevent the current from flowing through the switch circuit.

In an optional manner, the unidirectional conducting element is provided at the second end of the switch circuit. Specifically, the switch circuit includes a second switch element, a second unidirectional conducting element, and a second reverse-biased switch element, the second switch element includes a first end, a second end, and an enabling end, a first end of the second unidirectional conducting element serves as the second end of the switch circuit to receive a second voltage, a second end of the second unidirectional conducting element is connected to a second end of the second switch element, the first end of the second switch element serves as the first end of the switch circuit to receive the first voltage, the enabling end of the second switch element receives a second switch control signal, and the second switch element is turned on or off under the control of the switch control signal; the second reverse-biased switch element includes a first end, a second end, and a second reverse-biased enabling end, the first end of the second reverse-biased switch element is connected to the second end of the second unidirectional conducting element, the second end of the second reverse-biased switch element receives a second preset voltage, and the second reverse-biased enabling end receives a second reverse-biased control signal; the second reverse-biased control signal is used to turn off the second reverse-biased switch element when the switch element is turned on through the second switch control signal, the second switch element enables the first end of the second unidirectional conducting element to receive a first voltage, so that the second unidirectional conducting element is in the forward conduction state, and the forward conduction loop is formed between the second end and the first end of the switch circuit, thereby allowing the current to flow through the switch circuit; and the second reverse-biased control signal is also used to turn on the second reverse-biased switch element when the second switch element is turned off through the second switch control signal, the second reverse-biased switch element enables the second end of the second unidirectional conducting element to receive a second preset voltage, and a voltage value of the second preset voltage is greater than or equal to the first voltage, so that the second unidirectional conducting element is in the reverse-biased state and the current is prevented from flowing through the second switch element, thereby improving isolation of the second switch element.

In an exemplary solution, the second switch element is a fifth NMOS transistor, a drain of the fifth NMOS transistor serves as the first end of the second switch element to receive the first voltage, a source of the fifth NMOS transistor serves as a second end of the second switch element to be connected to the second end of the second unidirectional conducting element, a gate of the fifth NMOS transistor serves as the enabling end of the second switch element to receive the second switch control signal, and the fifth NMOS transistor is turned on or off under the control of the second switch control signal. In an exemplary solution, the second unidirectional conducting element is a seventh NMOS transistor Q7, the second reverse-biased switch element is the sixth NMOS transistor, a drain of the seventh NMOS transistor serves as a second end of the second unidirectional conducting element to receive the second voltage, and a source of the seventh NMOS transistor serves as the second end of the second unidirectional conducting element to be connected to the second end of the second switch element and the first end of the sixth NMOS transistor. A gate of the seventh NMOS transistor is connected to a gate of the fifth NMOS transistor. A gate of the sixth NMOS transistor is connected to a gate of the fifth NMOS transistor through a second phase invertor, and a source of the sixth NMOS transistor receives a second preset voltage. When the fifth NMOS transistor is turned on under the enablement of the second switch control signal, the seventh NMOS transistor is turned on under the enablement of the second switch control signal, the source of the seventh NMOS transistor receives the first voltage through the fifth NMOS transistor, and the seventh NMOS transistor is in the forward conduction state. When the fifth NMOS transistor is turned off under the control of the second switch control signal, the sixth NMOS transistor is turned on under the enablement of the second switch control signal, the source of the seventh NMOS transistor receives the second preset voltage through the sixth NMOS transistor, the voltage value of the second preset voltage is greater than or equal to the first voltage, and the seventh NMOS transistor is switched to the reverse-biased state.

Specifically, when the fifth NMOS transistor is turned on under enablement of the second switch control signal, the second switch control signal is at a high level greater than the first voltage; or when the fifth NMOS transistor is turned off under the control of the second switch control signal, the second switch control signal is at a low level lower than or equal to the first voltage.

In another exemplary solution, the second unidirectional conducting element is a seventh diode, the second reverse-biased switch element is the sixth NMOS transistor, an anode of the seventh diode serves as a second end of the second unidirectional conducting element to receive the second voltage, and a cathode of the seventh diode serves as the second end of the second unidirectional conducting element to be connected to the second end of the fifth NMOS transistor and the first end of the sixth NMOS transistor. A gate of the sixth NMOS transistor is connected to a gate of the fifth NMOS transistor through a second phase invertor, and a source of the sixth NMOS transistor receives a second preset voltage. When the fifth NMOS transistor is turned on under the enablement of the second switch control signal, the cathode of the seventh diode receives the first voltage through the fifth NMOS transistor, and the seventh NMOS transistor is in the forward conduction state. When the fifth NMOS transistor is turned off under the control of the second switch control signal, the sixth NMOS transistor is turned on under enablement of the second control signal, the cathode of the seventh diode receives the second preset voltage through the sixth NMOS transistor, the voltage value of the second preset voltage is greater than or equal to the first voltage, and the seventh diode is switched to the reverse-biased state.

Specifically, when the second switch element is turned on under enablement of the second switch control signal, the second switch control signal is at a high level higher than the first voltage; or when the second switch element is turned off through the second switch control signal, the second switch control signal is at a low level lower than or equal to the first voltage.

In some exemplary solutions, the switch circuit further includes a second phase inverter, an input end of the second phase inverter is connected to the enabling end of the fifth NMOS transistor, and an output end of the second phase inverter is connected to the gate of the sixth NMOS transistor, so that the sixth NMOS transistor and the fifth NMOS transistor are in reverse states.

In some other embodiments, an input end of the second phase inverter is connected to the second reverse-biased enabling end of the sixth NMOS transistor, an output end of the second phase inverter is connected to the enabling end of the fifth NMOS transistor, and in this case, the sixth NMOS transistor and the fifth NMOS transistor can be in reverse states.

When the second switch element is turned off, the second unidirectional conducting element is in the reverse-biased state, and therefore, the switch circuit provided in the optional solution prevents a current from flowing through the second switch element, thereby improving isolation of the switch circuit.

In another optional manner, a unidirectional conducting element is provided at the first end of the switch circuit. Specifically, the switch circuit includes a first switch element, a first unidirectional conducting element, and a first reverse-biased switch element, and the first switch element includes a first end, a second end, and an enabling end; the first end serves as the second end of the switch circuit to receive the second voltage, the second end is connected to the second end of the first unidirectional conducting element, and the first end of the first unidirectional conducting element serves as the first end of the switch circuit to receive the first voltage. The first reverse-biased switch element includes a first end, a second end, and an reverse-biased enabling end, the first end is connected to the second end of the first unidirectional turn-on element, the second end receives a first preset voltage, and the first reverse-biased enabling end receives a first switch control signal. The first reverse-biased control signal and the first switch control signal are in reverse states, and specifically, when the first switch control signal is at a high level, the first reverse-biased control signal is at the low level, or when the first switch control signal is at the low level, the first reverse-biased control signal is at a high level. The first reverse-biased control signal is used to turn off the first reverse-biased switch element when the first switch element is turned on through the first switch control signal, and the second end of the first unidirectional conducting element receives the second voltage through the first switch element, so that the first unidirectional conducting element is in the forward conduction state. The first reverse-biased control signal is also used to turn on the first reverse-biased switch element when the first switch element is turned off through the first switch control signal, and the second end of the first unidirectional conducting element receives the first preset level through the first reverse-biased switch element.

In some embodiments, a voltage value of the first preset level is equal to the second voltage; and specifically, the source of the third NMOS transistor is connected to the drain of the second NMOS transistor.

In another embodiment, the voltage value of the first preset level is less than the second voltage.

In an exemplary solution, the first switch element is a second NMOS transistor, a drain of the second NMOS transistor serves as the second end of the first switch element to receive the second voltage, a source of the second NMOS transistor serves as a second end of the first switch element to be connected to the second end of the first unidirectional conducting element, a gate of the second NMOS transistor is the enabling end of the first switch element for receiving the first switch control signal, and the second NMOS transistor is turned on or off under the control of the first switch control signal.

In an exemplary solution, the first unidirectional conducting element is a fourth NMOS transistor, the first reverse-biased switch element is a third NMOS transistor, a source of the fourth NMOS transistor is connected to a source of the second NMOS transistor and a drain of the third NMOS transistor, a drain of the fourth NMOS transistor receives the first voltage, and a gate of the fourth NMOS transistor is connected to an enabling end of the first switch element. When the first switch element is turned on under enablement of the first switch control signal, the fourth NMOS transistor is also turned on under the enablement of the first switch control signal, the third NMOS transistor is turned off under the control of the first reverse-biased control signal, the source of the fourth NMOS transistor receives the second voltage through the first switch element, and the fourth NMOS transistor is in the forward conduction state. When the first switch element is turned off under the control of the first switch control signal, the third NMOS transistor is turned on under the enablement of the first reverse-biased control signal, the source of the fourth NMOS transistor receives the first preset level through the third NMOS transistor, and the fourth NMOS transistor is in the reverse-biased state.

Further, when the second NMOS transistor is turned on under enablement of the first switch control signal, the first switch control signal is at a high level higher than the second voltage; or when the second NMOS transistor is turned off through the first switch control signal, the first switch control signal is at a low level lower than or equal to the second voltage.

In another exemplary solution, the first unidirectional conducting element is a fourth diode, the first reverse-biased switch element is a third NMOS transistor, an anode of the fourth diode is connected to a source of the second NMOS transistor and a drain of the third NMOS transistor, and a cathode of the fourth diode receives the first voltage. When the first switch element is turned on under enablement of the first switch control signal, the third NMOS transistor is turned off under the control of the first reverse-biased control signal, the cathode of the fourth diode receives the second voltage through the second NMOS transistor, and the fourth diode is in the forward conduction state. When the first switch element is turned off under the control of the first switch control signal, the third NMOS transistor is turned on under the enablement of the first reverse-biased control signal, the cathode of the fourth diode receives the first preset level through the third NMOS transistor, and the fourth NMOS transistor is in the reverse-biased state.

Further, when the first switch element is turned on under enablement of the first switch control signal, the first switch control signal is at a high level higher than the second voltage; or when the first switch element is turned off through the first switch control signal, the first switch control signal is switched to a low level lower than or equal to the second voltage.

In some exemplary solutions, the switch circuit further includes the first phase inverter, an input end of the first phase inverter is connected to the enabling end of the first switch element, and an output end of the first phase inverter is connected to the first reverse-biased enabling end of the first reverse-biased switch element, so that the first reverse-biased switch element and the first switch element are in reverse states.

In some other embodiments, an input end of the first phase inverter is connected to the first reverse-biased enabling end of the first reverse-biased switch element, and an output end of the first phase inverter is connected to the enabling end of the first switch element, and in this case, the first reverse-biased switch element and the first switch element can be in reverse states.

When the first switch element is turned off, the first unidirectional conducting element is in the reverse-biased state, and therefore, the switch circuit provided in the optional solution prevents a current from flowing through the first switch element, thereby improving isolation of the switch circuit.

When applied to the cathode addressing switch circuit, the second switch element, the second unidirectional conducting element, and the second reverse-biased switch element in this embodiment correspond to the cathode addressing switch element, the cathode unidirectional conducting element, and the cathode reverse-biased switch element in Embodiment 1 separately.

When applied to the anode addressing switch circuit, the first switch element, the first unidirectional conducting element, and the first reverse-biased switch element in this embodiment correspond to the anode addressing switch element, the anode unidirectional conducting element, and the anode reverse-biased switch element in Embodiment 2 separately.

Correspondingly, in some other embodiments, the first switch element can also be the second PMOS transistor. Since the anode addressing switch element in Embodiment 3 is the second PMOS transistor, similarly, it can be inferred that the first switch element is the second PMOS transistor.

Embodiment 6

This embodiment is intended to solve a problem of light leakage and false light emission of the laser caused by a parasitic capacitor when a switch element includes the parasitic capacitor. Referring to FIG. 14 to FIG. 17, an embodiment provides an addressable drive circuit, applied to a laser array and including a second anode addressable drive circuit 300 and a second cathode addressable drive circuit 400. Anodes of lasers in the same row in the laser array are electrically connected and extend to form a shared anode end, and cathodes of the lasers in the same column in the laser array are electrically connected and extend to form a shared cathode end. The second anode addressable drive circuit 300 is connected to multiple shared anode ends corresponding to the multiple rows of lasers, and an anode addressing signal is externally received, to drive anode addressing for the anodes of the multiple rows of lasers through scanning; and the second cathode addressable drive circuit 400 is connected to the multiple shared cathode ends corresponding to the multiple columns of lasers, and a cathode addressing drive signal is externally received, to drive cathode addressing for the cathodes of the multiple columns of lasers in the laser array through scanning.

In an exemplary solution, the laser array includes m rows of lasers and n columns of lasers, a second anode addressable drive circuit 300 includes m second anode addressing drive circuits 320, and a second cathode addressable drive circuit 400 includes n second cathode addressing drive circuits 420. One end of an $x^{th}$ second anode addressing drive circuit 320 is grounded, and the other end is connected to an $x^{th}$ shared anode end in the laser array, and further connected to an anode of a laser LDxy in the laser array, where x represents a specific row of the laser, x is a positive integer, and x=1, 2, . . . , m, where m is the total number of second anode addressing drive circuits 320, and also the total number of shared anode ends in the laser array. One end of a $y^{th}$ cathode addressing drive circuit 320 is connected to an emission power supply E, and the other end is connected to a $y^{th}$ shared cathode end in the laser array, and further connected to a cathode of the laser LDxy in the laser array, where y represents a specific column of the laser, y is a positive integer, and y=1, 2, . . . , n, where n is the total number of second cathode addressing drive circuits 420, and also the total number of shared cathode ends in the laser array.

Figure 15:
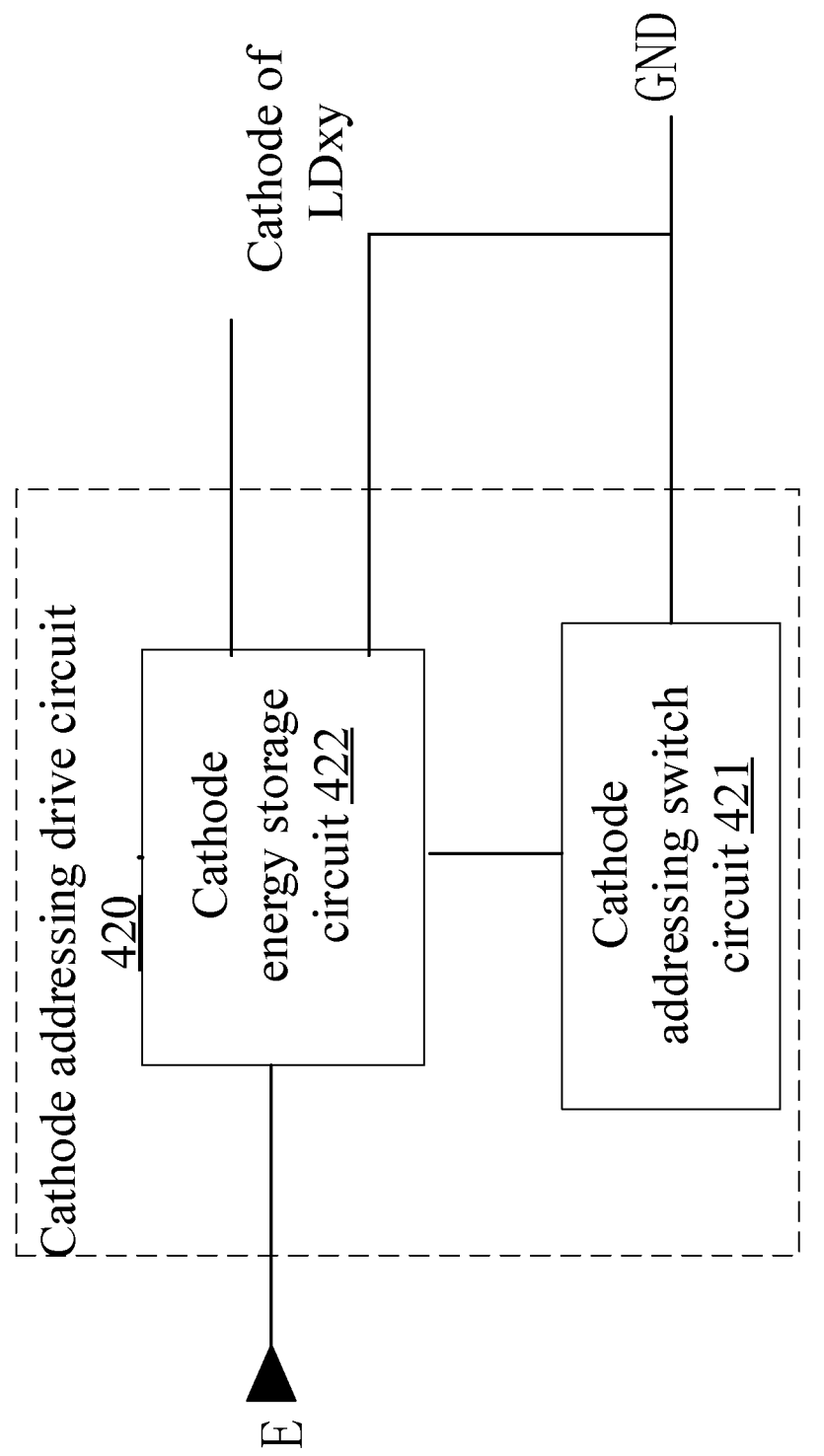
FIG. 15 is a schematic diagram of a framework of a cathode addressing drive circuit according to some embodiments of this application.
Figure 17:
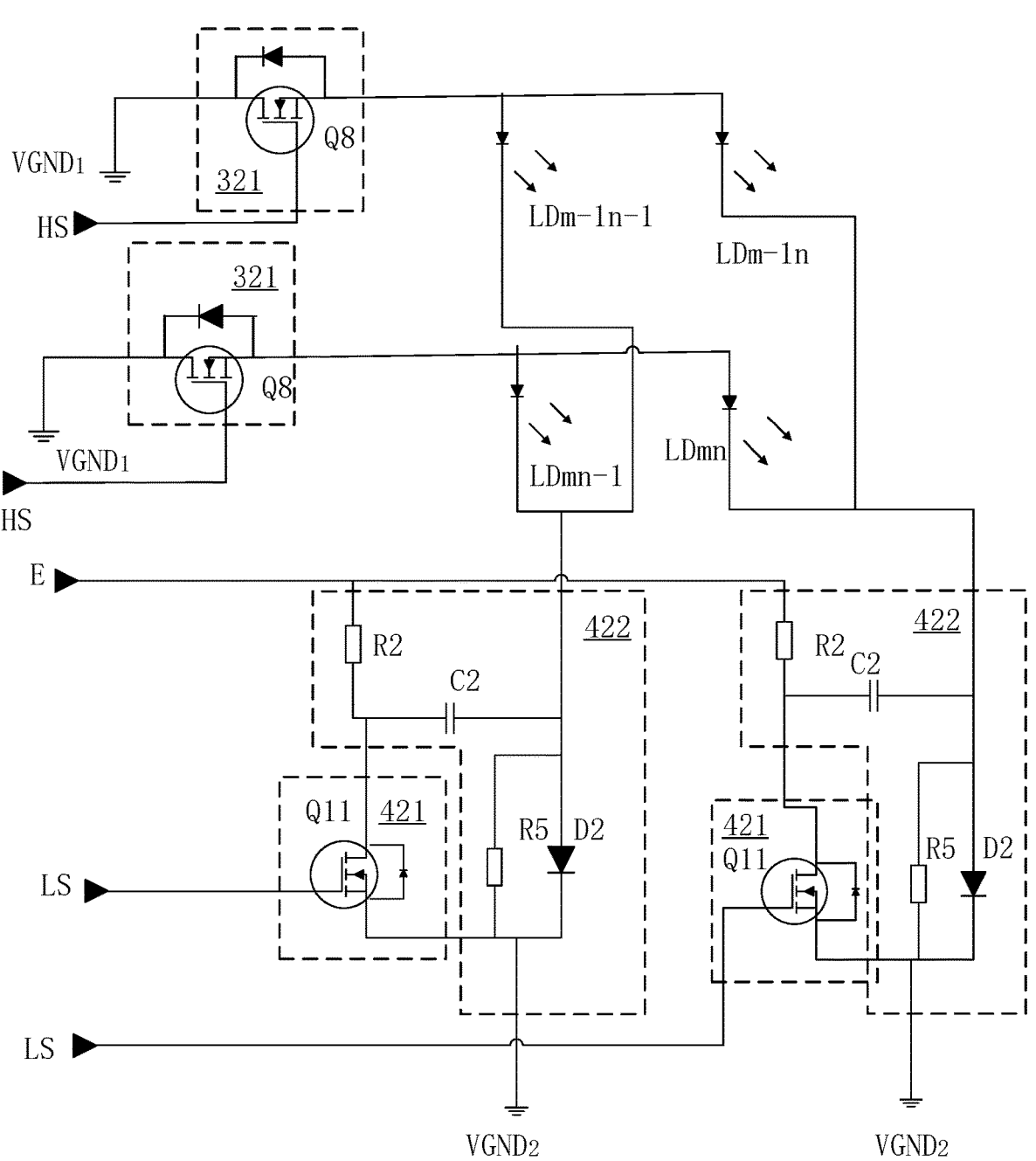
FIG. 17 is a schematic structural diagram of a part of an addressable drive circuit according to some embodiments of this application.

Referring to FIG. 15 and FIG. 17, the second cathode addressing drive circuit 420 includes a second cathode addressing switch circuit 421 and a second cathode energy storage circuit 422; and one end of the second cathode energy storage circuit 422 is connected to the emission power supply E and one end of the second cathode addressing switch circuit 421, and the other end is connected to the cathode of the laser connected to the corresponding shared cathode end and the ground, and the other end of the second cathode addressing switch circuit 421 is grounded. The second cathode addressing switch circuit 421 is turned on or off under the control of a cathode addressing signal; and when the second cathode addressing switch circuit 421 is turned off under the control of the cathode addressing signal, the emission power supply E outputs a current to charge the second cathode energy storage circuit 422, the second cathode energy storage circuit 422 is in the voltage application stage, and a positive potential difference UC is formed between one end, connected to the emission power supply E, of the second cathode energy storage circuit 422 and the other end connected to the cathode of the laser, so that the laser is in a reverse-biased state when a voltage is applied to the second cathode energy storage circuit 422. When the second cathode addressing switch circuit 421 is turned on under the control of the cathode addressing signal, the emission power supply E and one end, connected to the emission power supply E, of the second cathode energy storage circuit 422 are grounded through the second cathode addressing switch circuit 421, the second cathode energy storage circuit 422 enters a voltage conversion stage, the second cathode energy storage circuit 422 uses the positive potential difference UC formed in the voltage application stage to pull down a voltage of the end, connected to the cathode of the laser, of the second cathode energy storage circuit 422 to a difference between the ground voltage and the positive potential difference UC, so that the voltage of the cathode of the laser is changed from the ground voltage to the difference between the ground voltage and the positive potential difference UC when the second cathode energy storage circuit 422 enters the voltage conversion stage, and the laser switches to the forward conduction state when the second cathode energy storage circuit 422 releases energy to drive the laser to emit light.

Specifically, in the voltage application stage, a voltage received by the cathode of the laser is greater than or equal to a voltage received by an anode addressing drive circuit connected to the laser, and the laser remains in the reverse-biased state without emitting light. In the voltage conversion stage, a voltage received by the cathode of the laser is pulled down to be lower than the voltage received by the second anode addressing drive circuit. Once the anode addressing drive circuit is selected to be turned on, the voltage received by the anode of the laser is greater than the voltage received by the cathode of the laser, and the laser switches to the forward conduction state and is driven to emit light.

Referring to FIG. 17, in an exemplary solution, the second cathode energy storage circuit 422 includes a cathode energy storage element C2, a first end of the cathode energy storage element C2 is connected to the emission power supply E, and a second end of the cathode energy storage element C2 is connected to a cathode of a laser connected to a corresponding shared cathode end. The cathode energy storage element C2 is configured to be charged through the output current of the emission power supply E in a voltage application stage, to form a positive potential difference UC between the first end and the second end of the cathode energy storage element C2, so that the laser is in a reverse-biased state in the voltage application stage. The cathode energy storage element C2 is also configured to pull down the voltage of the second end of the cathode energy storage element C2 (that is, the voltage of the cathode of the laser) in the voltage conversion stage by using the positive potential difference UC formed in the voltage application stage, so that the laser switches to the forward conduction state in the energy release stage of the cathode energy storage element C2.

In some embodiments, the cathode energy storage element C2 is an energy storage capacitor, the first end of the energy storage capacitor is connected to the emission power supply E, and the second end of the energy storage capacitor is connected to the cathode of the laser connected to the corresponding shared cathode end.

Referring to FIG. 17, to prevent the second end of the cathode energy storage element C2 from being directly grounded, further prevent the first end and the second end of the cathode energy storage element C2 from being grounded at the same time during the voltage conversion stage, and ensure a voltage changing function of the cathode energy storage element C2, the second cathode energy storage circuit 422 also includes an energy storage unidirectional conducting element D2, the energy storage unidirectional conducting element D2 is connected between the second end of the cathode energy storage element C2 and the ground, the first end of the energy storage unidirectional conducting element D2 is connected to the second end of the cathode energy storage element C2, and the second end is grounded (cathode ground GND2). When the second cathode addressing switch circuit 421 is turned off under the control of the cathode addressing signal, the emission power supply E, the cathode energy storage element C2, the energy storage unidirectional conducting element D2, and the ground form a charging loop, the energy storage unidirectional conducting element D2 is in the forward conduction state, the second end of the cathode energy storage element C2 is grounded through the energy storage unidirectional conducting element D2, and the foregoing positive potential difference UC is formed between the first end and the second end of the cathode energy storage element C2. When the second cathode addressing switch circuit 421 is turned on under the control of the cathode addressing signal, the emission power supply E and the first end, connected to the emission power supply E, of the cathode energy storage element C2 are grounded through the second cathode addressing switch circuit 421. Because the positive potential difference UC on the cathode energy storage element C2 is unchanged, the voltage of the second end of the cathode energy storage element C2 is changed to the difference between the ground voltage and the positive potential difference UC in the voltage conversion stage, the voltage of the second end of the cathode energy storage element C2 is pulled down from the ground voltage in the voltage application stage to the difference between the ground voltage and the positive potential difference UC, the voltage of the first end of the energy storage unidirectional conducting element D2 is also changed to the difference between the ground voltage and the positive potential difference UC, a voltage of the second end of the energy storage unidirectional conducting element D2 is the ground voltage and is greater than the voltage of the first end of the energy storage unidirectional conducting element D2, and the energy storage unidirectional conducting element D2 switches to the reverse-biased state.

In some embodiments, the energy storage unidirectional conducting element D2 is a diode, the anode of the diode is connected to the first end of the energy storage capacitor, and the cathode is grounded.

In this embodiment, when the energy storage unidirectional conducting element D2 switches from the forward conduction state to the reverse-biased state and from the reverse-biased state to the forward conduction state, oscillation occurs, and as a result, the energy storage unidirectional conducting element D2 switches from the forward conduction state to the reverse-biased state and from the reverse-biased state to the forward conduction state more slowly. To accelerate switching of the energy storage unidirectional conducting element D2 from the forward conduction state to the reverse-biased state and from the reverse-biased state to the forward conduction state, the second cathode energy storage circuit 422 provided in this embodiment of this application further includes an anti-oscillation element R5, and the anti-oscillation element R5 is connected to the energy storage unidirectional conducting element D2 in parallel, to form an anti-oscillation loop with the energy storage unidirectional conducting element D2.

In some embodiments, the anti-oscillation element R5 uses an anti-oscillation resistor, the anti-oscillation resistor is connected to the energy storage unidirectional conducting element D2 in parallel, and the anti-oscillation resistor and the energy storage unidirectional conducting element D2 form an anti-oscillation loop, to accelerate switching of the energy storage unidirectional conducting element D2 from the forward conduction state to the reverse-biased state and from the reverse-biased state to the forward conduction state.

In this embodiment, to prevent an overlarge current for charging the cathode energy storage element C2 from exceeding a tolerance range of the anti-oscillation loop and damaging the energy storage unidirectional conducting element D2, the second cathode energy storage circuit 422 provided in this embodiment of this application also includes a second current limiting element R2, the second current limiting element R2 is connected between the emission power supply E and the first end of the cathode energy storage element C2, a first end of the second current limiting element R2 is connected to the emission power supply E, and a second end of the second current limiting element R2 is connected to the first end of the cathode energy storage element C2, to limit the current for charging the cathode energy storage element C2, thereby protecting the energy storage unidirectional conducting element D2.

In some embodiments, the second current limiting element R2 includes a current limiting resistor.

It can be understood that the greater the resistance of the current limiting resistor, the stronger the current limiting capability of the current limiting resistor, and the greater the voltage drop across two ends of the current limiting resistor. In this application, specific resistance of the current limiting element is not limited, and can be properly set based on an actual need.

Referring to FIG. 17, in an example solution, the second cathode addressing switch circuit 421 includes a second cathode addressing switch element Q11, the second cathode addressing switch element Q11 includes a first end, a second end, and a cathode addressing enabling end, the first end is connected to the first end of the cathode energy storage element C2, the second end is grounded, the cathode addressing enabling end receives a cathode addressing signal LS, and the second cathode addressing switch element Q11 is turned on or off under the control of the cathode addressing signal.

In some embodiments, the second cathode addressing switch element Q11 is an eleventh NMOS transistor, a drain of the eleventh NMOS transistor serves as the first end of the second cathode addressing switch element Q11 to be connected to the first end of the cathode energy storage element C2, a source of the eleventh NMOS transistor serves as the second end of the second cathode addressing switch element Q11 to be grounded, and a gate of the eleventh NMOS transistor serves as the cathode addressing enabling end to receive a cathode addressing signal LS. The second cathode addressing switch element Q11 is turned on or off under the control of the cathode addressing signal LS.

In another example solution, the second cathode addressing switch element Q11 is an eleventh PMOS transistor, a drain of the eleventh PMOS transistor serves as the first end of the second cathode addressing switch element Q11 to be connected to the first end of the cathode energy storage element C2, a source of the eleventh PMOS transistor serves as the second end of the second cathode addressing switch element Q11 to be grounded, and a gate of the eleventh PMOS transistor serves as the cathode addressing enabling end to receive a cathode addressing signal LS. The second cathode addressing switch element Q11 is turned on or off under the control of the cathode addressing signal LS.

A voltage condition $V_{GS}$ when the cathode addressing signal drives the eleventh PMOS transistor to be turned on is opposite to a voltage condition $V_{GS}$ when the cathode addressing signal drives the eleventh NMOS transistor to be turned on, where $V_{GS}=V_G-V_S$, $V_G$ is a gate voltage of the MOS transistor (the eleventh NMOS transistor or the eleventh PMOS transistor), and $V_S$ is a source voltage of the MOS transistor (the eleventh NMOS transistor or the eleventh PMOS transistor). For example, a condition for turning on the eleventh NMOS transistor is that $V_{GS}$ of the eleventh NMOS transistor is greater than or equal to $V_{th}$. In this case, the cathode addressing signal is at a high level when the eleventh NMOS transistor is turned on, and the cathode addressing signal is at a low level when the eleventh NMOS transistor is turned off. A condition for turning on the eleventh PMOS transistor is that $V_{GS}$ of the eleventh PMOS transistor is less than or equal to $V_{th}$. In this case, the cathode addressing signal is at a low level when the eleventh PMOS transistor is turned on, and the cathode addressing signal is at a high level when the eleventh PMOS transistor is turned off.

Figure 16:
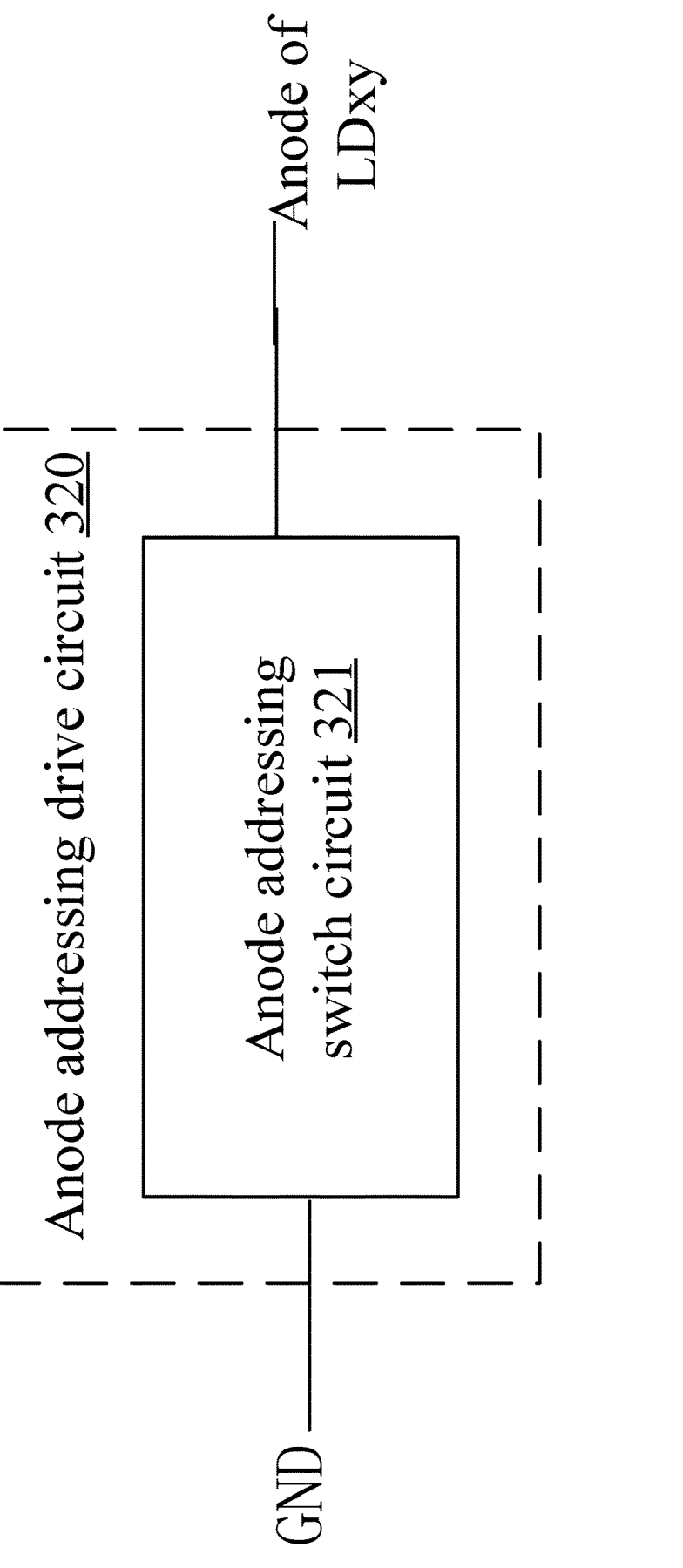
FIG. 16 is a schematic diagram of a framework of an anode addressing drive circuit according to some embodiments of this application.

Referring to FIG. 16 and FIG. 17, the second anode addressing drive circuit 320 includes a second anode addressing switch circuit 321, one end of the second anode addressing switch element 321 is grounded, and the other end is connected to an anode of a laser connected to a corresponding shared anode end. Referring to FIG. 17, the second anode addressing switch circuit 321 includes a second anode addressing switch element Q8, the second anode addressing switch element Q8 includes a first end, a second end, and an anode addressing enabling end, the first end is grounded, the second end is connected to an anode of a laser connected to a corresponding shared anode end, the anode addressing enabling end receives an anode addressing signal HS, and the second anode addressing switch element Q8 is turned on or off under the control of the anode addressing signal HS.

In some embodiments, the second anode addressing switch element Q8 is an eighth NMOS transistor, a drain of the eighth NMOS transistor serves as the first end of the second anode addressing switch element Q8 to be grounded, a source of the eighth NMOS transistor serves as the second end of the second anode addressing switch element Q8 to be connected to an anode of a laser connected to a corresponding shared anode end, and a gate of the eighth NMOS transistor is the anode addressing enabling end for receiving the anode addressing signal HS. The eighth NMOS transistor is turned on or off under the control of the anode addressing signal HS.

This embodiment is intended to solve problems that isolation of the second anode addressing switch circuit 321 is reduced and a laser unselected for light emission emits light because of the crosstalk of electrical signals of a laser selected for light emission, because the second anode addressing switch element Q8 includes the parasitic capacitor.

Figure 18:
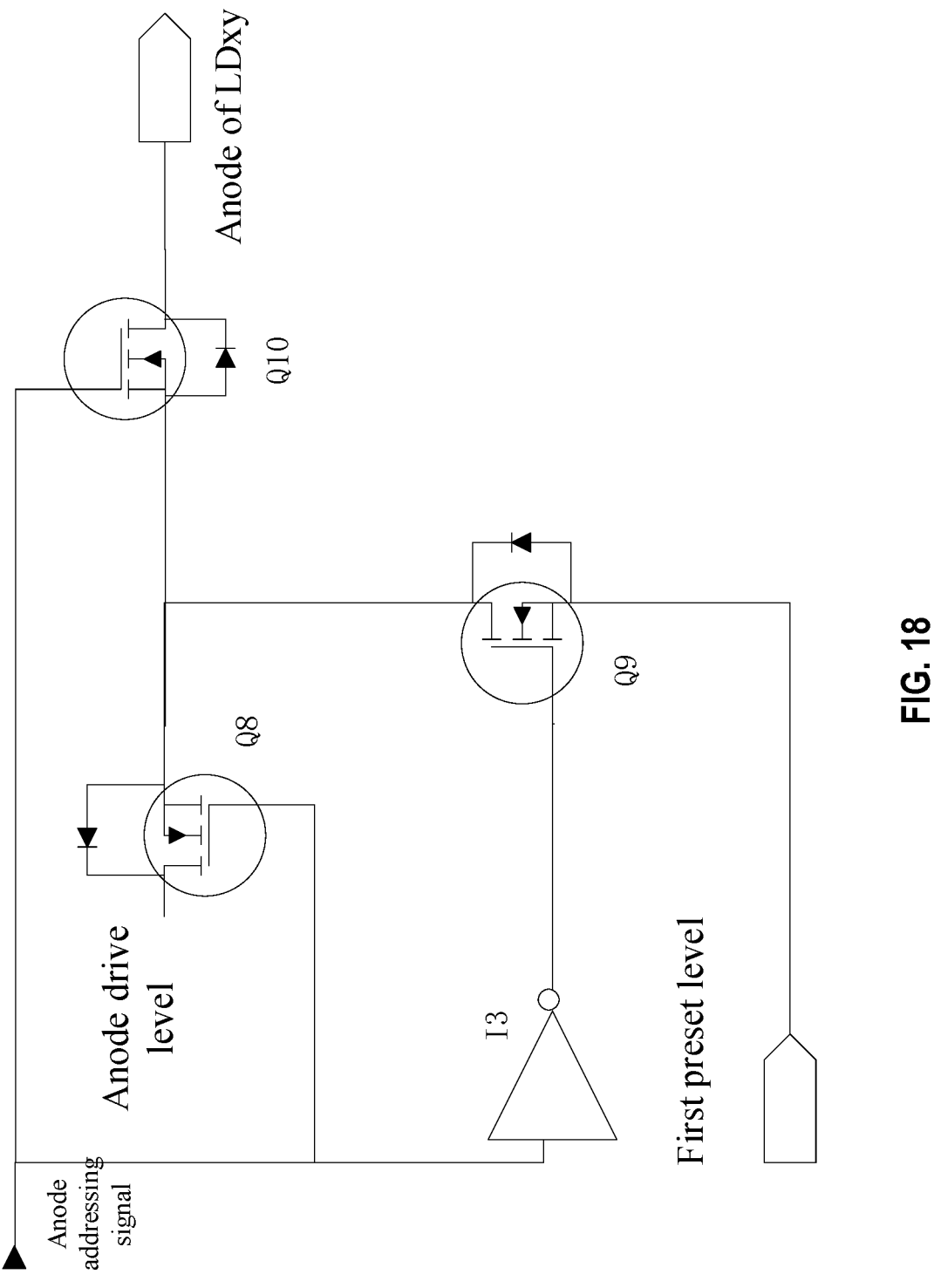
FIG. 18 is a schematic structural diagram of an anode addressing switch circuit according to some embodiments of this application.
Figure 19:
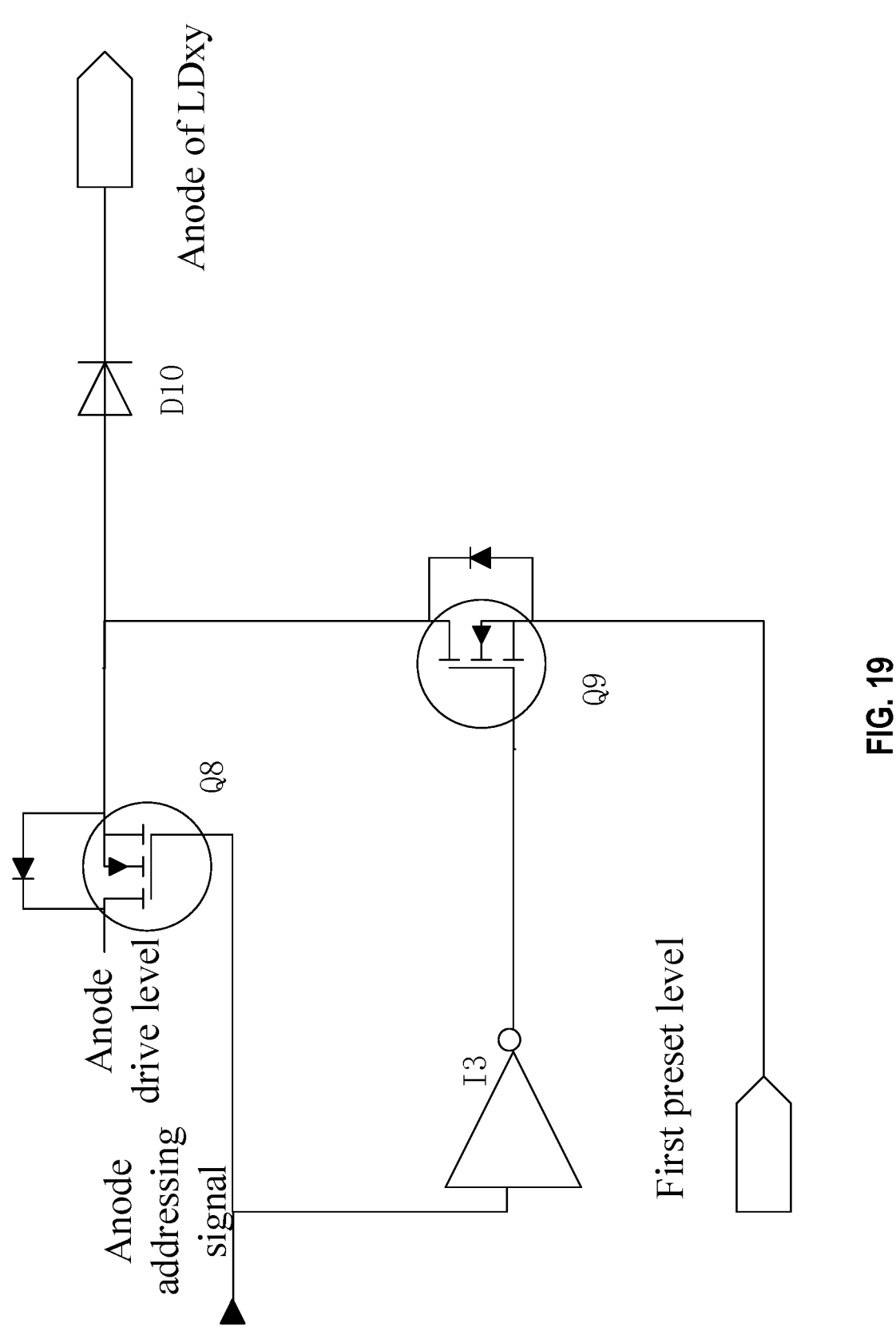
FIG. 19 is another schematic structural diagram of an anode addressing switch circuit according to some embodiments of this application.

Referring to FIG. 18 and FIG. 19, in another exemplary solution, the second anode addressing switch circuit 321 further includes a second anode unidirectional conducting element and a second anode reverse-biased switch element Q9, the second anode unidirectional conducting element is connected between a second end of the second anode addressing switch element Q8 and an anode of a laser, a second end of the second anode unidirectional conducting element is connected to the second end of the second anode addressing switch element Q8, and a first end of the second anode unidirectional conducting element is connected to the anode of the laser. The second anode reverse-biased switch element Q9 includes a first end, a second end, and an anode reverse-biased enabling end. The first end is connected to the second end of the second anode unidirectional conducting element, the second end receives a first preset level, and the anode reverse-biased enabling end receives an anode reverse-biased control signal. The anode reverse-biased control signal and the anode addressing signal are in reverse states. Specifically, when the anode addressing signal is at a high level, the anode reverse-biased control signal is at a low level; or when the anode addressing signal is at a low level, the anode reverse-biased control signal is at a high level. The anode reverse-biased control signal is used to turn off the second anode reverse-biased switch element Q9 when the second anode addressing switch element Q8 is turned on through the anode addressing signal, and the second end of the second anode unidirectional conducting element is grounded through the second cathode addressing switch element Q8, so that the second anode unidirectional conducting element is in the forward conduction state. The anode of the laser is grounded. Because a voltage at the second end of the cathode energy storage element C2 is pulled down to a difference between a ground voltage and a positive potential difference UC at a voltage conversion stage, an anode voltage of the laser is higher than a cathode voltage in this case, and the laser is driven to emit light. The anode reverse-biased control signal is also used to turn on the second anode reverse-biased switch element Q9 when the second anode addressing switch element Q8 is turned off through the anode addressing signal, and the second end of the second anode unidirectional conducting element receives the first preset level through the second anode reverse-biased switch element Q9, so that the second anode unidirectional conducting element is in a reverse-biased state and the current is prevented from flowing through the second anode addressing switch element Q8, thereby improving the isolation of the second anode addressing switch circuit 321.

In this embodiment, in a voltage application stage of the cathode energy storage element C2, the second cathode addressing switch element Q11 is turned off under the control of the cathode addressing signal, the energy storage unidirectional conducting element D2 is in the forward conduction state, the emission power supply E, the cathode energy storage element C2, the energy storage unidirectional conducting element D2, and the ground form a charging loop, the cathode energy storage element C2 is charged through the output current of the emission power supply E, and a positive potential difference is formed between the first end and the second end of the cathode energy storage element C2. When the laser LDxy is selected for light emission, the second cathode addressing switch element Q11 is first turned on under the control of the cathode addressing signal, the cathode energy storage element C2 enters the voltage conversion stage, the voltage of the second end of the cathode energy storage element C2 is pulled down to the difference between the ground voltage and the positive potential difference UC, the voltage of the cathode of the laser is pulled down to the difference between the ground voltage and the positive potential difference UC, then the second anode addressing switch element Q8 is turned on under the control of the anode addressing signal, the anode of the laser is grounded through the second anode addressing switch element Q8 and the second anode unidirectional conducting element, the voltage of the anode of the laser is higher than the voltage of the cathode, the cathode energy storage element C2 enters the energy release stage, and the laser is driven to emit light. When the laser LDxy is stopped from emitting light, the second anode addressing switch element Q8 is turned off under the control of the anode addressing signal, and the second anode reverse-biased switch element Q9 is turned on under the enablement of the anode reverse-biased control signal, so that the second anode unidirectional conducting element is in the reverse-biased state, thereby preventing the current from flowing through the second anode addressing switch element Q8, and avoiding crosstalk of electrical signals from a laser selected for light emission onto a laser LDxy stopped from emitting light.

Referring to FIG. 18, in an exemplary solution, the second anode unidirectional conducting element is a tenth NMOS transistor Q10, the second reverse-biased switch element Q9 is a ninth NMOS transistor, a source of the tenth NMOS transistor Q10 is connected to a source of the eighth NMOS transistor and a drain of the ninth NMOS transistor, a drain of the eighth NMOS transistor is connected to the anode of the laser, and a gate of the eighth NMOS transistor is connected to the anode addressing enabling end of the second anode addressing switch element Q8. When the laser LDxy is selected for light emission, at an energy release stage of the cathode energy storage element C2, the second anode addressing switch element Q8 and the tenth NMOS transistor Q10 are turned on under the enablement of the anode addressing signal, the source of the tenth NMOS transistor Q10 is grounded through the second anode addressing switch element Q8, and the tenth NMOS transistor Q10 is in the forward conduction state. When the laser LDxy is stopped from emitting light, the second anode addressing switch element Q8 and the tenth NMOS transistor Q10 are turned off under the control of the anode addressing signal, the second anode reverse-biased switch element Q9 is turned on under the enablement of the anode reverse-biased control signal, the source of the tenth NMOS transistor Q10 receives the first preset level through the second anode reverse-biased switch element Q9, and the tenth NMOS transistor Q10 is in the reverse-biased state.

In some embodiments, the voltage value of the first preset level is equal to the anode drive voltage, and the anode drive voltage is the anode ground voltage, that is, a ground voltage received by the first end of the second anode addressing switch element Q8. Specifically, the source of the second anode reverse-biased switch element Q9 is connected to the first end of the second anode addressing switch element Q8, that is, the drain of the eighth NMOS transistor.

Further, when the second anode addressing switch element Q8 and the tenth NMOS transistor Q10 are turned on under the enablement of the anode addressing signal, the anode addressing signal is at a high level greater than an anode drive level; or when the second anode addressing switch element Q8 and the tenth NMOS transistor Q10 are turned off through the anode addressing signal, the anode addressing signal is at a low level lower than the anode drive level.

Optionally, in the exemplary solution, the first preset level is greater than the anode drive level.

Referring to FIG. 19, in another exemplary solution, the second anode unidirectional conducting element is a twelfth diode D10, the second anode reverse-biased switch element Q9 is a third NMOS transistor, an anode of the twelfth diode D10 is connected to a source of the eighth NMOS transistor and a drain of the ninth NMOS transistor, and a cathode of the twelfth diode D10 is connected to the anode of the laser. When the laser LDxy is selected for light emission, at an energy release stage of the cathode energy storage element C2, the second anode addressing switch element Q8 is turned on under the enablement of the anode addressing signal, the anode of the twelfth diode D10 is grounded (connected to an anode ground) through the second anode addressing switch element Q8, and the twelfth diode D10 is in the forward conduction state. When the laser LDxy is stopped from emitting light, the second anode addressing switch element Q8 is turned off under the control of the anode addressing signal, the second anode reverse-biased switch element Q9 is turned on under the enablement of the anode reverse-biased control signal, the anode of the twelfth diode D10 receives the first preset level through the second anode reverse-biased switch element Q9, and the twelfth diode D10 is in the reverse-biased state.

In some embodiments, the voltage value of the first preset level is equal to the anode drive voltage, and the anode drive voltage is the anode ground voltage, that is, a ground voltage received by the first end of the second anode addressing switch element Q8. Specifically, the source of the second anode reverse-biased switch element Q9 is connected to the first end of the second anode addressing switch element Q8, that is, the drain of the eighth NMOS transistor.

In another embodiment, the voltage value of the first preset level is less than the anode drive voltage.

In the second anode addressing switch circuit 321 provided in this embodiment of this application, when the second anode addressing switch element Q8 is turned off, the second anode unidirectional conducting element is in a reverse-biased state, a current is prevented from flowing through the second anode addressing switch element Q8, thereby improving isolation of the second anode addressing switch circuit 321 and avoiding crosstalk of electrical signals from a laser selected for light emission onto a laser LDxy stopped from emitting light.

In some exemplary solutions, the second anode addressing switch circuit 321 further includes a second anode phase inverter I3, an input end of the second anode phase inverter I3 is connected to the anode addressing enabling end of the second anode addressing switch element Q8, and an output end of the second anode phase inverter I3 is connected to the anode reverse-biased enabling end of the second anode reverse-biased switch element Q9, so that the second anode reverse-biased switch element Q9 and the second anode addressing switch element Q8 are in reverse states.

In some other embodiments, an input end of the second anode phase inverter I2 is connected to the anode reverse-biased enabling end of the second anode reverse-biased switch element Q9, and an output end of the second anode phase inverter I2 is connected to the anode addressing enabling end of the second anode addressing switch element Q8, and in this case, the second anode reverse-biased switch element Q9 and the second anode addressing switch element Q8 can be in reverse states.

The addressable drive circuit provided in this embodiment of this application includes multiple second anode addressing drive circuits 320 that are in one-to-one correspondence with multiple shared anode ends in the two-dimensional laser array, each second anode addressing drive circuit is configured to drive anode addressing of a laser connected to the shared anode end, the multiple second cathode addressing drive circuits 420 are in one-to-one correspondence with multiple shared cathode ends in the two-dimensional laser array, and each second cathode addressing drive circuit 420 is configured to drive cathode addressing of a laser connected to the shared cathode end. The second cathode addressing drive circuit 420 includes a second cathode addressing switch circuit 421 and a second cathode energy storage circuit 422; the second cathode energy storage circuit 422 includes a cathode energy storage element C2, the cathode energy storage element C2 is configured to be charged through an output current of the emission power supply E when the second cathode addressing switch circuit 421 is turned off, to form a positive potential difference UC, so that the laser is in a reverse-biased state at a voltage application stage of the cathode energy storage element C2, thereby solving problems of light leakage and false light emission of the laser caused because the switch element includes the parallel parasitic capacitor, and improving light emission control accuracy of the two-dimensional laser array.

An embodiment of this application further provides a laser emission circuit, including a laser array and the foregoing addressable drive circuit. The laser array includes multiple lasers. Multiple lasers are arranged in two dimensions, that is, the laser array is the two-dimensional laser array. Anodes of lasers in the same row in the laser array are electrically connected and extend to form a shared anode end, and cathodes of the lasers in the same column in the laser array are electrically connected and extend to form a shared cathode end. The addressable drive circuit includes an anode addressable drive circuit 300 and a cathode addressable drive circuit 400. The anode addressable drive circuit 300 is connected to multiple shared anode ends corresponding to the multiple rows of lasers, and an anode addressing signal is externally received, to drive anode addressing for the anodes of the multiple rows of lasers through scanning; and the cathode addressable drive circuit 400 is connected to the multiple shared cathode ends corresponding to the multiple columns of lasers, and then a cathode addressing signal is externally received, to drive cathode addressing for the cathodes of the multiple columns of lasers in the laser array through scanning.

In this embodiment, the laser emission circuit concentrates the anode addressable drive circuit 300 and the cathode addressable drive circuit 400 on one side of the two-dimensional laser array, to increase reliability of the two-dimensional laser array LDm*n, for example, voltage tolerance, current flowing performance, and electrostatic protection performance.

In addition, the anode addressable drive circuit 300 is connected to the anode of the laser in the same row through the shared anode end and connected to the cathode of the laser in the same column through the shared cathode end, so that the number of channels of the two-dimensional laser array can be reduced and a manufacturing cost of the laser emission circuit is further reduced.

In this embodiment, a process of driving addressing of the laser array by the addressable drive circuit is as follows.

In the first stage, the second cathode addressing switch element Q11 in the column to which the laser selected for light emission belongs is turned off under the control of the cathode addressing signal, the cathode energy storage element C2 is charged through the output current of the emission power supply E, the cathode energy storage element C2 enters the voltage application stage, and a positive potential difference UC is formed between the first end and the second end. The voltage of the second end of the cathode energy storage element C2 is the ground voltage. That is, the voltage of the cathode of the laser is the ground voltage.

In this case, the second anode addressing switch element Q8 in a row to which the laser selected for light emission belongs is turned off under the control of the anode addressing signal. More specifically, the second anode unidirectional conducting element is in the reverse-biased state, and the second anode addressing switch circuit 321 is in a reverse-biased state.

In the second stage, the second cathode addressing switch element Q11 in the column to which the laser selected for light emission belongs is turned on under the control of the cathode addressing signal, the first end of the cathode energy storage element C2 is grounded through the second cathode addressing switch element Q11, the cathode energy storage element C2 enters the voltage conversion stage, and the voltage of the second end of the cathode energy storage element C2 is pulled down to the difference between the ground voltage and the positive potential difference UC. That is, the voltage of the cathode of the laser is pulled down to the difference between the ground voltage and the positive potential difference UC.

In the third stage, the second anode addressing switch element Q8 in a row to which the laser selected for light emission belongs is turned on under the control of the anode addressing signal. More specifically, the second anode unidirectional conducting element is in a forward conduction state, the first end of the second anode unidirectional conducting element is grounded through the second anode addressing switch element Q8. That is, the voltage of the anode of the laser is the ground voltage. In this case, the voltage of the anode of the laser is greater than the voltage of the cathode of the laser, and the laser is in a forward conduction state and is driven to emit light.

When the current laser selected for light emission finishes emitting light, the second cathode addressing switch element Q11 in the column to which the current laser selected for light emission belongs is turned off under the control of the cathode addressing signal, then a second cathode addressing switch element Q11 of the next laser selected for light emission is turned on under the control of the cathode addressing signal, and the second anode addressing switch element Q8 of the next laser selected for light emission is turned on under the control of the anode addressing signal.

Further, when the multiple rows of second anode addressing drive circuits 320 corresponding to the multiple lasers are turned on under the enablement of the anode addressing signal and the multiple columns of second cathode addressing drive circuits 420 corresponding to the multiple lasers are turned on under the enablement of the cathode addressing signal, the multiple lasers can emit light simultaneously.

An embodiment of this application also provides a LiDAR, the LiDAR includes the foregoing laser emission circuit, and the LiDAR generates a laser beam through the foregoing laser emission circuit, emits the laser beam toward a detection region, and then cooperates with a laser receiving device in the LiDAR. An echo beam reflected from a target is received by the laser receiving device, and then data is properly processed by a signal processing system, to obtain information such as distance, speed, azimuth, attitude and even shape of the target, which can be applied to navigation avoidance, obstacle recognition, ranging, speed measurement, autonomous driving and other scenarios of an automobile, a robot, a logistics vehicle, a patrol vehicle, and other products.

The LiDAR provided in this embodiment of this application uses the foregoing laser emission circuit. The addressable drive circuit in a laser emission circuit includes multiple second anode addressing drive circuits 320 that are in one-to-one correspondence with multiple shared anode ends in the two-dimensional laser array, each second anode addressing drive circuit 320 is configured to drive anode addressing of a laser connected to the shared anode end, the multiple second cathode addressing drive circuits 420 are in one-to-one correspondence with multiple shared cathode ends in the two-dimensional laser array, and each second cathode addressing drive circuit 420 is configured to drive cathode addressing of a laser connected to the shared cathode end. The second cathode addressing drive circuit 420 includes a second cathode addressing switch circuit 421 and a second cathode energy storage circuit 422; the second cathode energy storage circuit 422 includes a cathode energy storage element C2, the cathode energy storage element C2 is configured to be charged through an output current of the emission power supply E when the second cathode addressing switch circuit 421 is turned off, to form a positive potential difference, so that the laser is in a reverse-biased state at a voltage application stage of the cathode energy storage element C2, thereby solving problems of light leakage and false light emission of the laser caused because the switch element includes the parallel parasitic capacitor, and improving light emission control accuracy of the laser array and performance of the LiDAR.

Embodiment 7

Figure 20:
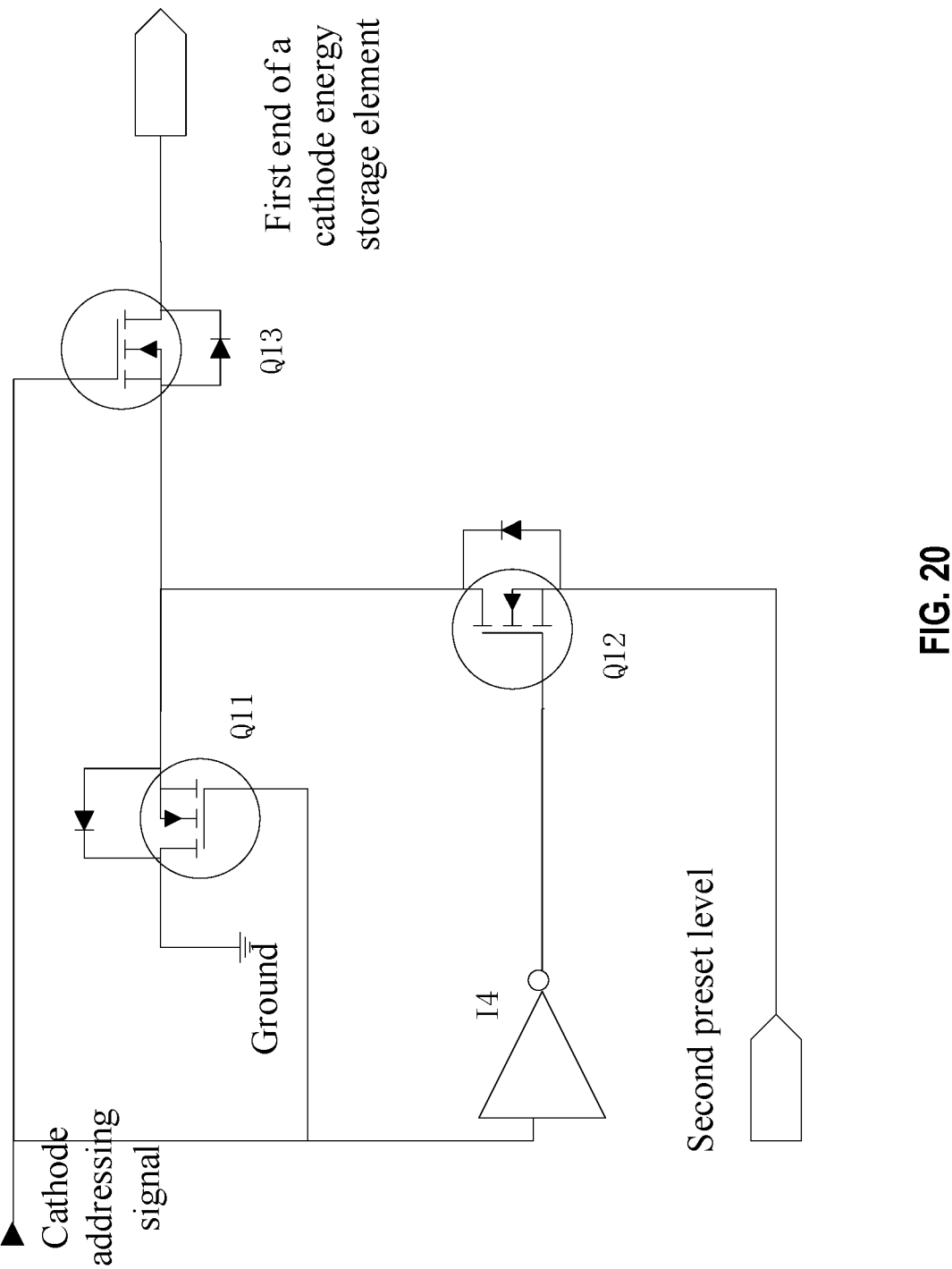
FIG. 20 is a schematic structural diagram of a cathode addressing switch circuit according to some embodiments of this application.
Figure 21:
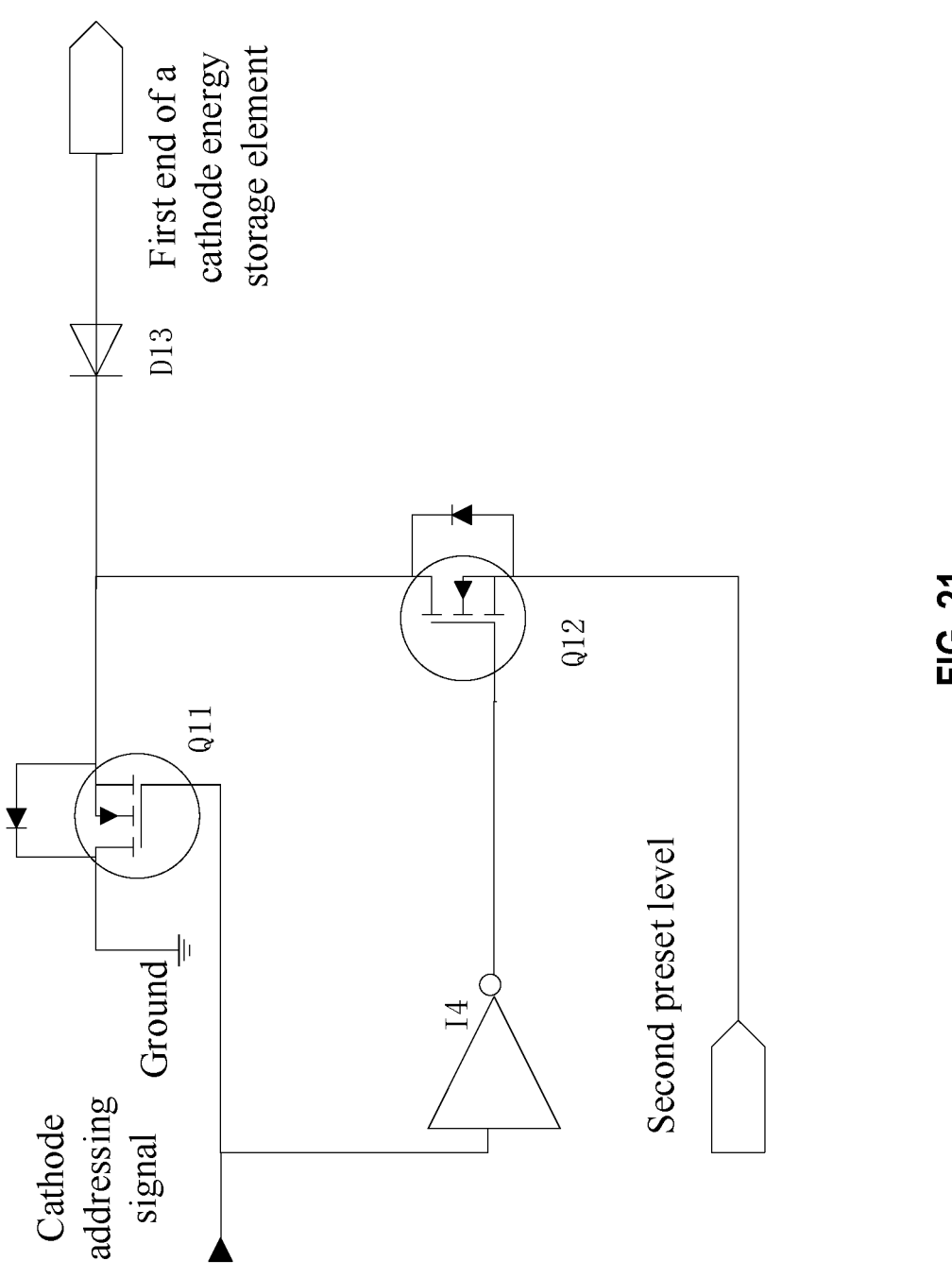
FIG. 21 is another schematic structural diagram of a cathode addressing switch circuit according to some embodiments of this application.

Referring to FIG. 20 and FIG. 21, to solve problems that isolation of a second cathode addressing switch circuit 421 is reduced and a laser unselected for light emission emits light because of the crosstalk of electrical signals of a laser selected for light emission, because a second cathode addressing switch element Q11 includes a parasitic capacitor, a difference between the second cathode addressing switch circuit 421 provided in this embodiment and that in Embodiment 1 is that the second cathode addressing switch circuit 421 further includes a second cathode unidirectional conducting element and a second cathode reverse-biased switch element Q12, the second cathode unidirectional conducting element is connected between a first end of a cathode energy storage element C2 and the second cathode addressing switch element Q11, a first end of the second cathode unidirectional conducting element is connected to the first end of the cathode energy storage element C2, the second end of the second cathode unidirectional conducting element is connected to a second end of the second cathode addressing switch element Q11, and the first end of the second cathode addressing switch element Q11 is grounded (connected to the cathode ground). The second cathode reverse-biased switch element Q12 includes a first end, a second end, and a cathode reverse-biased enabling end. The first end is connected to the second end of the second cathode unidirectional conducting element, the second end receives a second preset level, and the cathode reverse-biased enabling end receives a cathode reverse-biased control signal. The cathode reverse-biased control signal is used to turn off the second cathode reverse-biased switch element Q12 when the second cathode addressing switch element Q11 is turned on through the cathode addressing signal, and the second end of the second cathode unidirectional conducting element is connected to the cathode ground through the second cathode addressing switch element Q11, so that the second cathode unidirectional conducting element is in the forward conduction state. The cathode reverse-biased control signal is also used to turn on the second cathode reverse-biased switch element Q12 when the second cathode addressing switch element Q11 is turned off through the cathode addressing signal, the second end of the second cathode unidirectional conducting element receives the second preset level through the second cathode reverse-biased switch element Q12, and a voltage value of the second preset level is greater than or equal to a voltage value of the cathode ground, so that the second cathode unidirectional conducting element is in a reverse-biased state and the current is prevented from flowing through the second cathode addressing switch element Q10, thereby improving the isolation of the second cathode addressing switch circuit 421.

In an exemplary solution, the second preset level received by the second end of the second cathode reverse-biased switch element Q12 is the anode drive voltage, and the anode drive level is a voltage received by the first end of the second anode addressing switch element Q8, that is, the ground voltage (anode ground). In this embodiment, in a voltage application stage of the cathode energy storage element C2, the second cathode addressing switch element Q11 is turned off under the control of the cathode addressing signal, the second cathode unidirectional conducting element is in a reverse-biased state, the energy storage unidirectional conducting element D2 is in the forward conduction state, the emission power supply E, the cathode energy storage element C2, the energy storage unidirectional conducting element D2, and the ground form a charging loop, the cathode energy storage element C2 is charged through the output current of the emission power supply E, and a positive potential difference UC is formed between the first end and the second end of the cathode energy storage element C2. When the laser LDxy is selected for light emission, the second cathode addressing switch element Q11 is turned on under the control of the cathode addressing signal, the second cathode unidirectional conducting element is in the forward conduction state, a first end of a cathode energy storage element C2 is grounded through the second cathode unidirectional conducting element and the second cathode addressing switch element Q11, the cathode energy storage element C2 enters the voltage conversion stage, the voltage of the second end of the cathode energy storage element C2 is pulled down to the difference between the ground voltage and the positive potential difference UC, the voltage of the cathode of the laser is pulled down to the difference between the ground voltage and the positive potential difference UC, then the second anode addressing switch element Q8 is turned on under the control of the anode addressing signal, the anode of the laser is grounded through the second anode addressing switch element Q8, the voltage of the anode of the laser is higher than the voltage of the cathode, the cathode energy storage element C2 enters the energy release stage, and the laser is driven to emit light. When the laser LDxy is stopped from emitting light, the second cathode addressing switch element Q11 is turned off under the control of the anode addressing signal, and the second cathode reverse-biased switch element Q12 is turned on under the enablement of the cathode reverse-biased control signal, so that the second cathode unidirectional conducting element is in the reverse-biased state, thereby preventing the current from flowing through the second cathode addressing switch element Q11, and avoiding cross-talk of electrical signals from a laser selected for light emission onto a laser LDxy stopped from emitting light.

Referring to FIG. 20, in an exemplary solution in this embodiment, the second cathode unidirectional conducting element is a thirteenth NMOS transistor Q13, the second cathode reverse-biased switch element Q12 is the twelfth NMOS transistor, a drain of the thirteenth NMOS transistor Q13 serves as a first end of the second cathode unidirectional conducting element to be connected to a first end of a cathode energy storage element C2, and a source of the thirteenth NMOS transistor Q13 serves as a second end of the second cathode unidirectional conducting element to be connected to a second end of the eleventh NMOS transistor and a drain of the twelfth NMOS transistor. A gate of the thirteenth NMOS transistor Q13 is connected to a gate of the eleventh NMOS transistor, a source of the twelfth NMOS transistor receives the second preset voltage, and the gate of the twelfth NMOS transistor is connected to the gate of the eleventh NMOS transistor through a second cathode phase inverter I4. When the laser LDxy is selected for light emission, at a voltage conversion stage of the cathode energy storage element C2, the eleventh NMOS transistor and the thirteenth NMOS transistor Q13 are turned on under the enablement of the cathode addressing signal, the source of the thirteenth NMOS transistor Q13 is connected to the cathode ground through the eleventh NMOS transistor, and the thirteenth NMOS transistor Q13 is in the forward conduction state. Because voltage drops of the eleventh NMOS transistor and the thirteenth NMOS transistor Q13 in the turn-on state are small, a drain voltage of the thirteenth NMOS transistor Q13 is close to a voltage value of the cathode ground, when the laser LDxy is stopped from emitting light, the eleventh NMOS transistor is turned off under the control of the cathode addressing signal, the twelfth NMOS transistor is turned on under the enablement of the cathode reverse-biased control signal, the source of the thirteenth NMOS transistor Q13 receives the second preset level through the twelfth NMOS transistor, the volt-age value of the second preset level is greater than or equal to the voltage value of the cathode ground, and the thirteenth NMOS transistor Q13 is switched to the reverse-biased state. In this embodiment, when the eleventh NMOS tran-sistor is turned on under the enablement of the cathode addressing signal, the cathode addressing signal is at a high level greater than the voltage value of the cathode ground; or when the eleventh NMOS transistor is turned off under the control of the cathode addressing signal, the cathode addressing signal is at a low level lower than the voltage value of the cathode ground.

Referring to FIG. 21, in another exemplary solution, the second cathode unidirectional conducting element is the thirteenth diode D13, the second cathode reverse-biased switch element Q12 is the twelfth NMOS transistor, an anode of the thirteenth diode D13 is connected to a first end of a cathode energy storage element C2, and a cathode of the thirteenth diode D13 is connected to the second end of the eleventh NMOS transistor and the first end of the twelfth NMOS transistor. When the laser LDxy is selected for light emission, at a voltage conversion stage of the cathode energy storage element C2, the eleventh NMOS transistor is turned on under the enablement of the cathode addressing signal, the cathode of the thirteenth diode D13 is connected to the cathode ground through the eleventh NMOS transis-tor, and the thirteenth diode D13 is in the forward conduc-tion state. Because voltage drops of the eleventh NMOS transistor and the thirteenth diode D13 in the turn-on state are small, an anode voltage of the thirteenth diode D13 is close to a voltage value of the cathode ground. When the laser LDxy is stopped from emitting light, the eleventh NMOS transistor is turned off under the control of the cathode addressing signal, the twelfth NMOS transistor is turned on under the enablement of the cathode reverse-biased control signal, the cathode of the thirteenth diode D13 receives the second preset level through the twelfth NMOS transistor, the cathode voltage (second preset level) of the thirteenth diode D13 is greater than or equal to the anode voltage (voltage value of the cathode ground), and the thirteenth diode D13 is switched to the reverse-biased state.

In some exemplary solutions, the second cathode address-ing switch circuit 421 further includes a second cathode phase inverter I4, an input end of the second cathode phase inverter I4 is connected to the cathode addressing enabling end of the eleventh NMOS transistor, and an output end of the second cathode phase inverter I4 is connected to the cathode reverse-biased enabling end of the twelfth NMOS transistor, so that the twelfth NMOS transistor and the eleventh NMOS transistor are in reverse states.

In some other embodiments, an input end of the second cathode phase inverter I4 is connected to the cathode reverse-biased enabling end of the twelfth NMOS transistor, an output end of the second cathode phase inverter I4 is connected to the cathode addressing enabling end of the eleventh NMOS transistor, and in this case, the twelfth NMOS transistor and the eleventh NMOS transistor can be in reverse states.

In the second cathode addressing switch circuit 421 provided in this embodiment of this application, when the second cathode addressing switch element Q11 is turned off, the second cathode unidirectional conducting element is in a reverse-biased state, and a current is prevented from flowing through the second cathode addressing switch ele-ment Q11, thereby improving isolation of the second cath-ode addressing switch circuit 421 and reducing crosstalk of electrical signals from a laser selected for light emission onto a laser LDxy stopped from emitting light.

Embodiment 8

A difference between this embodiment and Embodiment 2 is as follows. The second cathode addressing switch element Q11 is the eleventh NMOS transistor, the second cathode reverse-biased switch element Q12 is the twelfth PMOS transistor, the source of the twelfth PMOS transistor serves as the second end of the second cathode reverse-biased switch element Q12 to receive the second preset level, the drain of the twelfth PMOS transistor serves as the first end of the second cathode reverse-biased switch ele-ment Q12 to be connected to the second end of the eleventh NMOS transistor and the second end of the second cathode unidirectional conducting element, and the gate of the twelfth PMOS transistor serves as the cathode reverse-biased enabling end to receive the cathode reverse-biased control signal. The twelfth PMOS transistor is turned on or off under the control of the cathode reverse-biased control signal.

A voltage condition $V_{GS}$ when the cathode reverse-biased control signal drives the twelfth PMOS transistor to be turned on is opposite to a voltage condition $V_{GS}$ when the cathode reverse-biased control signal drives the twelfth PMOS transistor to be turned on, where $V_{GS}=V_G-V_S$, $V_G$ is a gate voltage of the MOS transistor (the twelfth NMOS transistor or the twelfth PMOS transistor), and $V_S$ is a source voltage of the MOS transistor (the twelfth NMOS transistor or the twelfth PMOS transistor). For example, a condition for turning on the twelfth NMOS transistor is that $V_{GS}$ of the sixteenth NMOS transistor is greater than or equal to $V_{th}$. In this case, the cathode reverse-biased control signal is at a high level when the twelfth NMOS transistor is turned on, and the cathode reverse-biased control signal is at a low level when the twelfth NMOS transistor is turned off. A condition for turning on the twelfth PMOS transistor is that $V_{GS}$ of the sixteenth PMOS transistor is less than or equal to $V_{th}$. In this case, the cathode reverse-biased control signal is at a low level when the twelfth PMOS transistor is turned on, and the cathode reverse-biased control signal is at a high level when the twelfth PMOS transistor is turned off.

In an exemplary solution in this embodiment, the second cathode unidirectional conducting element is a thirteenth NMOS transistor Q13, a drain of the thirteenth NMOS transistor Q13 serves as a first end of the second cathode unidirectional conducting element to be connected to a first end of a cathode energy storage element C2, and a source of the thirteenth NMOS transistor Q13 serves as the second end of the cathode unidirectional conducting element to be connected to the second end of the eleventh NMOS transistor and a drain of the twelfth PMOS transistor. A gate of the thirteenth NMOS transistor Q13 is connected to a gate of the eleventh NMOS transistor, a source of the twelfth PMOS transistor receives the second preset voltage, and the gate of the twelfth PMOS transistor is connected to the gate of the eleventh NMOS transistor. When the laser LDxy is selected for light emission, at a voltage conversion stage of the cathode energy storage element C2, the eleventh NMOS transistor is turned on under the enablement of the cathode addressing signal, the thirteenth NMOS transistor Q13 is turned on under the enablement of the cathode addressing drive signal, the source of the thirteenth NMOS transistor Q13 is connected to the cathode ground through the eleventh NMOS transistor, and the thirteenth NMOS transistor Q13 is in the forward conduction state. Because voltage drops of the eleventh NMOS transistor and the thirteenth NMOS transistor Q13 in the turn-on state are small, a drain voltage of the thirteenth NMOS transistor Q13 is close to a voltage value of the cathode ground. When the laser LDxy is stopped from emitting light, the eleventh NMOS transistor is turned off under the control of the cathode addressing signal, the twelfth PMOS transistor is turned on under the enablement of the cathode reverse-biased control signal, the source of the thirteenth NMOS transistor Q13 receives the second preset level through the twelfth PMOS transistor, the voltage value of the second preset level is greater than or equal to the voltage value of the cathode ground, and the thirteenth NMOS transistor Q13 is switched to the reverse-biased state.

In this case, when the twelfth PMOS transistor is turned on under the enablement of the cathode addressing signal, the cathode addressing signal is at a high level greater than that of the cathode ground; or when the twelfth PMOS transistor is turned off under the control of the cathode addressing signal, the cathode addressing signal is at a low level lower than or equal to that of the cathode ground.

In this embodiment, the gate of the thirteenth NMOS transistor Q13 is connected to the gate of the eleventh NMOS transistor, to ensure that the thirteenth NMOS transistor Q13 and the eleventh NMOS transistor are in the same state. The gate of the twelfth PMOS transistor is connected to the gate of the eleventh NMOS transistor, so that the twelfth PMOS transistor and the eleventh NMOS transistor are in the same state.

When the cathode addressing signal is at the high level, the eleventh NMOS transistor and the thirteenth NMOS transistor are turned on under the control of the cathode addressing signal, the twelfth PMOS transistor is turned off under the control of the cathode reverse-biased control signal, and a source of the thirteenth NMOS transistor is grounded through the eleventh NMOS transistor, so that the thirteenth NMOS transistor is in the forward conduction state. When the cathode addressing signal is at the low level, the eleventh NMOS transistor and the thirteenth NMOS transistor are turned off under the control of the cathode addressing signal, and the twelfth PMOS transistor enables the source of the thirteenth NMOS transistor to receive the second preset level, so that the thirteenth NMOS transistor is in the reverse-biased state.

In another exemplary solution, the second cathode unidirectional conducting element is the thirteenth diode D13, an anode of the thirteenth diode D13 is connected to a first end of a cathode energy storage element C2, and a cathode of the thirteenth diode D13 is connected to the second end of the eleventh NMOS transistor and the first end of the twelfth PMOS transistor. A source of the twelfth PMOS transistor receives a second preset voltage, and a gate of the twelfth PMOS transistor is connected to a gate of the eleventh NMOS transistor. When the laser LDxy is selected for light emission, at a voltage conversion stage of the cathode energy storage element C2, the eleventh NMOS transistor is turned on under the enablement of the cathode addressing signal, the cathode of the thirteenth diode D13 is connected to the cathode ground through the eleventh NMOS transistor, and the thirteenth diode D13 is in the forward conduction state. Because voltage drops of the eleventh NMOS transistor and the thirteenth diode D13 in the turn-on state are small, an anode voltage of the thirteenth diode D13 is close to a voltage value of the cathode ground. When the laser LDxy is stopped from emitting light, the eleventh NMOS transistor is turned off under the control of the cathode addressing signal, the twelfth PMOS transistor is turned on under the enablement of the cathode reverse-biased control signal, the cathode of the thirteenth diode D13 receives the second preset level through the twelfth PMOS transistor, the cathode voltage (second preset level) of the thirteenth diode D13 is greater than or equal to the anode voltage (voltage value of the cathode ground), and the thirteenth diode D13 is switched to the reverse-biased state.

In an exemplary solution, when the eleventh NMOS transistor is turned on under the enablement of the cathode addressing signal, the cathode addressing signal is at a low level greater than the ground voltage; or when the eleventh NMOS transistor is turned off under the control of the anode addressing signal, the cathode addressing signal is at a high level lower than the ground voltage.

When the cathode addressing signal is at the high level, the eleventh NMOS transistor is turned on under the control of the cathode addressing signal, the twelfth PMOS transistor is turned off under the control of the cathode reverse-biased control signal, and a cathode of the thirteenth diode D13 is grounded through the eleventh NMOS transistor, so that the thirteenth diode D13 is in the forward conduction state. When the cathode addressing signal is at the low level, the eleventh NMOS transistor is turned off under the control of the cathode addressing signal, the twelfth PMOS transistor is turned on under the control of the cathode reverse-biased control signal, and the twelfth PMOS transistor enables the cathode of the thirteenth diode D13 to receive the first preset level, so that the thirteenth diode D13 is in the reverse-biased state.

In the second cathode addressing switch circuit 421 provided in this embodiment of this application, when the second cathode addressing switch element Q11 is turned off, the second cathode unidirectional conducting element is in a reverse-biased state, a current is prevented from flowing through the second cathode addressing switch element Q11, thereby improving isolation of the second cathode addressing switch circuit 421 and avoiding crosstalk of electrical signals from a laser selected for light emission onto a laser LDxy stopped from emitting light.

Embodiment 9

Figure 22:
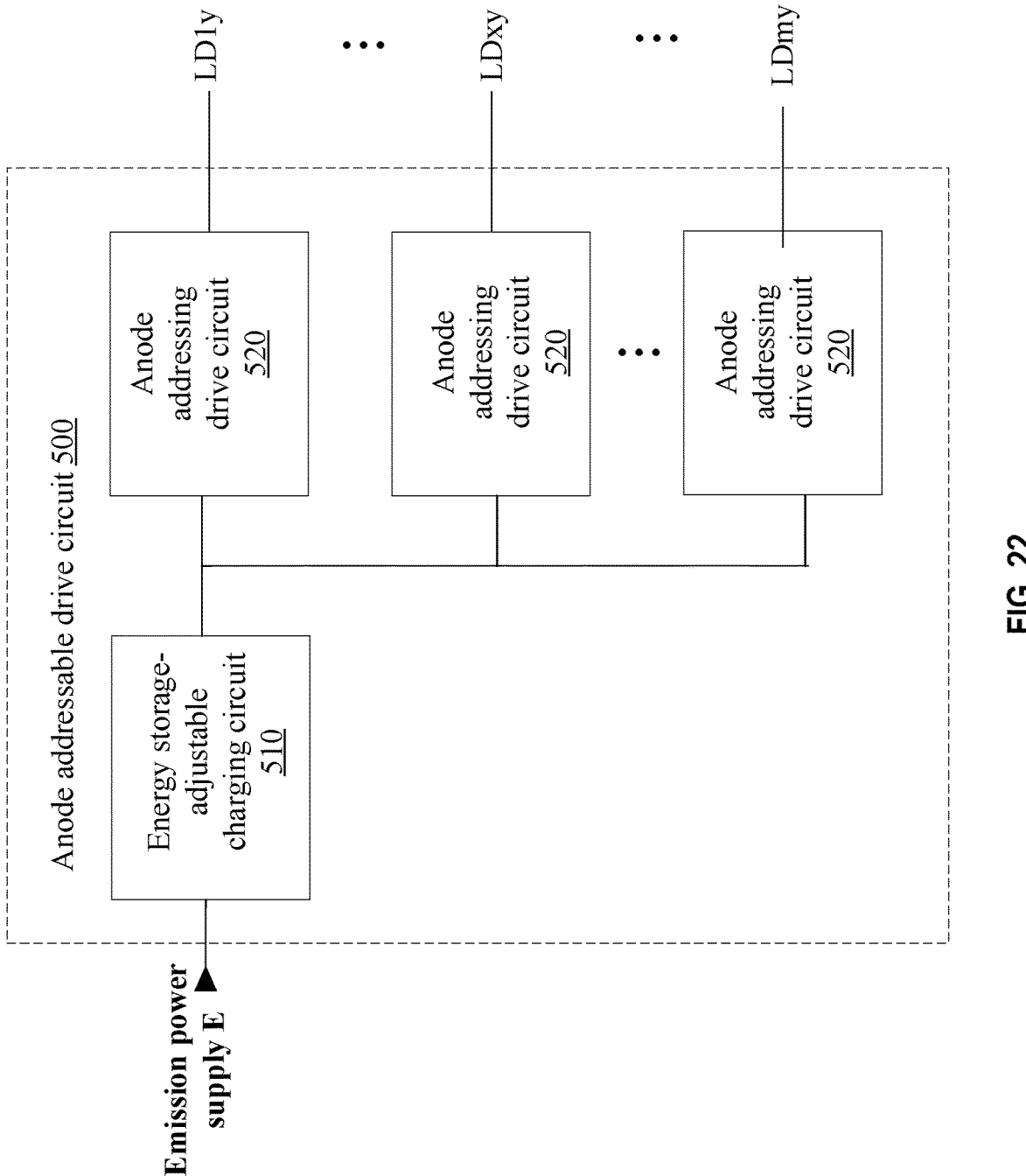
FIG. 22 is a schematic diagram of a framework of an anode addressable drive circuit according to some embodiments of this application.
Figure 26:
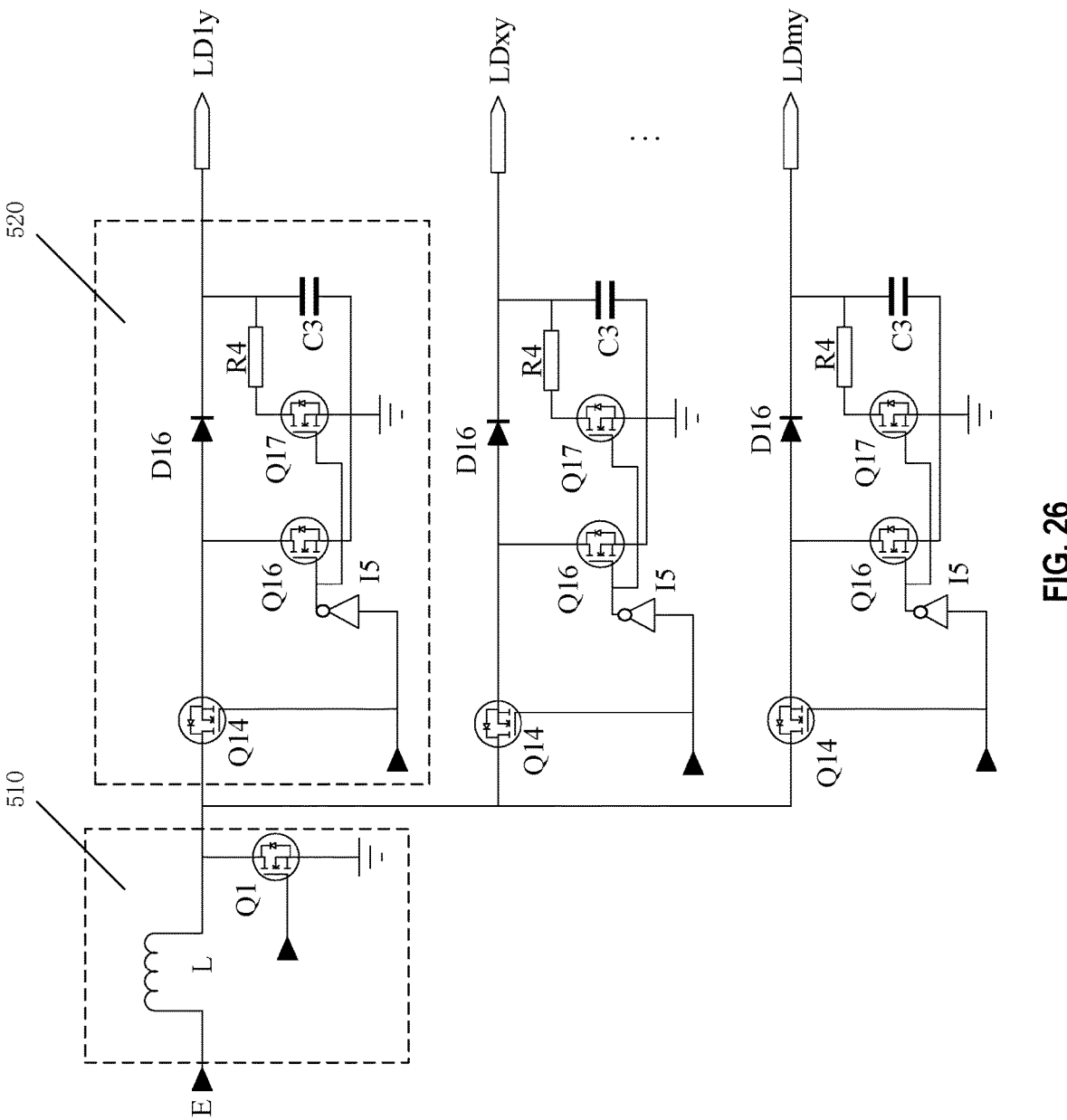
FIG. 26 is a schematic structural diagram of an anode addressable drive circuit according to some embodiments of this application.
Figure 27:
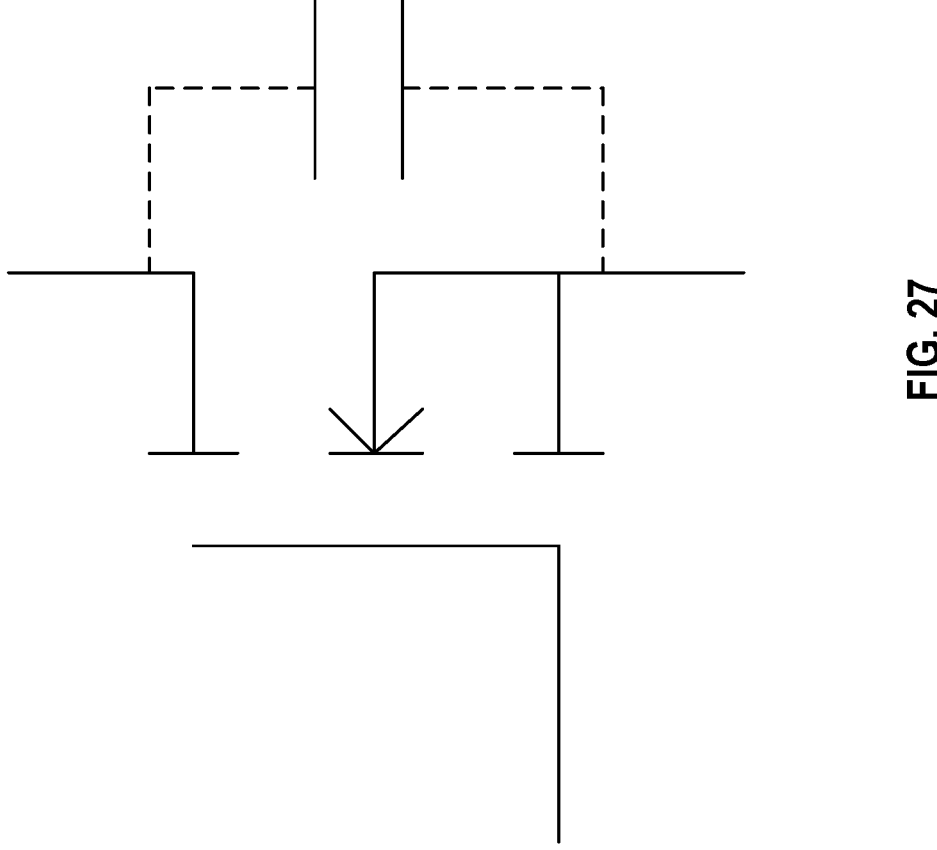
FIG. 27 is a schematic diagram of a cathode addressing switch and a parallel parasitic capacitor according to some embodiments of this application.

There is also the following technical problem in the related art. The current output by the emission power supply E to the laser selected for light emission remains unchanged, and as a result, light emission power of the laser selected for light emission remains unchanged, that is, the light emission power of the laser cannot be adjusted. To solve the problem that the light emission power of the laser cannot be adjusted, an embodiment of this application provides a third anode addressable drive circuit 500. Referring to FIG. 22 and FIG. 26, the third anode addressable drive circuit 500 provided in this embodiment of this application includes an energy storage-adjustable charging circuit 510 and multiple third anode addressing drive circuits 520, the energy storage-adjustable charging circuit 510 is connected to the emission power supply E and the multiple third anode addressing drive circuits 520, stores electric energy through the output current of the emission power supply E, and outputs a charging current with an adjustable value to the third anode addressing drive circuit 520 in the turn-on state. An x$^{th}$ third anode addressing drive circuit 520 is connected to the anode of the laser LDxy in the laser array through the shared anode end connected in one-to-one correspondence, x represents a specific row of lasers, and x is a positive integer, where x=1, 2, . . . , m, and m is the total number of third anode addressing drive circuits 520, and is also the total number of shared anode ends; and y represents a specific column of lasers, and y is a positive integer, where y=1, 2, . . . , n, and n is the total number of third cathode addressing drive circuit 620, and is also the total number of shared cathode ends.

In this embodiment, in the third anode addressable drive circuit 500, a charging current with an adjustable value is output to the third anode addressing drive circuit 520 in the turn-on state through the third energy storage-adjustable charging circuit 510, so that a value of the current output by the third anode addressing drive circuit 520 to the laser can be adjusted, and the light emission power of the laser can be adjusted.

Figure 23:
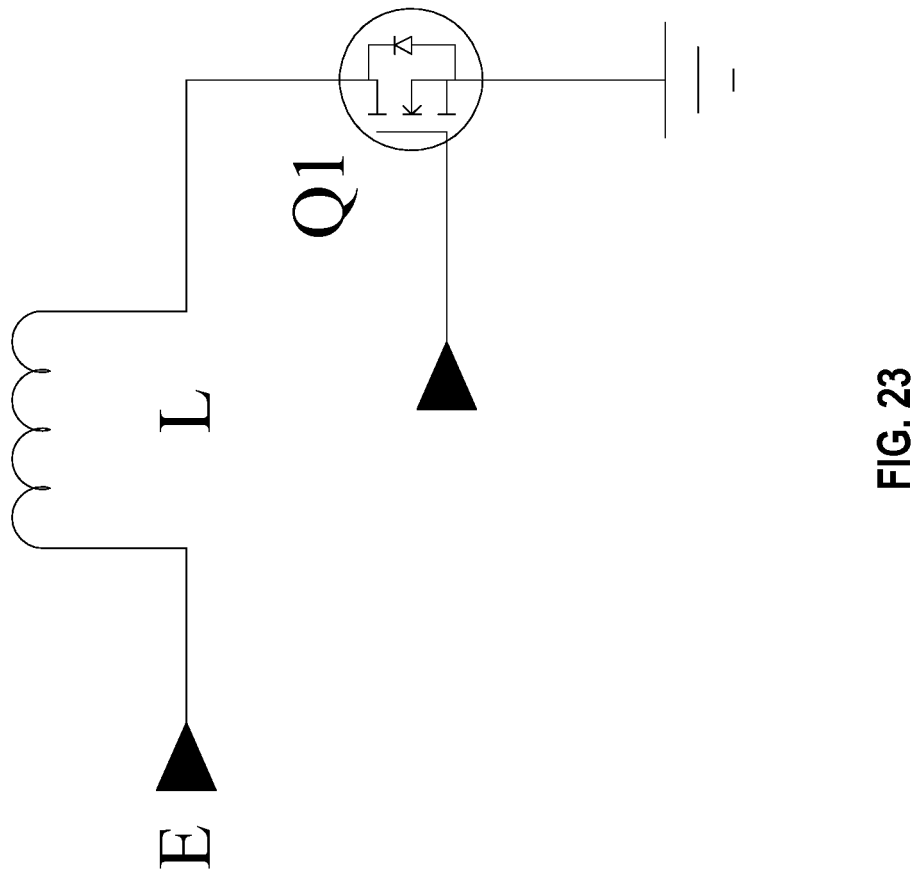
FIG. 23 is a schematic structural diagram of an energy storage-adjustable charging circuit according to some embodiments of this application.
Figure 24:
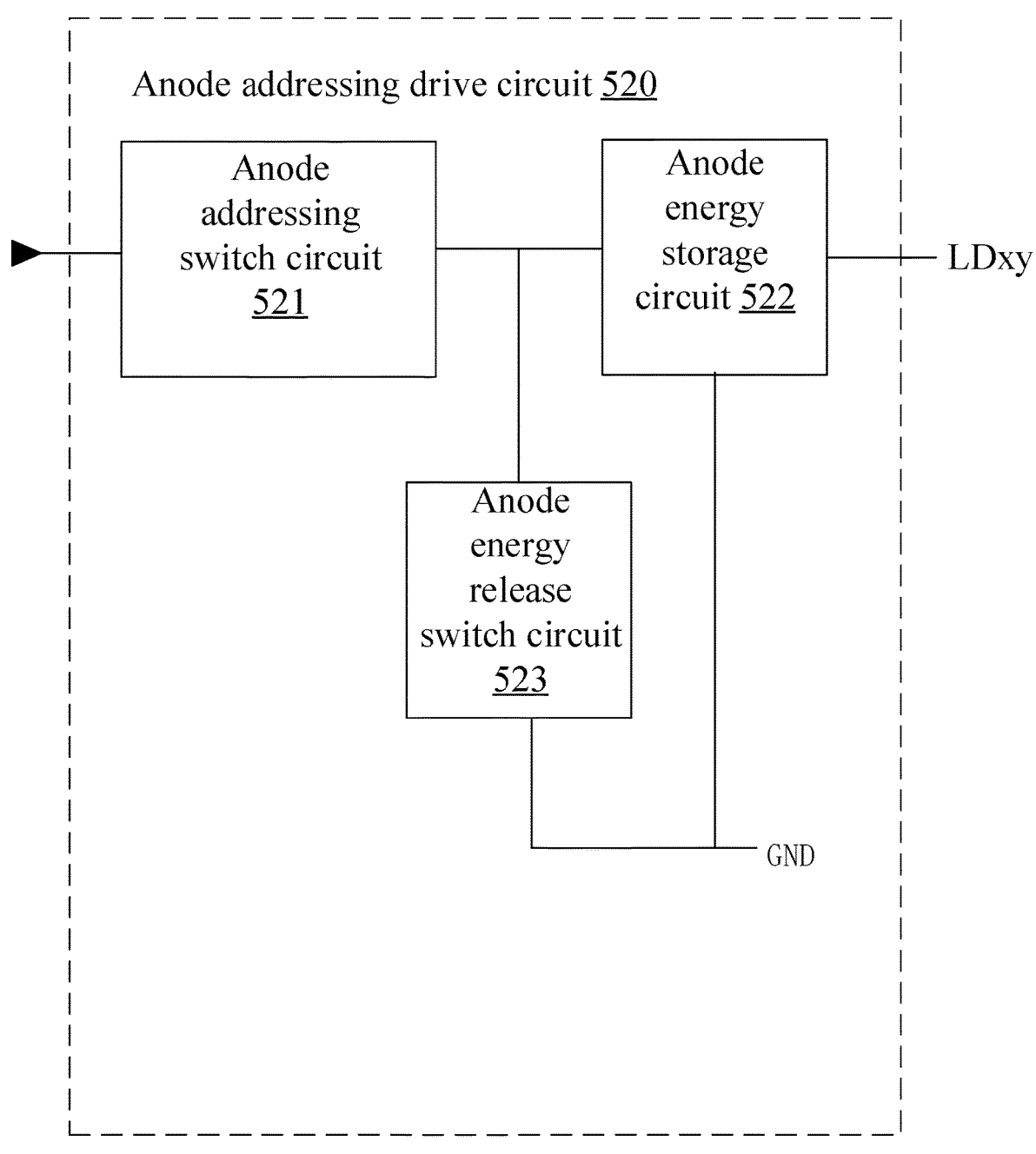
FIG. 24 is a schematic structural diagram of a framework of an anode addressing drive circuit according to some embodiments of this application.

As shown in FIG. 23, in an exemplary solution, the energy storage-adjustable charging circuit 510 includes a transitory energy storage element L and a charging switch element Q1, and the charging switch element Q1 includes a first end, a second end, and a charging enabling end. A first end of the transitory energy storage element L is connected to the emission power supply E, a second end of the transitory energy storage element L is connected to the first end of the charging switch element Q1, and the second end of the charging switch element Q1 is grounded. The charging enabling end of the charging switch element Q1 receives a charging control signal, and the charging control signal is used to turn on or off the charging switch element Q1. When the charging switch element Q1 is turned on, the emission power supply E, the transitory energy storage element L, the charging switch element Q1, and the ground form a first charging loop, the transitory energy storage element L stores electric energy through the output current of the emission power supply E, and when the charging switch element Q1 is turned off, the transitory energy storage element L stops storing electric energy.

Further, the second end of the transitory energy storage element L is also connected to the third anode addressing drive circuit 520, to transmit the stored energy to the third anode addressing drive circuit 520, and the third anode addressing drive circuit 520 outputs a current to drive the laser LDxy to emit light.

In some embodiments, the output current of the emission power supply E is a fixed value, and turn-on time of the charging switch element Q1 controlled by the charging control signal is adjustable, so that an amount of energy stored in the transitory energy storage element L is adjustable. When the turn-on time of the charging switch element Q1 is prolonged, the energy stored in the transitory energy storage element L is increased; or when the turn-on time of the charging switch element Q1 is shortened, the energy stored in the transitory energy storage element L is decreased.

In another exemplary solution, the value of the output current of the emission power supply E is adjustable, and turn-on time of the charging switch element Q1 controlled by the charging control signal remains unchanged, so that the amount of energy stored in the transitory energy storage element L is adjustable. When the output current of the emission power supply E increases, the amount of energy stored in the transitory energy storage element L increases; or when the output current of the emission power supply E decreases, the amount of energy stored in the transitory energy storage element L decreases.

In this embodiment, the amount of energy stored in the transitory energy storage element L is adjustable, to output a charging current with an adjustable value to the third anode addressing drive circuit 520 in the turn-on state, so that a value of the current output by the third anode addressing drive circuit 520 to the laser is adjustable, and the light emission power of the laser is adjustable.

Specifically, the transitory energy storage element L is configured to store energy, and also configured to release the stored energy.

In some embodiments, the transitory energy storage element L includes an energy storage inductor, and the energy storage inductor can convert electrical energy into magnetic energy for storage.

In some other exemplary solutions, the transitory energy storage element L includes an energy storage capacitor, and the energy storage capacitor is formed by sandwiching a layer of insulating dielectric between two metal electrodes. When a voltage is applied between the two metal electrodes, the electrodes store electric charge to store energy.

Although the energy storage inductor and the energy storage capacitor store and release energy in different methods, both the energy storage inductor and the energy storage capacitor can be used as elements for storing and releasing energy. In this application, a structure and type of the transitory energy storage element L are not specifically limited.

In some embodiments, the charging switch element Q1 is a first NMOS transistor, a drain of the first NMOS transistor serves as the first end of the charging switch element Q1 to be connected to the second end of the transitory energy storage element L, a source of the first NMOS transistor serves as a second end of the charging switch element Q1 to be grounded, a gate of the first NMOS transistor is the charging enabling end for receiving the charging control signal, and the first NMOS transistor is turned on or off under the control of the charging control signal.

In this embodiment, the emission power supply E is connected to the energy storage-adjustable charging circuit 510, to charge the energy storage-adjustable charging circuit 510. A value of the output current of the energy storage-adjustable charging circuit 510 is positively correlated with the energy stored in the transitory energy storage element L in the energy storage-adjustable charging circuit 510. When the light emission power of the laser needs to be increased, the turn-on time of the charging switch element Q1 can be controlled by using the charging control signal, to increase the energy stored in the transitory energy storage element L and further increase a charging current output by the transitory energy storage element L to the anode energy storage element, thereby adjusting the light emission power of the laser LD by using the anode energy storage element.

It should be noted that the light emission power of the laser depends on the energy stored in the energy storage-adjustable charging circuit 510, that is, the energy stored in the energy storage-adjustable charging circuit 510 can be adjusted based on the target light emission power of the laser. It should be noted that because the third anode energy storage element C3 is connected to the anode of the laser, instead of connecting the energy storage-adjustable charging circuit 510 directly to the anode of the laser LD, energy is transmitted between the energy storage-adjustable charging circuit 510 and the third anode energy storage element C3, and correspondingly, there is an energy loss. To be specific, the energy stored in the third anode energy storage element C3 is determined based on the target light emission power of the laser, and based on an energy transmission loss between the energy transfer loss between the energy storage-adjustable charging circuit 510 and the third anode energy storage element C3, and the energy stored in the energy storage-adjustable charging circuit 510 is further determined.

Figure 25:
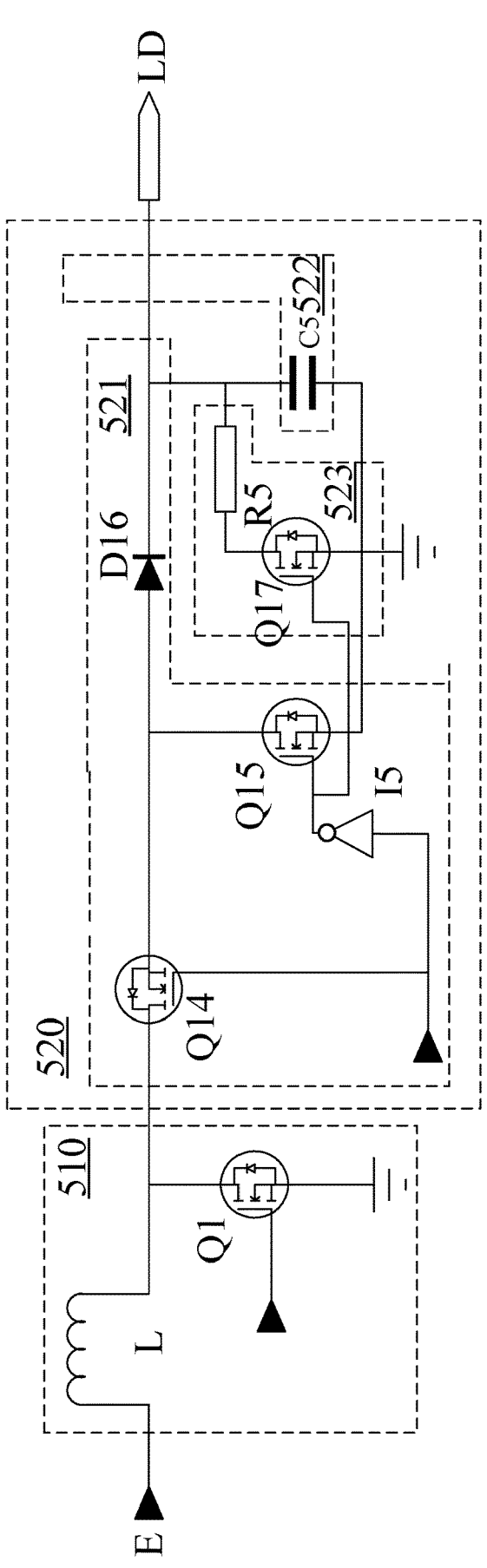
FIG. 25 is a schematic structural diagram of an anode addressing drive circuit according to some embodiments of this application.

Referring to FIG. 25, a third anode addressing drive circuit 520 includes a third anode addressing switch circuit 521 and a third anode energy storage circuit 522, the third anode addressing switch circuit 521 is connected to a second end of a transitory energy storage element L and the third anode energy storage circuit 522, the third anode energy storage circuit 522 is connected to an anode of the laser LDxy connected to a corresponding shared anode end, the third anode addressing switch circuit 521 is turned on or off under the control of an anode addressing signal, and therefore, when the second end of the transitory energy storage element L and the third anode energy storage circuit 522 are turned on or off, and the third anode addressing switch circuit 521 is turned on, the third anode energy storage circuit 522 is charged through energy stored in the transitory energy storage element L, and the third anode energy storage circuit 522 outputs a current to drive the laser LDxy to emit light.

Referring to FIG. 25 and FIG. 26, in an exemplary solution, the third anode addressing switch circuit 521 includes a third anode addressing switch element Q14, and the third anode addressing switch element Q14 includes a first end, a second end, and an addressing enabling end. The first end is connected to a second end of a transitory energy storage element L, the second end is connected to the third anode energy storage circuit 522, the addressing enabling end of the third anode addressing switch element Q14 receives an anode addressing signal, and the anode addressing signal is used to control the third anode addressing switch element Q14 to be turned on or off. When the third anode addressing switch element Q14 is turned on, the third anode energy storage circuit 522 is charged through an output current of the transitory energy storage element L, and the third anode energy storage circuit 522 outputs the current to drive the laser LDxy to emit light.

In some embodiments, the third anode addressing switch element Q14 is a fourteenth NMOS transistor, a drain of the fourteenth NMOS transistor serves as the first end of the third anode addressing switch element Q14 to be connected to the transitory energy storage element L, a source of the fourteenth NMOS transistor serves as the second end of the third anode addressing switch element Q14 to be connected to the third anode energy storage circuit 522, and a gate of the fourteenth NMOS transistor serves as the anode addressing enabling end to receive the anode addressing signal HS. The fourteenth NMOS transistor is turned on or off under the control of the anode addressing signal.

The second aspect is intended to solve a problem of light leakage and false light emission of the laser caused by a parallel parasitic capacitor when the third anode addressing switch circuit 521 includes the parallel parasitic capacitor. Referring to FIG. 25 and FIG. 26, the third anode energy storage circuit 522 provided in this application includes a third anode energy storage element C3, a first end of the third anode energy storage element C3 is connected to a second end of the third anode addressing switch element Q14 and the anode of the laser LDxy, and a second end of the third anode energy storage element C3 is grounded. When the third anode addressing switch element Q14 is turned on, the transitory energy storage element L, the third anode addressing switch element Q14, the third anode energy storage element C3, and the ground form a second charging loop, and the third anode energy storage element C3 stores electric energy through the output current of the energy storage-adjustable charging circuit 510, and releases the electric energy stored in the third anode energy storage element C3 to output a current to drive the laser LDxy to emit light.

In this embodiment, the third anode energy storage element C3 is charged through the second charging loop, the energy stored in the transitory energy storage element L is transmitted to the third anode energy storage element C3, and therefore, the amount of transmitted energy depends on the transitory energy storage element L. It can be learned from the foregoing description that the energy stored in the transitory energy storage element L can be controlled by controlling the turn-on time of the charging switch element Q1, and then the energy stored in the third anode energy storage element C3 can be further controlled.

In some embodiments, the third anode energy storage element C3 includes an energy storage capacitor.

In the related art, when the anode addressing switch element K1 is turned on, the emission power supply E directly outputs a current to drive the laser LDxy to emit light. Because the current directly output by the emission power supply E is large, a current of a branch to which the parasitic capacitor connected to the anode addressing switch element K1 in parallel belongs may be greater than a current threshold for allowing the laser LDxy to emit light, thereby causing light leakage and false light emission of the laser LDxy.

The third anode addressing drive circuit 520 provided in Embodiment 1 of this application stores electric energy through the third anode energy storage circuit 522, and the third anode energy storage circuit 522 releases the electric energy stored in the third anode energy storage circuit to output the current to drive the laser LDxy to emit light, so that a current flowing through the parallel parasitic capacitor to the laser LDxy is less than a light emission current threshold of the laser when the emission power supply E outputs a current to charge the anode energy storage circuit, thereby avoiding false light emission of the laser, which is a result of light leakage caused by the parallel parasitic capacitor when the emission power supply E directly outputs a current to drive the laser LDxy to emit light.

Further, the energy stored in the third anode energy storage circuit 522 originates from the energy stored in the transitory energy storage element L, the transitory energy storage element L may be an energy storage inductor. On the one hand, a charging speed of the energy storage inductor is less than that of the capacitor, and therefore, the energy stored in the transitory energy storage element L can be better controlled by controlling the turn-on time of the charging switch element Q1. On the other hand, a discharge current of the energy storage inductor is small, to ensure that a current flowing through the parallel parasitic capacitor to the laser LDxy is less than a light emission current threshold of the laser LDxy when the third anode energy storage circuit 522 is charged, thereby avoiding false light emission of the laser LDxy, which is a result of light leakage caused by the parallel parasitic capacitor when the emission power supply E charges the third anode energy storage circuit 522.

The third aspect is intended to solve problems that isolation of the third anode addressing switch circuit 521 is reduced and a laser unselected for light emission emits light because of the crosstalk of electrical signals of a laser selected for light emission, because the third anode addressing switch element Q14 includes the parallel parasitic capacitor.

The third anode addressing switch circuit 521 provided in this embodiment of this application further includes a third anode unidirectional conducting element and a third anode reverse-biased switch element Q15, and the third anode unidirectional conducting element is connected between a third anode addressing switch element Q14 and a third anode energy storage element C3. A second end of the third anode unidirectional conducting element is connected to the second end of the third anode addressing switch element Q14, and a first end of the third anode unidirectional conducting element is connected to a first end of a third anode energy storage element C3. The third anode reverse-biased switch element Q15 includes a first end, a second end, and a reverse-biased enabling end. The first end is connected to the second end of the third anode unidirectional conducting element, the second end is grounded, and the reverse-biased enabling end receives a reverse-biased control signal. The reverse-biased control signal and the anode addressing signal are in reverse states. Specifically, when the anode addressing signal is at a high level, the reverse-biased control signal is at a low level; or when the anode addressing signal is at a low level, the reverse-biased control signal is at a high level. The reverse-biased control signal is used to turn off the third anode reverse-biased switch element Q15 when the third anode addressing switch element Q14 is turned on through the anode addressing signal, and the third anode addressing switch element Q14 connects an anode of the third anode unidirectional conducting element to a second end of a transitory energy storage element L, so that the third anode unidirectional conducting element is in the forward conduction state. The transitory energy storage element L, the third anode addressing switch element Q14, the third anode unidirectional conducting element, the third anode energy storage element C3, and the ground form a second charging loop. The reverse-biased control signal is also used to turn on the third anode reverse-biased switch element Q15 when the third anode addressing switch element Q14 is turned off through the anode addressing signal, and the first end of the third anode unidirectional conducting element is grounded through the third anode reverse-biased switch element Q15, so that the third anode unidirectional conducting element is in a reverse-biased state and the current is prevented from flowing through the third anode addressing switch element Q14, thereby improving the isolation of the third anode addressing switch circuit 521.

In this embodiment, when the laser LDxy is selected for light emission, at a charging stage of the third anode energy storage element C3, the third anode addressing switch element Q14 is turned on under the enablement of the anode addressing signal, and the third anode unidirectional conducting element is in the forward conduction state. The transitory energy storage element L, the third anode addressing switch element Q14, the third anode unidirectional conducting element, the third anode energy storage element C3, and the ground form a second charging loop, the current output by the transitory energy storage element L flows through the third anode unidirectional conducting element to the third anode energy storage element C3, to charge the third anode energy storage element C3, and the third anode energy storage element C3 outputs a current through energy stored in the third anode energy storage element C3, to drive the laser LDxy to emit light. When the laser LDxy is unselected for light emission, the third anode addressing switch element Q14 is turned off under the control of the anode addressing signal, and the third anode reverse-biased switch element Q15 is turned on under the enablement of the reverse-biased control signal, so that the third anode unidirectional conducting element is in the reverse-biased state, to prevent the current from flowing through the third anode addressing switch element Q14, and ensure that the laser LDxy unselected for light emission does not experience crosstalk caused by an electrical signal of another laser selected for light emission.

In some embodiments, referring to FIG. 25 and FIG. 26, the third anode unidirectional conducting element is a sixteenth diode D16, the third anode reverse-biased switch element Q15 is a fifteenth NMOS transistor, an anode of the sixteenth diode D16 is connected to a source of the fourteenth NMOS transistor and a drain of the fifteenth NMOS transistor, a cathode is connected to the first end of the third anode energy storage element C3, a source of the fifteenth NMOS transistor is grounded, and a gate of the fifteenth NMOS transistor receives a reverse-biased control signal. When the laser LDxy is selected for light emission, at a charging stage of the third anode energy storage element C3, the third anode addressing switch element Q14 is turned on under the enablement of the anode addressing signal, an output current of the transitory energy storage element L flows through the anode of the sixteenth diode D16 to the cathode of the sixteenth diode D16, and the sixteenth diode D16 is in the forward conduction state. When the laser LDxy is unselected for light emission, the third anode addressing switch element Q14 is turned off under the control of the anode addressing signal, the third anode reverse-biased switch element Q15 is turned on under the enablement of the reverse-biased control signal, the anode of the sixteenth diode D16 is grounded through the third anode reverse-biased switch element Q15, and the sixteenth diode D16 is in the reverse-biased state.

Further, when the third anode addressing switch element Q14 is turned on under the enablement of the anode addressing signal, the anode addressing signal is at a high level greater than a ground voltage; or when the third anode addressing switch element Q14 is turned off through the anode addressing signal, the anode addressing signal is at a low level lower than or equal to the ground voltage.

In some embodiments, the third anode unidirectional conducting element is a sixteenth NMOS transistor, the third anode reverse-biased switch element Q15 is a fifteenth NMOS transistor, a source of the sixteenth NMOS transistor is connected to a source of the fourteenth NMOS transistor and a drain of the fifteenth NMOS transistor, a drain of the fourteenth NMOS transistor is connected to the first end of the third anode energy storage element C3, and a gate of the fourteenth NMOS transistor is connected to the addressing enabling end of the third anode addressing switch element Q14. When the laser LDxy is selected for light emission, at a charging stage of the anode energy storage element, the third anode addressing switch element Q14 and the sixteenth NMOS transistor are turned on under the enablement of the anode addressing signal, an output current of the transitory energy storage element L flows through the source of the sixteenth NMOS transistor to the drain of the sixteenth NMOS transistor, and the sixteenth NMOS transistor is in the forward conduction state. When the laser LDxy is unselected for light emission, the third anode addressing switch element Q14 and the sixteenth NMOS transistor are turned off under the control of the anode addressing signal, the third anode reverse-biased switch element Q15 is turned on under the enablement of the reverse-biased control signal, the source of the sixteenth NMOS transistor is grounded through the third anode reverse-biased switch element Q15, and the sixteenth NMOS transistor is in the reverse-biased state.

Further, when the third anode addressing switch element Q14 and the sixteenth NMOS transistor are turned on under the enablement of the anode addressing signal, the anode addressing signal is at a high level greater than the ground voltage; or when the third anode addressing switch element Q14 and the sixteenth NMOS transistor are turned off through the anode addressing signal, the anode addressing signal is at a low level lower than or equal to the ground voltage.

In this embodiment, when the laser LDxy finishes emitting light, there is still residual energy in the third anode energy storage element C3, and the residual energy in the third anode energy storage element C3 may damage another element, and also affect subsequent energy storage of the third anode energy storage element C3.

This embodiment is intended to solve the problem that subsequent energy storage of the third anode energy storage element C3 is affected because another element is damaged by residual energy existing in the third anode energy storage element C3 in the third anode addressing drive circuit 520.

The third anode addressing drive circuit 520 provided in this embodiment of this application further includes an anode energy release switch circuit 523, the anode energy release switch circuit 523 includes an energy release switch element Q17, the energy release switch element Q17 includes a first end, a second end, and an energy release enabling end. The first end is connected to the first end of the third anode energy storage element C3, the second end is grounded, and the energy release enabling end receives an energy release control signal. The energy release control signal and the anode addressing signal are in reverse states. Specifically, when the anode addressing signal is at a high level, the energy release control signal is at a low level; or when the anode addressing signal is at a low level, the energy release control signal is at a high level. The energy release control signal is used to turn off the energy release switch element Q17 when the third anode addressing switch element Q14 is turned on through the anode addressing signal, and the third anode addressing switch element Q14 connects a second of the third anode unidirectional conducting element to a second end of a transitory energy storage element L, so that the third anode unidirectional conducting element is in the forward conduction state. The transitory energy storage element L, the third anode addressing switch element Q14, the third anode unidirectional conducting element, the third anode energy storage element C3, and the ground form a second charging loop. The energy release control signal is also used to turn on the energy release switch element Q17 when the third anode addressing switch element Q14 is turned off through the anode addressing signal, and the second end of the third anode energy storage element C3 is grounded through the energy release switch element Q17, the third anode energy storage element C3, the energy release switch element Q17, and the ground form an energy release loop, to release residual energy from the third anode energy storage element C3.

In some embodiments, the energy release switch element Q17 is a seventeenth NMOS transistor, a drain of the seventeenth NMOS transistor serves as the first end of the energy release switch element Q17 to be connected to the first end of the third anode energy storage element C3, a source of the seventeenth NMOS transistor serves as the second end of the energy release switch element Q17 to be grounded, and a gate serves as the energy release enabling end of the energy release switch element Q17 to receive an energy release control signal. When the laser LDxy is selected for light emission, at a charging stage of the third anode energy storage element C3, the third anode addressing switch element Q14 is turned on under the enablement of the anode addressing signal, and an output current of the transitory energy storage element L flows through the third anode unidirectional conducting element to the third anode energy storage element C3. When the laser LDxy is unselected for light emission, the third anode addressing switch element Q14 is turned off under the control of the anode addressing signal, the energy release switch element Q17 is turned on under the enablement of the energy release control signal, and the first end of the third anode energy storage element C3 is grounded through the energy release switch element Q17, to release residual energy from the third anode energy storage element C3.

Further, when the residual energy in the third anode energy storage element C3 is released through the energy release circuit, a large release current may affect the energy release switch element Q17, that is, the large release current may damage the energy release switch element Q17. To solve the problem, the anode energy release circuit provided in this embodiment of this application also includes a fourth current limiting element R4 to limit a current for releasing energy from the anode energy storage element, thereby reducing a possibility of damage to the energy release switch element Q17 when the energy is released from the third anode energy storage element C3.

Specifically, the first end of the fourth current limiting element R4 is connected to the first end of the energy release switch element Q17, and the second end of the fourth current limiting element R4 is connected to the first end of the third anode energy storage element C3. When the energy release switch element Q17 is turned on under the enablement of the energy release control signal, the third anode energy storage element C3, the fourth current limiting element R4, the energy release switch element Q17, and ground form an energy release loop.

It can be understood that the greater the resistance of the fourth current limiting element R4, the stronger the current limiting capability of the fourth current limiting element R4 during current release of the third anode energy storage element C3, and the greater the voltage drop across two ends of the fourth current limiting element R4. In this application, specific resistance of the fourth current limiting element R4 is not limited, and can be properly set based on an actual need.

Further, in this embodiment of this application, to easily control the third anode addressing switch element Q14, the third anode reverse-biased switch element Q15, and the energy release switch element Q17, the third anode addressing drive circuit 520 further includes the third anode phase inverter I5, the first end of the third anode phase inverter I5 is connected to the addressing enabling end, and the second end of the third anode phase inverter I5 is connected to the reverse-biased enabling end and the energy release enabling end. Specifically, an input end of the third anode phase inverter I5 is connected to the addressing enabling end of the third anode addressing switch element Q14, and an output end of the third anode phase inverter I5 is connected to the reverse-biased enabling end of the third anode reverse-biased switch element Q15 and the energy release enabling end of the energy release switch element Q17, and therefore, the third anode reverse-biased switch element Q15 is in a turn-on state that is the same as that of the energy release switch element Q17 and different from that of the third anode addressing switch element Q14.

In some other embodiments, the third anode addressing drive circuit 520 includes a reverse-biased phase inverter and an energy release phase inverter, an input end of the reverse-biased phase inverter is connected to the addressing enabling end of the third anode addressing switch element Q14, an output end of the reverse-biased phase inverter is connected to the reverse-biased enabling end of the third anode reverse-biased switch element Q15, an input end of the energy release phase inverter is connected to the addressing enabling end of the third anode addressing switch element Q14, an output end of the energy release phase inverter is connected to the energy release enabling end of the energy release switch element Q17, and therefore, the third anode reverse-biased switch element Q15 is in a turn-on state that is the same as that of the energy release switch element Q17 and different from that of the third anode addressing switch element Q14.

In some other embodiments, an input end of the third anode phase inverter I5 is connected to the reverse-biased enabling end of the third anode reverse-biased switch element Q15 and the energy release enabling end of the energy release switch element Q17, and an output end of the third anode phase inverter I5 is connected to the addressing enabling end of the third anode addressing switch element Q14. In this case, the third anode reverse-biased switch element Q15 may be in a turn-on state that is the same as that of the energy release switch element Q17 and different from that of the anode addressing switch element.

This application further provides an addressable drive circuit of the laser array, including the foregoing third anode addressable drive circuit 500 and a cathode addressable drive circuit 600. The third anode addressable drive circuit 500 is connected to multiple shared anode ends corresponding to the multiple rows of lasers, and an anode addressing signal is externally received, to drive anode addressing for the anodes of the multiple rows of lasers through scanning; and the cathode addressable drive circuit 600 is connected to the multiple shared cathode ends corresponding to the multiple columns of lasers, and then a cathode addressing signal is externally received, to drive cathode addressing for the cathodes of the multiple columns of lasers in the laser array through scanning.

Specifically, the cathode addressable drive circuit 600 includes multiple third cathode addressing drive circuits 620. In this embodiment, there are n third cathode addressing drive circuits 620, and a $y^{th}$ cathode addressing drive circuit 620 is connected to the cathode of the laser LDxy in the laser array through a shared cathode end connected in one-to-one correspondence, x represents a specific row of lasers, and x is a positive integer, where x=1, 2, . . . , m, and m is the total number of third anode addressing drive circuits 520 and is also the total number of shared cathode ends; y represents a specific column of lasers, and y is a positive integer, where y=1, 2, . . . , n, and n is the total number of third cathode addressing drive circuits 620, and is also the total number of shared cathode ends.

In an exemplary solution, the third cathode addressing drive circuit 620 includes a cathode addressing switch circuit 621, one end of the cathode addressing switch circuit 621 is connected to a cathode of a laser, and the other end of the cathode addressing switch circuit 621 is grounded. Specifically, the third cathode addressing switch circuit 621 includes a third cathode addressing switch element Q18, and the third cathode addressing switch element Q18 includes a first end, a second end, and an addressing enabling end, the first end is connected to the cathode of the laser, the second end is grounded, the addressing enabling end receives a cathode addressing signal, and the third cathode addressing switch element Q18 is turned on or off under the control of the cathode addressing signal.

In this embodiment, the third cathode addressing switch element Q18 is an eighteenth NMOS transistor, a drain of the eighteenth NMOS transistor serves as the first end of the third cathode addressing switch element Q18 to be connected to the cathode of the laser, a source serves as the second end of the third cathode addressing switch element Q18 to be grounded, and a gate serves as the addressing enabling end of the third cathode addressing switch element Q18 to receive a cathode addressing signal.

This application further provides a laser emission circuit, including a laser array and the foregoing addressable drive circuit. The laser array includes multiple lasers, and the multiple lasers are arranged in one or two dimensions. In an exemplary solution, the multiple lasers are arranged in two dimensions. The third anode addressable drive circuit 500 is connected to multiple shared anode ends corresponding to the multiple rows of lasers, and an anode addressing signal is externally received, to drive anode addressing for the anodes of the multiple rows of lasers through scanning; and the cathode addressable drive circuit 600 is connected to the multiple shared cathode ends corresponding to the multiple columns of lasers, and then a cathode addressing signal is externally received, to drive cathode addressing for the cathodes of the multiple columns of lasers in the laser array through scanning.

In this embodiment, the laser emission circuit concentrates the third anode addressable drive circuit 500 and the cathode addressable drive circuit 600 on one side of the two-dimensional laser array, to increase reliability of the two-dimensional laser array LDm*n, for example, voltage tolerance, current flowing performance, and electrostatic protection performance.

In addition, the third anode addressable drive circuit 500 is connected to the anode of the laser in the same row through the shared anode end and connected to the cathode of the laser in the same column through the shared cathode end, so that the number of channels of the two-dimensional laser array can be reduced and a manufacturing cost of the laser emission circuit is further reduced.

In this embodiment, a process of driving addressing of the laser array by the addressable drive circuit in the laser array is as follows.

In the first stage, the charging control signal controls the charging switch element Q1 to be turned on, the anode addressing signal controls the anode switch circuit 110 to be turned off, more specifically, the anode switch circuit 110 is in a reverse-biased state, and the cathode addressing signal controls the cathode switch circuit to be turned off.

The transitory energy storage element L stores electric energy through the output current of the emission power supply E, and the turn-on time of the charging switch element Q1 is controlled by using a charging control signal based on actually required light emission power of the laser, to adjust the amount of electric energy stored in the transitory energy storage element L.

In the second stage, the charging switch element Q1 in the energy storage-adjustable charging circuit 510 is turned off, the transitory energy storage element L stops storing energy, the third anode addressing switch element Q14 in a row to which the laser selected for light emission belongs is turned on under the control of the anode addressing signal, more specifically, the anode switch circuit 110 is in the forward conduction state, and the eighteenth cathode addressing switch element Q18 in a column to which the laser selected for light emission belongs is turned off under the control of the cathode addressing signal.

The third anode unidirectional conducting element is in the forward conduction state, and the transitory energy storage element L outputs a current to charge the third anode energy storage element C3.

In the third stage, the cathode addressing switch element in the column to which the laser selected for light emission belongs is turned on under the control of the cathode addressing signal.

The third anode energy storage element C3 outputs a current to drive the laser selected for light emission to emit light.

When the current laser selected for light emission finishes emitting light, the corresponding third anode addressing switch element Q14 in the row to which the laser belongs is turned off under the control of the anode addressing signal, the corresponding third anode reverse-biased switch element Q15 in the row to which the laser belongs is turned on under the control of the reverse-biased control signal, and the corresponding energy release switch element Q17 in the row to which the laser belongs is turned on under the control of the energy release control signal.

The unidirectional conducting element is in the reverse-biased state, the transitory energy storage element L stops outputting a current for charging the third anode energy storage element C3, and the anode energy release switch circuit 523 releases the residual energy from the third anode energy storage element C3.

Further, when the multiple rows of third anode addressing drive circuits 521 corresponding to the multiple lasers are turned on under the enablement of the anode addressing signal and the multiple columns of third cathode addressing drive circuits 621 corresponding to the multiple lasers are turned on under the enablement of the cathode addressing signal, the multiple lasers can emit light simultaneously.

Further, the anode addressing signal can also simultaneously drive third anode addressing switch elements Q14 corresponding to two or more shared anode ends to be turned on, the cathode addressing signal can also simultaneously drive third cathode addressing switch elements Q18 corresponding to two or more shared cathode ends to be turned on, so that two or more lasers can emit light simultaneously. The specific number of lasers that emit light simultaneously can be set by scanning the anode addressing signal and the cathode addressing signal based on an actual need.

An embodiment of this application also provides a LiDAR, the LiDAR includes the foregoing laser emission circuit, and the LiDAR generates a laser beam through the foregoing laser emission circuit, emits the laser beam toward a detection region, and then cooperates with a laser receiving device in the LiDAR. An echo beam reflected from a target is received by the laser receiving device, and then data is properly processed by a signal processing system, to obtain information such as distance, speed, azimuth, attitude, and even shape of the target, which can be applied to navigation avoidance, obstacle recognition, ranging, speed measurement, autonomous driving and other scenarios of an automobile, a robot, a logistics vehicle, a patrol vehicle and other products.

Embodiment 10

A difference between this embodiment and Embodiment 9 is that the third anode addressing switch element Q14 is a fourteenth PMOS transistor, a drain of the fourteenth PMOS transistor serves as the first end of the third anode addressing switch element Q14 to be connected to the transitory energy storage element L, a source of the fourteenth PMOS transistor serves as the second end of the third anode addressing switch element Q14 to be connected to the third anode energy storage circuit 522, and a gate of the fourteenth PMOS transistor serves as the addressing enabling end of the third anode addressing switch element Q14 to receive the anode addressing signal. The fourteenth PMOS transistor is turned on or off under the control of the anode addressing signal.

A voltage condition $V_{GS}$ when the anode addressing signal drives the fourteenth PMOS transistor to be turned on is opposite to a voltage condition $V_{GS}$ when the anode addressing signal drives the fourteenth NMOS transistor to be turned on, where $V_{GS}=V_G-V_S$, $V_G$ is a gate voltage of the MOS transistor (the fourteenth NMOS transistor or the fourteenth PMOS transistor), and $V_S$ is a source voltage of the MOS transistor (the fourteenth NMOS transistor or the fourteenth PMOS transistor). For example, a condition for turning on the fourteenth NMOS transistor is that $V_{GS}$ of the fourteenth NMOS transistor is greater than or equal to $V_{th}$. In this case, the anode addressing signal is at a high level when the fourteenth NMOS transistor is turned on, and the anode addressing signal is at a low level when the fourteenth NMOS transistor is turned off. A condition for turning on the fourteenth PMOS transistor is that $V_{GS}$ of the fourteenth PMOS transistor is less than or equal to $V_{th}$. In this case, the anode addressing signal is at a low level when the fourteenth PMOS transistor is turned on, and the anode addressing signal is at a high level when the fourteenth PMOS transistor is turned off.

In an exemplary solution, the third anode reverse-biased switch element Q15 is a fifteenth NMOS transistor, the third anode unidirectional conducting element is a sixteenth NMOS transistor, a drain of the fourteenth PMOS transistor serves as the first end of the third anode addressing switch element Q14 to be connected to the transitory energy storage element L, a source of the fourteenth PMOS transistor serves as the second end of the third anode addressing switch element Q14 to be connected to the source of the sixteenth NMOS transistor and a drain of the fifteenth NMOS transistor, a gate of the fourteenth PMOS transistor is connected to a gate of the sixteenth NMOS transistor through the third anode phase inverter I5, a source of the fifteenth NMOS transistor is grounded, and a gate of the fifteenth NMOS transistor is connected to a gate of the fourteenth PMOS transistor. When the laser LDxy is selected for light emission, at a charging stage of the third anode energy storage element C3, the fourteenth PMOS transistor is turned on under the enablement of the anode addressing signal, the sixteenth NMOS transistor is turned on under the control of the anode addressing signal, the fifteenth NMOS transistor is turned off under the control of the anode reverse-biased control signal, the source of the sixteenth NMOS transistor is connected to the transitory energy storage element L through the fourteenth PMOS transistor, and the sixteenth NMOS transistor is in the forward conduction state. When the laser LDxy is stopped from emitting light, the fourteenth PMOS transistor is turned off under the control of the anode addressing signal, the fifteenth NMOS transistor is turned on under the enablement of the anode reverse-biased control signal, the source of the sixteenth NMOS transistor is grounded through the fifteenth NMOS transistor, and the sixteenth NMOS transistor is in the reverse-biased state.

In this case, when the fourteenth PMOS transistor is turned on under the enablement of the anode addressing signal, the anode addressing signal is at a low level lower than an anode drive level; or when the fourteenth PMOS transistor is turned off under the control of the anode addressing signal, the anode addressing signal is at a high level higher than the anode drive level.

Specifically, the third anode addressing switch circuit 521 further includes a third anode phase inverter I5, an input end of the third anode phase inverter I5 is connected to a gate of the fourteenth PMOS transistor, and an output end of the third anode phase inverter I5 is connected to the gate of the sixteenth NMOS transistor, so that the sixteenth NMOS transistor and the fourteenth PMOS transistor are in the same state.

In some other embodiments, the input end of the third anode phase inverter I5 is connected to a gate of the sixteenth NMOS transistor, the output end of the third anode phase inverter I5 is connected to the gate of the fourteenth PMOS transistor, and therefore, the sixteenth NMOS transistor and the fourteenth PMOS transistor are in the same state.

When the anode addressing signal and the anode reverse-biased control signal are both at the low level, the fourteenth PMOS transistor is turned on under the control of the anode addressing signal, the sixteenth NMOS transistor is turned on under the control of a phase-inverted anode addressing signal (high level), the fifteenth NMOS transistor is turned off under the control of the anode reverse-biased control signal, and the source of the sixteenth NMOS transistor is connected to the transitory energy storage element L through the fourteenth PMOS transistor, so that the sixteenth NMOS transistor is in the forward conduction state. When the anode addressing signal and the anode reverse-biased control signal are both at the high level, the fourteenth PMOS transistor is turned off under the control of the anode addressing signal, the fifteenth NMOS transistor is turned on under the control of the anode reverse-biased control signal, and the source of the sixteenth NMOS transistor is grounded through the fifteenth NMOS transistor, so that the sixteenth NMOS transistor is in the reverse-biased state.

In another exemplary solution of this application, the third anode reverse-biased switch element Q15 is a fifteenth NMOS transistor, the third anode unidirectional conducting element is a sixteenth diode D16, a drain of the fourteenth PMOS transistor serves as the first end of the third anode addressing switch element Q14 to be connected to the transitory energy storage element L, a source of the fourteenth PMOS transistor serves as the second end of the third anode addressing switch element Q14 to be connected to the anode of the sixteenth diode D16 and a drain of the fifteenth NMOS transistor, a gate of the fourteenth PMOS transistor receives an anode addressing signal, a source of the fifteenth NMOS transistor is grounded, and a gate of the fifteenth NMOS transistor is connected to a gate of the fourteenth PMOS transistor. When the laser LDxy is selected for light emission, at a charging stage of the third anode energy storage element C3, the fourteenth PMOS transistor is turned on under the enablement of the anode addressing signal, the fifteenth NMOS transistor is turned off under the control of the anode reverse-biased control signal, the anode of the sixteenth diode D16 is connected to the transitory energy storage element L through the fourteenth PMOS transistor, and the sixteenth diode D16 is in the forward conduction state. When the laser LDxy is stopped from emitting light, the fourteenth PMOS transistor is turned off under the control of the anode addressing signal, the fifteenth NMOS transistor is turned on under the enablement of the anode reverse-biased control signal, the anode of the sixteenth diode D16 is grounded through the fifteenth NMOS transistor, and the sixteenth diode D16 is in the reverse-biased state.

In this case, when the fourteenth PMOS transistor is turned on under the enablement of the anode addressing signal, the anode addressing signal is at a low level lower than or equal to an anode drive level; or when the fourteenth PMOS transistor is turned off under the control of the anode addressing signal, the anode addressing signal is at a high level higher than the anode drive level.

When the anode addressing signal and the anode reverse-biased control signal are both at the low level, the fourteenth PMOS transistor is turned on under the control of the anode addressing signal, the fifteenth NMOS transistor is turned off under the control of the anode reverse-biased control signal, and an anode of the sixteenth diode D16 is connected to the transitory energy storage element L through the fourteenth PMOS transistor, so that the sixteenth diode D16 is in the forward conduction state. When the anode addressing signal and the anode reverse-biased control signal are both at the high level, the fourteenth PMOS transistor is turned off under the control of the anode addressing signal, the fifteenth NMOS transistor is turned on under the control of the anode reverse-biased control signal, and the anode of the sixteenth diode D16 is grounded through the fifteenth NMOS transistor, so that the sixteenth diode D16 is in the reverse-biased state.

In the third anode addressing switch circuit 521 provided in this embodiment of this application, when the third anode addressing switch element Q14 is turned off, the third anode unidirectional conducting element is in a reverse-biased state, a current is prevented from flowing through the third anode addressing switch element Q14, thereby improving isolation of the third anode addressing switch circuit 521 and avoiding crosstalk of electrical signals from a laser selected for light emission onto a laser LDxy stopped from emitting light.

Embodiment 11

Figure 28:
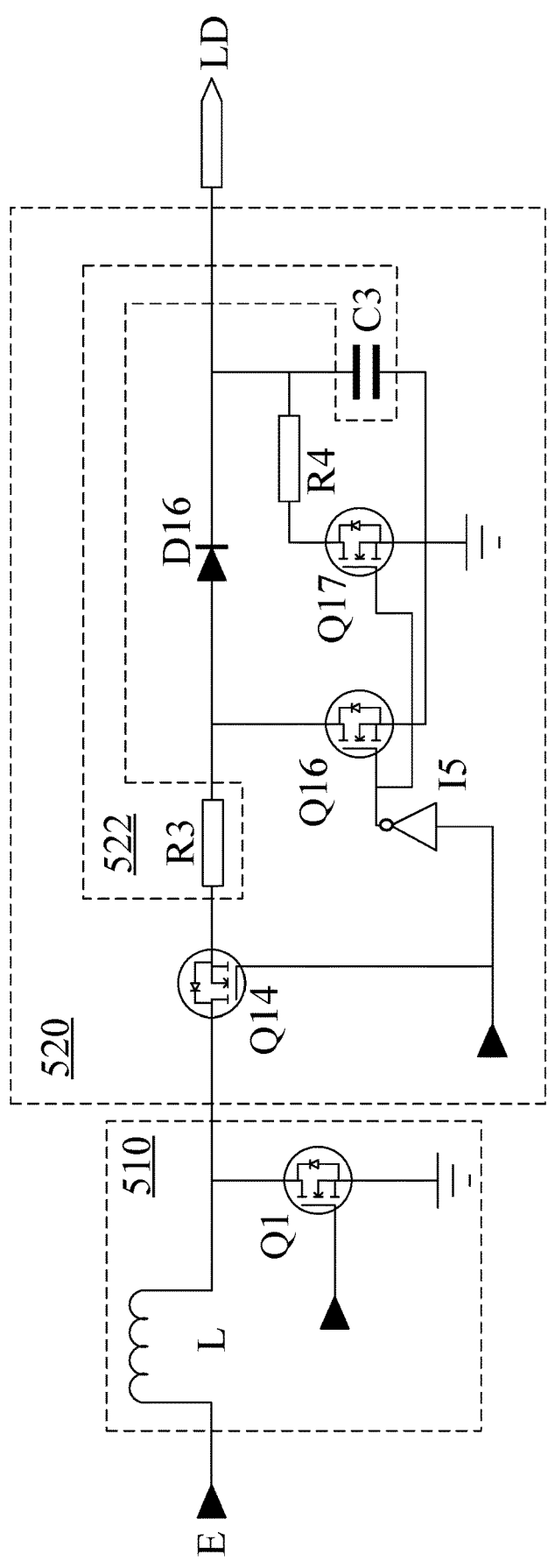
FIG. 28 is a schematic structural diagram of an anode addressing drive circuit according to some embodiments of this application.

As shown in FIG. 28, a difference between this embodiment and Embodiment 9 is as follows. The third anode energy storage circuit 522 also includes a third current limiting element R3, a first end of the third current limiting element R3 is connected to the second end of the third anode addressing switch element Q14, a second end of the third current limiting element R3 is connected to the first end of the third anode energy storage element C3 and the anode of the laser LDxy, and the third current limiting element R3 is configured to limit a current output by the transitory energy storage element L to charge the third anode energy storage element C3, so that the charging current is less than the current threshold for allowing the laser LDxy to emit light, thereby avoiding false light emission of the laser LDxy, which is a result of light leakage caused by the parallel parasitic capacitor when the emission power supply E charges the anode energy storage circuit.

The third cathode addressing switch element Q18 in the third cathode addressing switch circuit 621 includes a parallel parasitic capacitor. Therefore, the transitory energy storage element charges the third anode energy storage element C3 through two loops. In the first loop, the transitory energy storage element L, the third anode addressing switch element Q14, the third anode unidirectional conducting element, the anode energy storage element, and the ground jointly form a charging loop. In the second loop, the transitory energy storage element L, the third anode addressing switch element Q14, the unidirectional conducting element, the laser LD, the parasitic capacitor of the third cathode addressing switch element Q18, and the ground jointly form a charging loop.

In this case, the laser is connected to the parasitic capacitor of the third cathode addressing switch element Q18 in series, and therefore, the charging current of the parasitic capacitor of the third cathode addressing switch element Q18 is equal to the current flowing through the laser. Once the charging current flowing through the parasitic capacitor of the third cathode addressing switch element Q18 is greater than the light emission current threshold of the laser, the laser is excited to emit light incorrectly when the transitory energy storage element L charges the anode energy storage element (in this case, the third cathode addressing switch element Q18 is not turned on, and theoretically does not emit light). In this embodiment provided in this application, the third current limiting element R3 is disposed in the anode energy storage circuit to limit the charging current of the parasitic capacitor of the third cathode addressing switch element Q18 when the third anode addressing drive circuit 520 is turned on, so that the charging current of the parasitic capacitor of the third cathode addressing switch element Q18 is less than the light emission current threshold of the laser, and the laser does not emit light incorrectly in the charging stage of the anode energy storage element.

It can be understood that the greater the resistance of the third current limiting element R3, the stronger the current limiting capability of the third current limiting element R3 against the third anode energy storage element C3, and the greater the voltage drop across two ends of the third current limiting element R3. In this application, specific resistance of the third current limiting element R3 is not limited, and can be properly set based on an actual need.

Embodiment 12

Figure 29:
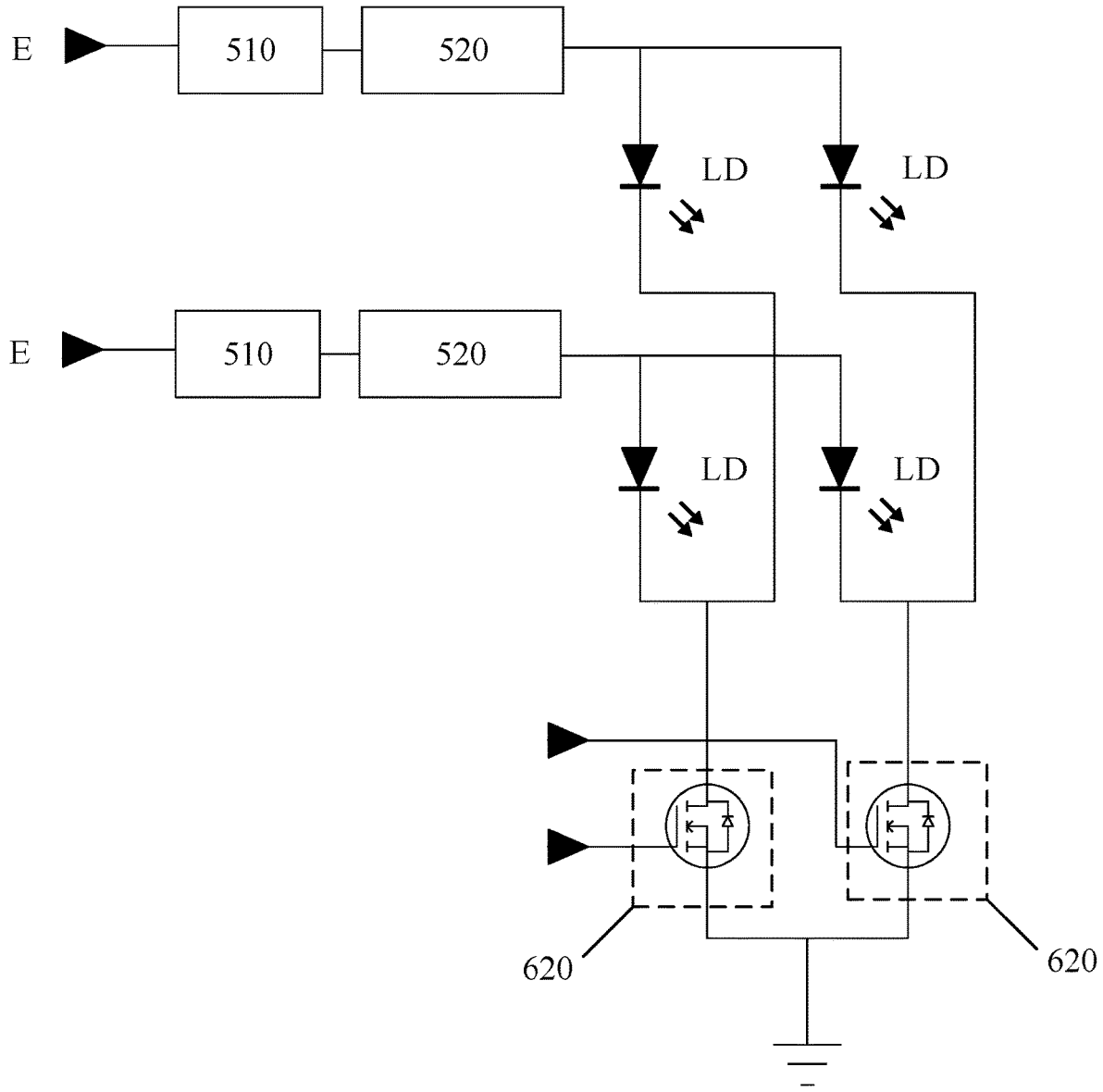
FIG. 29 is a schematic structural diagram of a partial framework of an anode addressable drive circuit according to some embodiments of this application.

As shown in FIG. 29, a difference between this embodiment and Embodiment 9 or Embodiment 10 is as follows. There are multiple energy storage-adjustable charging circuits 510, and each energy storage-adjustable charging circuit 510 is connected to one third anode addressing drive circuit 520 in one-to-one correspondence.

In the specification provided here, a lot of specific details are described. However, it can be understood that embodiments of the present disclosure can be practiced without these specific details. In some instances, common methods, structures, and technologies are not shown in detail, so as not to obscure the understanding of this specification.

Similarly, it should be understood that to streamline the present disclosure and help understand one or more of the various inventive aspects, in the foregoing description of the exemplary embodiments of the present disclosure, the various features of the embodiments of the present disclosure are sometimes grouped together into a single implementation, example, diagram, or description. However, the disclosed method should not be interpreted as reflecting the intention that the claimed invention requires more features than those explicitly stated in each claim.

The person skilled in the art can understand that it is possible to adaptively change the modules in an apparatus in the embodiment. The modules can be arranged in one or more devices different from the embodiment. The modules, units, or assemblies in the embodiments can be combined into one module, unit, or assembly. The modules, units, or assemblies can be divided into a plurality of sub-modules, sub-units, or sub-assemblies. Except that at least some of such features and/or processes or units are mutually exclusive, any combination can be configured to apply any combination to all features disclosed in this specification (including the accompanying claims, abstract, and drawings) and all the processes or units of any method or the apparatus disclosed in this manner. Unless expressly stated otherwise, each feature disclosed in this specification (including the accompanying claims, abstract, and drawings) can be replaced by an alternative feature that serves the same, equivalent, or similar objective.

It should be noted that the foregoing embodiments illustrate rather than limit the present disclosure, and the person skilled in the art can design alternative embodiments without departing from the scope of the appended claims. In the claims, any reference signs positioned between parentheses should not be constructed as a limitation to the claims. The word "including" does not exclude the presence of elements or steps not listed in the claims. The word "a" or "an" in front of an element does not exclude the presence of a plurality of such elements. The disclosure can be implemented by means of hardware including a plurality of different elements and by means of a suitably programmed computer. In the unit claims enumerating a plurality of devices, a plurality of these devices can be embodied by the same hardware item. The use of the words "first," "second," and "third," and the like do not indicate any order. These words can be interpreted as names. Unless otherwise specified, the steps in the foregoing embodiments should not be understood as a limitation on an execution order.

What is claimed is:

1. An anode addressing drive circuit, applied to a laser array, comprising one end connected to an emission power supply and the other end connected to an anode of a laser, the laser being connected to a shared anode end in the laser array, wherein the anode addressing drive circuit further comprises:

an anode addressing switch circuit, comprising an anode addressing switch element, wherein the anode addressing switch element comprises a first end, a second end, and an anode addressing enabling end, the first end is connected to the emission power supply, the second end is connected to an anode energy storage circuit, the anode addressing enabling end receives an anode addressing signal, and the anode addressing switch element is turned on or off under the control of the anode addressing signal, so that the anode energy storage circuit is charged through an output current of the emission power supply when the anode addressing switch element is turned on; and the anode energy storage circuit, comprising an anode energy storage element, wherein the anode energy storage element is configured to be charged through the output current of the emission power supply when the anode addressing switch element is turned on, wherein the anode energy storage circuit further comprises a current limiting element, and the current limiting element is configured to limit a current for charging the anode energy storage element, and wherein the current limiting element comprises a current limiting resistor, a first end of the current limiting resistor is connected to the second end of the anode addressing switch element, a second end of the current limiting resistor is connected to a first end of the anode energy storage element and a corresponding shared anode end, and a second end of the anode energy storage element is grounded.

2. The anode addressing drive circuit according to claim 1, wherein the anode energy storage element comprises an energy storage capacitor.

3. The anode addressing drive circuit according to claim 1, wherein the anode addressing switch circuit further comprises an anode unidirectional conducting element, the anode unidirectional conducting element is connected between the anode addressing switch element and a corresponding shared anode end, a first end of the anode unidirectional conducting element is connected to the anode of the laser connected to the corresponding shared anode end, and a second end of the anode unidirectional conducting element is connected to the second end of the anode addressing switch element; and wherein when the anode addressing switch element is in a turn-on state, the anode unidirectional conducting element is in a forward conduction state to allow a current to pass through the anode addressing switch element, or when the anode addressing switch element is in a turn-off state, the anode unidirectional conducting element is in a reverse-biased state to prevent the current from passing through the anode addressing switch element.

4. The anode addressing drive circuit according to claim 3, wherein the anode addressing switch circuit further comprises an anode reverse-biased switch element, the anode reverse-biased switch element comprises a first end, a second end, and an anode reverse-biased enabling end, the first end of the anode reverse-biased switch element is connected to the second end of the anode unidirectional conducting element, the second end of the anode reverse-biased switch element receives a first preset level, and the anode reverse-biased enabling end receives an anode reverse-biased control signal;

wherein the anode reverse-biased control signal is used to turn off the anode reverse-biased switch element when the anode addressing switch element is turned on through the anode addressing signal, so that the second end of the anode unidirectional conducting element is grounded through the anode addressing switch element, and the anode unidirectional conducting element is in the forward conduction state; and wherein the anode reverse-biased control signal is also used to turn on the anode reverse-biased switch element when the anode addressing switch element is turned off through the anode addressing signal, so that the second end of the anode unidirectional conducting element receives the first preset level through the anode reverse-biased switch element, and the anode unidirectional conducting element is in the reverse-biased state.

5. The anode addressing drive circuit according to claim 1, further comprising an anode energy release switch circuit, wherein the anode energy release switch circuit comprises an energy release switch element, the energy release switch element comprises a first end, a second end, and an energy release enabling end, the first end of the energy release switch element is connected to the first end of the anode energy storage element, the second end of the energy release switch element is grounded, the energy release enabling end receives an energy release control signal, and the energy release control signal and the anode addressing signal are in reverse states;

wherein the energy release control signal is used to turn off the energy release switch element when the anode addressing switch element is turned on through the anode addressing signal, so that the first end of the anode energy storage element is connected to a charging circuit, and the anode energy storage element is charged through the charging circuit; and wherein the energy release control signal is also used to turn on the energy release switch element when the anode addressing switch element is turned off through the anode addressing signal, so that the first end of the anode energy storage element is grounded.

6. The anode addressing drive circuit according to claim 5, wherein the energy release enabling end of the energy release switch element is connected to the addressing enabling end of the anode addressing switch element through a first phase inverter, and wherein an input end of the first phase inverter is connected to the addressing enabling end, and an output end of the first phase inverter is connected to the energy release enabling end; or the input end of the first phase inverter is connected to the energy release enabling end, and the output end of the first phase inverter is connected to the addressing enabling end.

7. The anode addressing drive circuit according to claim 6, wherein the anode energy release switch circuit further comprises a fourth current limiting element, the fourth current limiting element is connected between the first end of the anode energy storage element and the first end of the energy release switch element and configured to limit a current for releasing energy from the anode energy storage element.

8. An anode addressable drive circuit, applied to a laser array, comprising multiple anode addressing drive circuits according to claim 1, ends of the multiple anode addressing drive circuits are connected to an emission power supply, and the other ends are separately connected to anodes of multiple rows of lasers connected to multiple shared anode ends in the laser array in one-to-one correspondence, wherein the anode addressable drive circuit further comprising at least one energy storage-adjustable charging circuit, an input end of the charging circuit is connected to one emission power supply, an output end of the charging circuit is connected to multiple anode addressing drive circuits and configured to receive an output current of the emission power supply to be charged and store energy, and an energy storage value of the charging circuit is adjustable, so that a current with an adjustable current value is output to the anode addressing drive circuit when the anode addressing drive circuit is connected.

9. The anode addressable drive circuit according to claim 8, wherein the energy storage-adjustable charging circuit comprises:

a transitory energy storage element, comprising a first end connected to the emission power supply and a second end connected to a first end of a charging switch element and an end of the anode addressing drive circuit; and the charging switch element, comprising a first end, a second end, and a charging enabling end, wherein the first end of the charging switch element is connected to the second end of the transitory energy storage element, the second end of the charging switch element is grounded, the charging enabling end receives a charging control signal, and the charging switch element is turned on or off under the control of the charging control signal, so that an energy storage value of the transitory energy storage element is adjustable.

10. A laser emission circuit, comprising a laser array and an addressable drive circuit, wherein the addressable drive circuit, applied to a laser array, comprises:

a cathode addressable drive circuit, wherein the cathode addressable drive circuit comprises multiple cathode addressing drive circuits, ends of the multiple cathode addressing drive circuits are in one-to-one correspondence with cathodes of multiple columns of lasers connected to multiple shared cathode ends in the laser array, and the other ends of the multiple cathode addressing drive circuits are grounded, wherein one of the cathode addressing drive circuits comprises a cathode addressing switch circuit, the cathode addressing switch circuit comprises a cathode addressing switch element, the cathode addressing switch element comprises a first end, a second end, and a cathode addressing enabling end, one of the first end and the second end of the cathode addressing switch element is grounded, the other of the first end and the second end of the cathode addressing switch element is connected to a corresponding shared cathode end, the cathode addressing enabling end receives a cathode addressing signal, and the cathode addressing switch element is turned on or off under the control of the cathode addressing signal; and the anode addressable drive circuit according to claim 8, wherein the multiple anode addressing drive circuits are configured to drive anode addressing of multiple rows of lasers connected to the multiple shared anode ends, and the multiple cathode addressing drive circuits are configured to drive cathode addressing of multiple columns of lasers connected to the multiple shared cathode ends.

11. The laser emission circuit according to claim 10, wherein the cathode addressing switch circuit further comprises a cathode unidirectional conducting element, the cathode unidirectional conducting element is connected between the corresponding shared cathode end and the cathode addressing switch element, the first end of the cathode unidirectional conducting element is connected to the corresponding shared cathode end, and the second end of the cathode unidirectional conducting element is connected to the second end of the cathode addressing switch element; and wherein when the cathode addressing switch element is in a turn-on state, the cathode unidirectional conducting element is in a forward conduction state to allow the current to pass through the cathode addressing switch circuit; or when the cathode addressing switch element is in a turn-off state, the cathode unidirectional conducting element is in a reverse-biased state to prevent the current from passing through the cathode addressing switch circuit.

12. The laser emission circuit according to claim 11, wherein the cathode addressing switch circuit further comprises a cathode reverse-biased switch element, the cathode reverse-biased switch element comprises a first end, a second end, and a cathode reverse-biased enabling end, the first end of the cathode reverse-biased switch element is connected to the second end of the cathode unidirectional conducting element, the second end of the cathode reverse-biased switch element receives a second preset voltage, and the cathode reverse-biased enabling end receives a reverse-biased control signal;

the cathode reverse-biased control signal is used to turn off the cathode reverse-biased switch element when the cathode addressing switch element is turned on through the cathode addressing signal, so that the second end of the cathode unidirectional conducting element is grounded through the cathode addressing switch element, and the cathode unidirectional conducting element is in the forward conduction state; and the cathode reverse-biased control signal is also used to turn on the cathode reverse-biased switch element when the cathode addressing switch element is turned off through the cathode addressing signal, so that the second end of the cathode unidirectional conducting element receives the second preset voltage, and the cathode unidirectional conducting element is in the reverse-biased state.

13. The laser emission circuit according to claim 11, wherein the cathode addressing switch circuit further comprises a cathode phase inverter, and wherein an input end of the cathode phase inverter is connected to the cathode addressing enabling end, and an output end of the cathode phase inverter is connected to the cathode reverse-biased enabling end; or the input end of the cathode phase inverter is connected to the cathode reverse-biased enabling end, and the output end of the cathode phase inverter is connected to the cathode addressing enabling end.

14. The laser emission circuit according to claim 11, wherein the cathode unidirectional conducting element comprises a seventh NMOS transistor, a source of the seventh NMOS transistor is connected to the second end of the cathode addressing switch element, a drain of the seventh NMOS transistor is connected to the corresponding shared cathode end, and a gate of the seventh NMOS transistor is connected to the cathode addressing enabling end of the cathode addressing switch element; or wherein the cathode unidirectional conducting element comprises a seventh diode, a cathode of the seventh diode is connected to the second end of the cathode addressing switch element, and an anode of the seventh diode is connected to the corresponding shared cathode end.

* * * * *